United States Patent
Kim et al.

(10) Patent No.: US 12,368,135 B2
(45) Date of Patent: Jul. 22, 2025

(54) DISPLAY DEVICE, AND TILED DISPLAY DEVICE INCLUDING THE DISPLAY DEVICE

(71) Applicant: SAMSUNG DISPLAY CO., LTD., Yongin-si (KR)

(72) Inventors: Hyun Joon Kim, Yongin-si (KR); Jung Hwan Hwang, Yongin-si (KR); Kye Uk Lee, Yongin-si (KR); Sang Jin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/636,247

(22) Filed: Apr. 15, 2024

(65) Prior Publication Data

US 2024/0290753 A1 Aug. 29, 2024

Related U.S. Application Data

(62) Division of application No. 18/062,927, filed on Dec. 7, 2022, now Pat. No. 11,961,822.

(30) Foreign Application Priority Data

Jan. 17, 2022 (KR) .................. 10-2022-0006592
May 17, 2022 (KR) .................. 10-2022-0060213

(51) Int. Cl.
*H01L 25/065* (2023.01)
*G09G 3/3233* (2016.01)
(Continued)

(52) U.S. Cl.
CPC ....... *H01L 25/0655* (2013.01); *G09G 3/3233* (2013.01); *H01L 25/0753* (2013.01); (Continued)

(58) Field of Classification Search
CPC ............ H10D 86/423; H10D 86/0221; H10D 86/451; H10D 86/60; H10D 86/411; H01L 25/167; H01L 25/0753; H01L 25/0655; H01L 22/22; H01L 22/32; H01L 24/16; H01L 2224/05573; H01L 2224/16227;
(Continued)

(56) References Cited

U.S. PATENT DOCUMENTS 10,152,914 B2 * 12/2018 Meersman ............... G09G 3/32
10,825,393 B2   11/2020 Kim et al.
(Continued)

FOREIGN PATENT DOCUMENTS

CN    115835715 A    3/2023
KR    2023-0041119 A 3/2023

*Primary Examiner* — Vinh T Lam
(74) *Attorney, Agent, or Firm* — Womble Bond Dickinson (US) LLP

(57) ABSTRACT

A display device includes a substrate including a plurality of emission areas respectively corresponding to a plurality of subpixels for displaying an image, a plurality of light emitting elements respectively located in the plurality of emission areas of a first surface of the substrate and respectively corresponding to the plurality of subpixels, a first planarization layer on the first surface of the substrate and covering the plurality of light emitting elements, and an array layer on the first planarization layer.

15 Claims, 39 Drawing Sheets

(51) Int. Cl.
- *H01L 21/66* (2006.01)
- *H01L 23/00* (2006.01)
- *H01L 25/075* (2006.01)
- *H10D 86/01* (2025.01)
- *H10D 86/40* (2025.01)
- *H10D 86/60* (2025.01)

(52) U.S. Cl.
CPC ....... *H10D 86/0221* (2025.01); *H10D 86/451* (2025.01); *H10D 86/60* (2025.01); *G09G 2300/026* (2013.01); *G09G 2300/0426* (2013.01); *G09G 2300/0819* (2013.01); *G09G 2300/0852* (2013.01); *H01L 22/22* (2013.01); *H01L 22/32* (2013.01); *H01L 24/05* (2013.01); *H01L 24/16* (2013.01); *H01L 2224/05573* (2013.01); *H01L 2224/16227* (2013.01); *H01L 2924/12041* (2013.01); *H10D 86/411* (2025.01)

(58) Field of Classification Search
CPC .......... H01L 2924/12041; H01L 24/05; G09G 3/3233; G09G 2310/0262; G09G 2300/0426; G09G 2300/026; G09G 2300/0852; G09G 2300/0861; G09G 2310/061; G09G 2300/0819; H10H 29/142

See application file for complete search history.

(56) References Cited

U.S. PATENT DOCUMENTS

| | | | |
|---|---|---|---|
| 11,610,938 B2 | 3/2023 | Kim et al. | |
| 11,650,701 B2 | 5/2023 | Baek | |
| 11,721,276 B2 | 8/2023 | Ikeda et al. | |
| 11,776,970 B2 | 10/2023 | Shin et al. | |
| 11,778,877 B2 | 10/2023 | Min et al. | |
| 11,785,824 B2* | 10/2023 | Lee | H10K 59/124 |
| | | | 257/88 |
| 11,798,954 B2 | 10/2023 | Chang et al. | |
| 11,810,906 B2 | 11/2023 | Kim | |
| 11,908,841 B2* | 2/2024 | Schuele | H10H 20/01 |
| 12,002,816 B2* | 6/2024 | Kim | H10D 86/441 |
| 12,004,377 B2* | 6/2024 | Jung | H10K 59/122 |
| 12,068,435 B2* | 8/2024 | Shin | H01L 25/0753 |
| 12,074,146 B2* | 8/2024 | Yi | H10H 20/01 |
| 2021/0384392 A1* | 12/2021 | Yang | H01L 25/13 |
| 2022/0045124 A1 | 2/2022 | Lee et al. | |
| 2022/0052240 A1 | 2/2022 | Jang et al. | |
| 2022/0115470 A1* | 4/2022 | Kim | H10H 20/831 |
| 2022/0208850 A1* | 6/2022 | Im | H10D 86/441 |
| 2022/0285428 A1* | 9/2022 | Jo | H10H 20/01 |
| 2022/0352443 A1 | 11/2022 | Lee et al. | |
| 2023/0082959 A1 | 3/2023 | Jeong et al. | |
| 2023/0083578 A1 | 3/2023 | Choi et al. | |
| 2023/0102618 A1 | 3/2023 | Yun et al. | |
| 2023/0200137 A1 | 6/2023 | Kang et al. | |
| 2023/0238402 A1 | 7/2023 | Lee et al. | |
| 2024/0290753 A1* | 8/2024 | Kim | H10D 86/423 |

* cited by examiner

DISPLAY DEVICE, AND TILED DISPLAY DEVICE INCLUDING THE DISPLAY DEVICE

CROSS-REFERENCE TO RELATED APPLICATIONS

This application is a divisional of U.S. patent application Ser. No. 18/062,927, filed Dec. 7, 2022, which claims priority to and the benefit of Korean Patent Application No. 10-2022-0006592, filed Jan. 17, 2022 and Korean Patent Application No. 10-2022-0060213, filed May 17, 2022, the entire content of all of which is incorporated herein by reference.

BACKGROUND

1. Field

The present disclosure relates to a display device and a tiled display device including the display device.

2. Description of the Related Art

As the information society develops, demands for display devices for displaying images are increasing in various forms. The display devices may be flat panel displays such as liquid crystal displays, field emission displays, and light emitting displays.

The light emitting displays may include an organic light emitting display including an organic light emitting diode element as a light emitting element and a light emitting diode display including an inorganic light emitting diode element such as a light emitting diode (LED) as a light emitting element.

SUMMARY

In the case of the organic light emitting display, the luminance or gray level of light of the organic light emitting diode element is adjusted by adjusting the magnitude of a driving current supplied to the organic light emitting diode element. However, because the wavelength of light emitted from an inorganic light emitting diode element varies according to a driving current, when the inorganic light emitting diode element is driven in the same manner as the organic light emitting diode element, image quality may deteriorate.

Aspects and features of embodiments of the present disclosure provide a display device capable of easily performing a lighting test on a light emitting element and repairing the light emitting element, and a tiled display device including the display device.

However, aspects and features of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments a display device includes a substrate including a plurality of emission areas respectively corresponding to a plurality of subpixels for displaying an image, a plurality of light emitting elements respectively located in the plurality of emission areas of a first surface of the substrate and respectively corresponding to the plurality of subpixels, a first planarization layer on the first surface of the substrate and covering the plurality of light emitting elements, and an array layer on the first planarization layer. The array layer includes a plurality of pixel drivers respectively corresponding to the plurality of subpixels, in a non-emission area between the plurality of emission areas, and each of the plurality of pixel drivers including at least one transistor.

The display device further includes a plurality of anodes in respective portions of the plurality of emission areas of the first surface of the substrate and respectively corresponding to the plurality of subpixels, and a plurality of cathodes in other respective portions of the plurality of emission areas of the first surface of the substrate and respectively corresponding to the plurality of subpixels. In an emission area of the plurality of emission areas, a light emitting element of the plurality of light emitting elements is on an anode of the plurality of anodes and a cathode of the plurality of cathodes and connected to a pixel driver through the anode. The first planarization layer further covers the plurality of anodes and the plurality of cathodes.

A first conductive layer on the first surface of the substrate includes the plurality of anodes and the plurality of cathodes. The array layer includes a first gate insulating layer covering a semiconductor layer on the first planarization layer, a second gate insulating layer covering a second conductive layer on the first gate insulating layer, an interlayer insulating layer covering a third conductive layer on the second gate insulating layer, a second planarization layer covering a fourth conductive layer on the interlayer insulating layer, a third planarization layer covering a fifth conductive layer on the second planarization layer, and a fourth planarization layer covering a sixth conductive layer on the third planarization layer.

The array layer further includes a plurality of reflective wall structures respectively corresponding to edges of the emission areas. A reflective wall structure of the plurality of reflective wall structures corresponding to an edge of the emission area comprises a first reflective wall layer in the fourth conductive layer, a first reflective wall hole penetrating the second planarization layer and corresponding to a portion of the first reflective wall layer and the emission area, a second reflective wall layer in the fifth conductive layer, covering the first reflective wall hole, and contacting a portion of the first reflective wall layer through the first reflective wall hole, a second reflective wall hole penetrating the third planarization layer and corresponding to a portion of the second reflective wall layer and the emission area, and a third reflective wall layer in the sixth conductive layer, covering the second reflective wall hole, and contacting a portion of the second reflective wall layer through the second reflective wall hole.

The first reflective wall layer, the second reflective wall layer, and the third reflective wall layer are covered with the fourth planarization layer. The array layer further includes a plurality of light guide holes respectively corresponding to the plurality of emission areas, penetrating the fourth planarization layer, and respectively surrounded by the plurality of reflective wall structures, and a plurality of wavelength conversion patterns respectively located in the plurality of light guide holes. The plurality of wavelength conversion patterns overlap the plurality of light emitting elements, respectively.

The plurality of emission areas include a first emission area corresponding to a first color having a first wavelength band, a second emission area corresponding to a second color having a second band lower than that of the first wavelength band, and a third emission area corresponding to a third color having a third wavelength band lower than that of the second wavelength band. The plurality of light emitting elements is configured to emit light of the third color. The plurality of wavelength conversion patterns include a first wavelength conversion pattern corresponding to the first emission area and configured to convert light of the third color emitted from a first light emitting element of the plurality of light emitting elements into light of the first color, a second wavelength conversion pattern corresponding to the second emission area and configured to convert light of the third color emitted from a second light emitting element of the plurality of light emitting elements into light of the second color, and a transmission pattern corresponding to the third emission area and configured to transmit light of the third color emitted from a third light emitting element of the plurality of light emitting elements.

The array layer further includes a plurality of color filter patterns on the fourth planarization layer and respectively overlapping the plurality of wavelength conversion patterns, and a black matrix on the fourth planarization layer and corresponding to the non-emission area. The plurality of color filter patterns includes a first color filter pattern corresponding to the first emission area and transmitting light of the first color, a second color filter pattern corresponding to the second emission area and transmitting light of the second color, and a third color filter pattern corresponding to the third emission area and transmitting light of the third color.

The array layer further incudes a first power wiring configured to apply a first power voltage to the plurality of pixel drivers, a second power wiring configured to apply a second power voltage to the plurality of pixel drivers, a third power wiring configured to supply a third power voltage to the plurality of cathodes, a scan write wiring configured to transmit a scan write signal to the plurality of pixel drivers, a scan initialization wiring configured to transmit a scan initialization signal to the plurality of pixel drivers, a sweep signal wiring configured to transmit a sweep signal to the plurality of pixel drivers, a first data wiring configured to apply a first data voltage to the plurality of pixel drivers, and a second data wiring configured to applying a second data voltage to the plurality of pixel drivers. A pixel driver of the plurality of pixel drivers corresponding to the emission area includes a first pixel driving circuit unit configured to generate a control current according to the first data voltage of the first data wiring, a second pixel driving circuit unit configured to generate a driving current supplied to the anode according to the second data voltage of the second data wiring, and a third pixel driving circuit unit configured to control a period during which the driving current is supplied to the anode according to the control current of the first pixel driving circuit unit. The first pixel driving circuit unit includes a first transistor configured to generate the control current according to the first data voltage, a second transistor configured to apply the first data voltage of the first data wiring to a first electrode of the first transistor according to the scan write signal, a third transistor configured to apply an initialization voltage of an initialization voltage wiring to a gate electrode of the first transistor according to the scan initialization signal, a fourth transistor connecting the gate electrode of the first transistor and a second electrode of the first transistor according to the scan write signal, and a first capacitor located between the sweep signal wiring and the gate electrode of the first transistor.

The array layer further includes a first emission wiring configured to transmit a first emission signal to the pixel drivers, and a scan control wiring configured to transmit a scan control signal to the pixel drivers. The first pixel driving circuit unit further includes a fifth transistor connecting the first power wiring to the first electrode of the first transistor according to the first emission signal, a sixth transistor connecting the second electrode of the first transistor to the third pixel driving circuit unit according to the first emission signal, and a seventh transistor connecting a first node between the sweep signal wiring and the first capacitor to a gate voltage wiring according to the scan control signal.

The second pixel driving circuit unit includes an eighth transistor configured to generate the driving current according to the second data voltage, a ninth transistor configured to apply the second data voltage of the second data wiring to a first electrode of the eighth transistor according to the scan write signal, a tenth transistor configured to apply the initialization voltage of the initialization voltage wiring to a gate electrode of the eighth transistor according to the scan initialization signal, and an eleventh transistor connecting the gate electrode of the eighth transistor and a second electrode of the eighth transistor according to the scan write signal.

The second pixel driving circuit unit further includes a twelfth transistor connecting the second power wiring to the first electrode of the eighth transistor according to the first emission signal, a thirteenth transistor connecting the first power wiring to a second node according to the scan control signal, a fourteenth transistor connecting the second power wiring to the second node according to the first emission signal, and a second capacitor between the gate electrode of the eighth transistor and the second node.

The array layer further includes a second emission wiring configured to transmit a second emission signal to the pixel drivers, and the third pixel driving circuit unit is connected to the sixth transistor of the first pixel driving circuit unit at a third node. The third pixel driving circuit unit includes a fifteenth transistor having a gate electrode connected to the third node, a sixteenth transistor connecting the third node to the initialization voltage wiring according to the scan control signal, a seventeenth transistor connecting a second electrode of the fifteenth transistor to the anode according to the second emission signal, an eighteenth transistor connecting the anode to the initialization voltage wiring according to the scan control signal, and a third capacitor between the third node and the initialization voltage wiring.

The semiconductor layer includes a channel, a source electrode and a drain electrode of each of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor and the eighteenth transistor. The second conductive layer includes a gate electrode of each of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor and the eighteenth transistor, a first capacitor electrode integrally formed with the gate electrode of the first transistor, a second capacitor electrode integrally formed with the gate electrode of the eighth transistor and a third capacitor electrode integrally formed with the gate electrode of the fifteenth transistor. The third conductive layer includes a fourth capacitor electrode overlapping the first capacitor electrode, a fifth capacitor electrode overlapping the second capacitor electrode and a sixth capacitor electrode overlapping the third capacitor electrode.

The subpixels are aligned along a first direction and a second direction intersecting the first direction. The second power wiring includes a first wiring pattern in the first conductive layer, corresponding to the non-emission area, and extending in the second direction, a second wiring pattern in the second conductive layer, overlapping the first wiring pattern, and electrically connected to the first wiring pattern through a first power contact hole penetrating the first gate insulating layer and the first planarization layer, a third wiring pattern in the fourth conductive layer, extending in the first direction, and electrically connected to the second wiring pattern through a second power contact hole penetrating the interlayer insulating layer and the second gate insulating layer, and a fourth wiring pattern in the fifth conductive layer, corresponding to the non-emission area, extending in the second direction, overlapping the first wiring pattern, and electrically connected to the third wiring pattern through a third power contact hole penetrating the second planarization layer.

The fourth conductive layer includes the initialization voltage wiring, the scan initialization wiring, the scan write wiring, the first emission wiring, the second emission wiring, the first power wiring, the sweep signal wiring, the gate voltage wiring and the scan control wiring that extend in the first direction, and are spaced from each other. The fifth conductive layer includes the first data wiring and the second data wiring. The sixth conductive layer includes the third power wiring.

The fifth conductive layer includes a power auxiliary pattern spaced from the first data wiring and the second data wiring, and electrically connected to the first power wiring through a first power wiring auxiliary contact hole penetrating the second planarization layer.

The third reflective wall layer is integrally formed with the third power wiring. The first reflective wall layer and the second reflective wall layer are electrically connected to the third power wiring through the third reflective wall layer.

The cathode is electrically connected to the third power wiring through a first cathode auxiliary electrode, a second cathode auxiliary electrode and a third cathode auxiliary electrode. The second conductive layer includes the first cathode auxiliary electrode electrically connected to the cathode through a first cathode contact hole penetrating the first gate insulating layer and the first planarization layer. The fourth conductive layer includes the second cathode auxiliary electrode electrically connected to the first cathode auxiliary electrode through a second cathode contact hole penetrating the interlayer insulating layer and the second gate insulating layer. The fifth conductive layer includes the third cathode auxiliary electrode electrically connected to the second cathode auxiliary electrode through a third cathode contact hole penetrating the second planarization layer. The third power wiring is electrically connected to the third cathode auxiliary electrode through a fourth cathode contact hole penetrating the third planarization layer.

The anode is electrically connected to the pixel driver through a first anode auxiliary electrode and a second anode auxiliary electrode. The second conductive layer includes the first anode auxiliary electrode electrically connected to the anode through a first anode contact hole penetrating the first gate insulating layer and the first planarization layer. The fourth conductive layer includes the second anode auxiliary electrode electrically connected to the first anode auxiliary electrode through a second anode contact hole penetrating the interlayer insulating layer and the second gate insulating layer. The second anode auxiliary electrode is electrically connected to a second electrode of the seventeenth transistor through a third anode contact hole and electrically connected to a second electrode of the eighteenth transistor through a fourth anode contact hole. Each of the third anode contact hole and the fourth anode contact hole penetrates the interlayer insulating layer, the second gate insulating layer and the first gate insulating layer.

Each of the plurality of light emitting elements includes a flip chip-type micro-light emitting diode.

The substrate includes glass.

The display device further includes pads on a portion of an edge of the first surface of the substrate spaced from the plurality of emission areas, connection wirings on a second surface of the substrate opposite the first surface of the substrate, and side wirings on a side surface between the first surface and the second surface of the substrate and respectively connected between the pads and the connection wirings. The connection wirings are connected to a flexible film through a conductive adhesive member.

According to one or more embodiments, a tiled display device includes a plurality of display devices arranged in parallel to each other, and a seam between the plurality of display devices. A display device of the plurality of display devices includes a substrate including a plurality of emission areas respectively corresponding to a plurality of subpixels for displaying an image, a plurality of anodes respectively located in portions of the plurality of emission areas of a first surface of the substrate and respectively corresponding to the plurality of subpixels, a plurality of cathodes respectively located in other portions of the plurality of emission areas of the first surface of the substrate and respectively corresponding to the plurality of subpixels, a plurality of light emitting elements on the plurality of anodes and the plurality of cathodes and respectively corresponding to the plurality of subpixels, a first planarization layer on the first surface of the substrate and covering the plurality of anodes, the plurality of cathodes and the plurality of light emitting elements, and an array layer on the first planarization layer. The array layer includes a plurality of pixel drivers respectively corresponding to the plurality of subpixels, located in a non-emission area between the plurality of emission areas, each the plurality of pixel drivers including at least one transistor. In an emission area of the plurality of emission areas, a light emitting element of the plurality of light emitting elements is on an anode of the plurality of anodes and a cathode of the plurality of cathodes and connected to a pixel driver of the plurality of pixel drivers through the anode.

A first conductive layer on the first surface of the substrate includes the plurality of anodes and the plurality of cathodes. The array layer includes a first gate insulating layer covering a semiconductor layer on the first planarization layer, a second gate insulating layer covering a second conductive layer on the first gate insulating layer, an interlayer insulating layer covering a third conductive layer on the second gate insulating layer, a second planarization layer covering a fourth conductive layer on the interlayer insulating layer, a third planarization layer covering a fifth conductive layer on the second planarization layer, and a fourth planarization layer covering a sixth conductive layer on the third planarization layer.

The array layer further includes a plurality of reflective wall structures respectively correspond to edges of the plurality of emission areas. A reflective wall structure of the plurality of reflective wall structures corresponding to an edge of the emission area includes a first reflective wall layer in the fourth conductive layer, a first reflective wall hole penetrating the second planarization layer and corresponding to a portion of the first reflective wall layer and the emission area, a second reflective wall layer in the fifth conductive layer, covering the first reflective wall hole, and contacting a portion of the first reflective wall layer through the first reflective wall hole, a second reflective wall hole penetrating the third planarization layer and corresponding to a portion of the second reflective wall layer and the emission area, and a third reflective wall layer in the sixth conductive layer, covering the second reflective wall hole, and contacting a portion of the second reflective wall layer through the second reflective wall hole.

The fourth planarization layer covers the plurality of reflective wall structures. The array layer further includes a plurality of light guide holes respectively corresponding to the plurality of emission areas, penetrating the fourth planarization layer, and respectively surrounded by the plurality of reflective wall structures, a plurality of wavelength conversion patterns respectively located in the plurality of light guide holes, a plurality of color filter patterns on the fourth planarization layer and respectively overlapping the plurality of wavelength conversion patterns, and a black matrix on the fourth planarization layer and corresponding to the non-emission area.

The plurality of wavelength conversion patterns overlap the plurality of light emitting elements, respectively. The plurality of emission areas include a first emission area corresponding to a first color having a first wavelength band, a second emission area corresponding to a second color having a second wavelength band lower than that of the first wavelength band, and a third emission area corresponding to a third color having a third wavelength band lower than that of the second wavelength band. The plurality of light emitting elements is configured to emit light of the third color. The plurality of wavelength conversion patterns include a first wavelength conversion pattern corresponding to the first emission area and configured to convert light of the third color emitted from a first light emitting element into light of the first color, a second wavelength conversion pattern corresponding to the second emission area and configured to convert light of the third color emitted from a second light emitting element into light of the second color, and a transmission pattern corresponding to the third emission area and configured to transmit light of the third color emitted from a third light emitting element. The plurality of color filter patterns include a first color filter pattern corresponding to the first emission area and configured to transmit light of the first color, a second color filter pattern corresponding to the second emission area and configured to transmit light of the second color, and a third color filter pattern corresponding to the third emission area and configured to transmit light of the third color.

The display device further includes a first power wiring configured to apply a first power voltage to the plurality of pixel drivers, a second power wiring configured to apply a second power voltage to the plurality of pixel drivers, a third power wiring configured to supply a third power voltage to the plurality of cathodes, a first data wiring configured to apply a first data voltage to the plurality of pixel drivers, and a second data wiring configured to apply a second data voltage to the plurality of pixel drivers. A pixel driver of the plurality of pixel drivers corresponding to the emission area includes a first pixel driving circuit unit configured to generate a control current according to the first data voltage of the first data wiring, a second pixel driving circuit unit configured to generate a driving current supplied to the anode according to the second data voltage of the second data wiring, and a third pixel driving circuit unit configured to control a period during which the driving current is supplied to the anode according to the control current of the first pixel driving circuit unit.

The plurality of subpixels are aligned along a first direction and a second direction intersecting the first direction. The second power wiring includes a first wiring pattern in the first conductive layer, corresponding to the non-emission area, and extending in the second direction, a second wiring pattern in the second conductive layer, overlapping the first wiring pattern, and electrically connected to the first wiring pattern through a first power contact hole penetrating the first gate insulating layer and the first planarization layer, a third wiring pattern in the fourth conductive layer, extending in the first direction, and electrically connected to the second wiring pattern through a second power contact hole penetrating the interlayer insulating layer and the second gate insulating layer, and a fourth wiring pattern in the fifth conductive layer, corresponding to the non-emission area, extending in the second direction, overlapping the first wiring pattern, and electrically connected to the third wiring pattern through a third power contact hole penetrating the second planarization layer.

The fourth conductive layer includes the first power wiring. The fifth conductive layer includes a power auxiliary pattern spaced from the first data wiring and the second data wiring and electrically connected to the first power wiring through a first power wiring auxiliary contact hole penetrating the second planarization layer.

The third power wiring includes the sixth conductive layer. The third reflective wall layer is integrally formed with the third power wiring. The first reflective wall layer and the second reflective wall layer are electrically connected to the third power wiring through the third reflective wall layer.

The cathode is electrically connected to the third power wiring through a first cathode auxiliary electrode, a second cathode auxiliary electrode and a third cathode auxiliary electrode. The second conductive layer includes the first cathode auxiliary electrode electrically connected to the cathode through a first cathode contact hole penetrating the first gate insulating layer and the first planarization layer. The fourth conductive layer includes the second cathode auxiliary electrode electrically connected to the first cathode auxiliary electrode through a second cathode contact hole penetrating the interlayer insulating layer and the second gate insulating layer. The fifth conductive layer includes the third cathode auxiliary electrode electrically connected to the second cathode auxiliary electrode through a third cathode contact hole penetrating the second planarization layer. The third power wiring is electrically connected to the third cathode auxiliary electrode through a fourth cathode contact hole penetrating the third planarization layer.

The semiconductor layer includes a channel, a source electrode and a drain electrode of at least one transistor in the pixel driver. The anode is electrically connected to the pixel driver through a first anode auxiliary electrode and a second anode auxiliary electrode. The second conductive layer includes the first anode auxiliary electrode electrically connected to the anode through a first anode contact hole penetrating the first gate insulating layer and the first planarization layer. The fourth conductive layer includes the second anode auxiliary electrode electrically connected to the first anode auxiliary electrode through a second anode contact hole penetrating the interlayer insulating layer and the second gate insulating layer. The second anode auxiliary electrode is electrically connected to a second electrode of the seventeenth transistor through a third anode contact hole and electrically connected to a second electrode of the eighteenth transistor through a fourth anode contact hole. Each of the third anode contact hole and the fourth anode contact hole penetrates the interlayer insulating layer, the second gate insulating layer and the first gate insulating layer.

Each of the plurality of light emitting elements includes a flip chip-type micro-light emitting diode.

The substrate of the display device includes glass.

The display device further includes pads on a portion of an edge of the first surface of the substrate spaced from the plurality of emission areas, connection wirings on a second surface of the substrate opposite the first surface of the substrate, and side wirings on a side surface between the first surface and the second surface of the substrate and respectively connected between the pads and the connection wirings. The connection wirings are connected to a flexible film through a conductive adhesive member.

The plurality of display devices are arranged in a matrix of M rows and N columns.

A display device according to one or more embodiments includes a plurality of light emitting elements on a first surface of a substrate, a first planarization layer covering the light emitting elements, and an array layer on the first planarization layer and including a plurality of pixel drivers respectively connected to the light emitting elements.

That is, according to one or more embodiments, because the array layer is on the first planarization layer covering the light emitting elements, it may be placed after the light emitting elements are tested for a lighting defect and repaired. Therefore, a light emitting element having a lighting defect can be easily repaired, thus reducing the influence of a defect rate of the light emitting elements on the display quality of the display device. Accordingly, this may increase the yield and decrease the fabrication cost of the display device. In addition, because the light emitting elements are tested and repaired before the array layer is placed, damage to the array layer due to the test and repair of the light emitting elements can be prevented.

In addition, because the light emitting elements are on the first surface of the substrate rather than on the array layer, misalignment of the light emitting elements due to a step difference of the array layer can be prevented.

However, the effects, aspects, and features of embodiments of the present disclosure are not limited to the aforementioned effects, aspects, and features, and various other effects, aspects, and features are included in the present specification.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
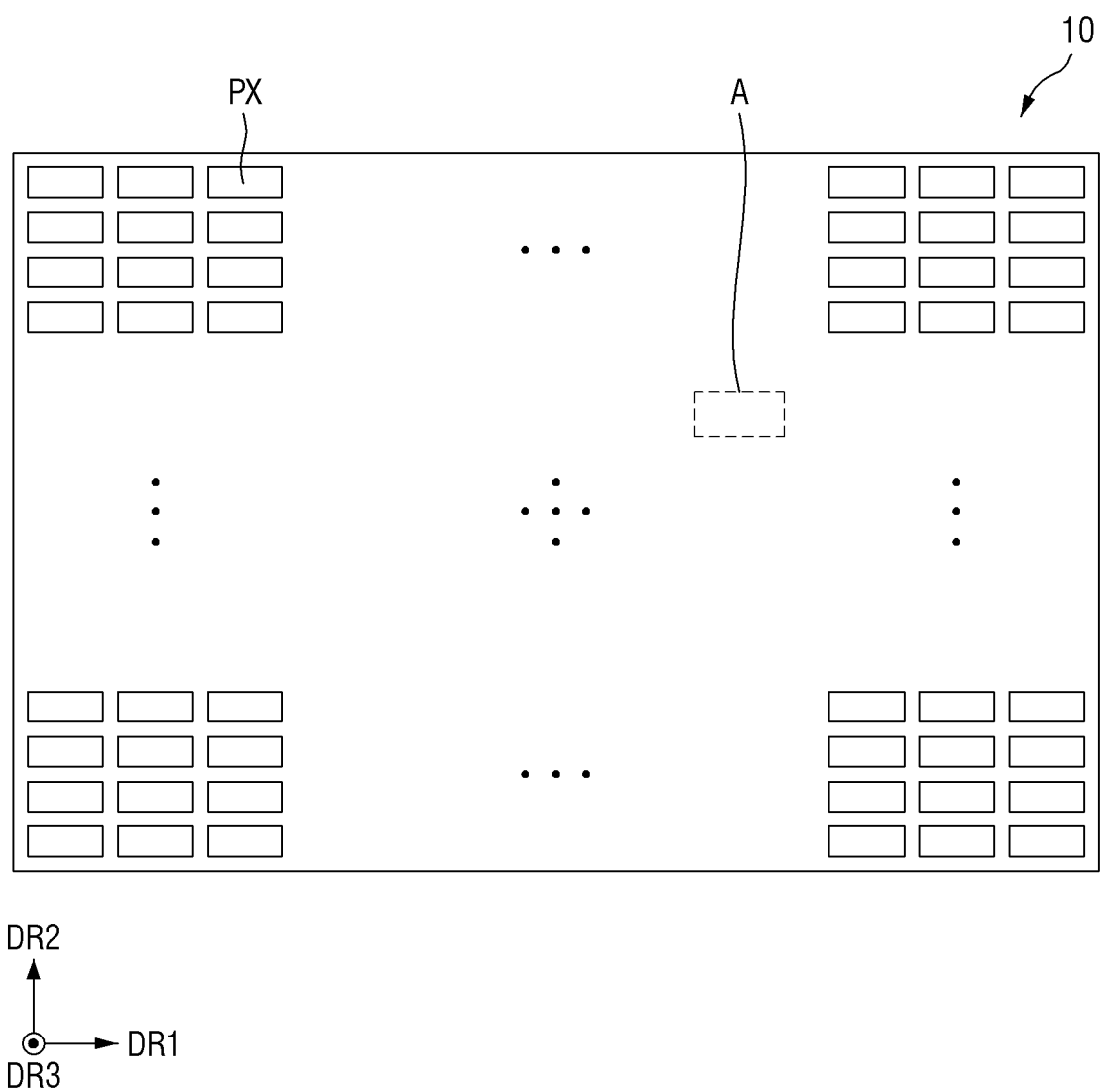
FIG. 1 is a plan view of a display device according to one or more embodiments.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
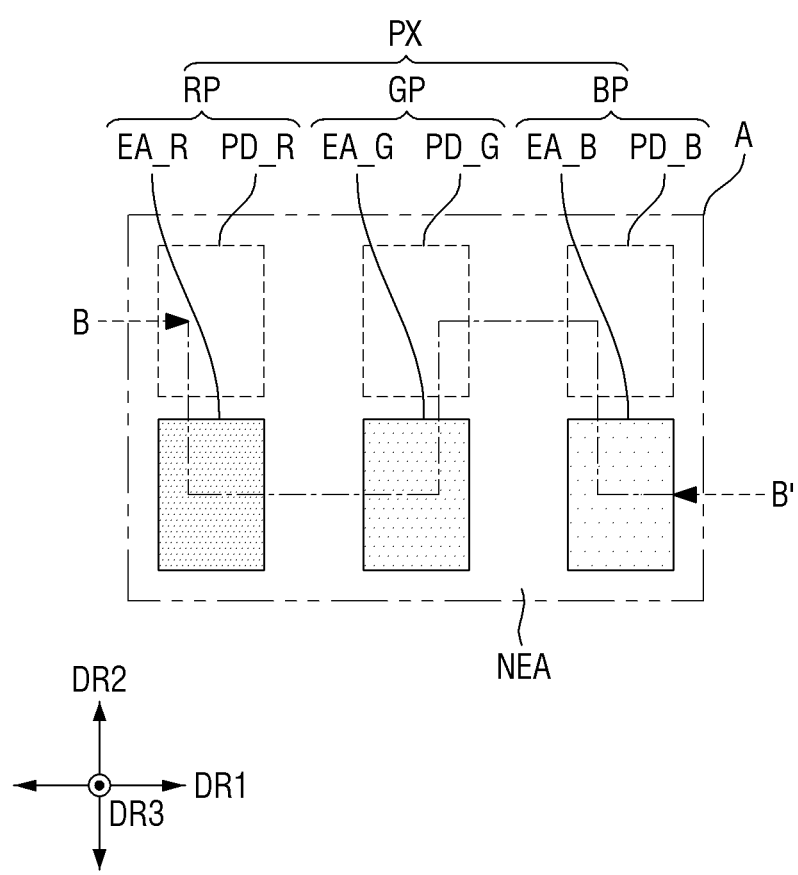
FIGS. 2 and 3 are enlarged layout views of examples of an area A of FIG. 1.
Figure 3:
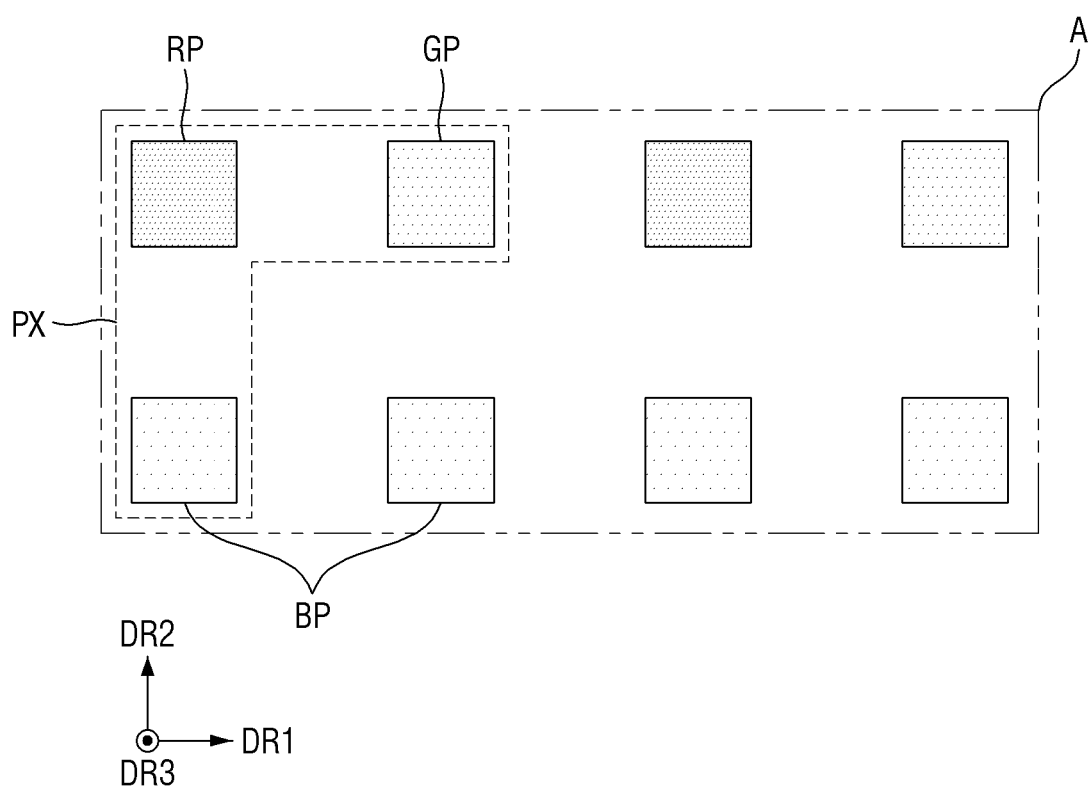

FIG. 1 is a plan view of a display device 10 according to one or more embodiments. FIGS. 2 and 3 are enlarged layout views of examples of an area A of FIG. 1.

Referring to FIG. 1, the display device 10 according to one or more embodiments is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

The display device 10 may be in the form of a flat panel.

For example, the display device 10 may be shaped like a rectangular plane having long sides in a first direction DR1 and short sides in a second direction DR2 intersecting the first direction DR1. Each corner where a long side extending in the first direction DR1 meets a short side extending in the second direction DR2 may be rounded with a suitable curvature (e.g., a predetermined curvature) or may be right-angled. The planar shape of the display device 10 is not limited to a quadrilateral shape but may also be another polygonal shape, a circular shape, or an oval shape. The display device 10 may be formed flat, but an embodiment is not limited thereto. For example, the display device 10 may include curved portions formed at left and right ends and having a constant or varying curvature.

In addition, the display device 10 may be formed to be flexible so that it can be curved, bent, folded, and/or rolled.

The display device 10 includes a plurality of pixels PX for displaying an image. The pixels PX may be arranged parallel to each other along the first direction DR1 and the second direction DR2 in a matrix.

Referring to FIGS. 2 and 3, each of the pixels PX may include two or more subpixels RP, GP and BP arranged parallel to each other along the first direction DR1 or the second direction DR2. Each of the subpixels RP, GP, and BP may emit light in a wavelength region corresponding to any one of a plurality of different colors.

That is, the display device 10 includes a plurality of subpixels RP, GP, and BP arranged parallel to each other along the first direction DR1 and the second direction DR2 in a matrix. In addition, a plurality of pixels PX, each including two or more neighboring subpixels RP, GP, and BP among the subpixels RP, GP, and BP, may be provided.

FIGS. 2 and 3 illustrate a case where each of the pixels PX includes three subpixels RP, GP, and BP corresponding to different colors. However, this is only an example, and the subpixels of each pixel PX according to one or more embodiments are not limited to those illustrated in FIGS. 2 and 3.

As illustrated in FIG. 2, the display device 10 may include a plurality of emission areas EA_R, EA_G, and EA_B corresponding to the subpixels RP, GP, and BP and a plurality of pixel drivers PD_R, PD_G, and PD_B corresponding to the subpixels RP, GP, and BP. The pixel drivers PD_R, PD_G, and PD_B may be disposed in a non-emission area NEA which is an area between the emission areas EA_R, EA_G, and EA_B.

Each of the emission areas EA_R, EA_G, and EA_B corresponding to the subpixels RP, GP, and BP may have a rectangular, square, or rhombus planar shape. For example, each of the emission areas EA_R, EA_G, and EA_B may have a rectangular planar shape having short sides in the first direction DR1 and long sides in the second direction DR2. Alternatively, each of the emission areas EA_R, EA_G, and EA_B may have a square or rhombus planar shape including sides having the same length in the first direction DR1 and the second direction DR2.

In at least some of the subpixels RP, GP, and BP, a pixel driver PD may be disposed in the non-emission area NEA neighboring an emission area EA in the first direction DR1 or the second direction DR2.

The subpixels RP, GP, and BP may include a first subpixel RP corresponding to a first color having a wavelength band (e.g., a predetermined wavelength band), a second subpixel GP corresponding to a second color having a wavelength band (e.g., a predetermined wavelength band) lower than that of the first color, and a third subpixel BP corresponding to a third color having a wavelength band (e.g., a predetermined wavelength band) lower than that of the second color. Here, the first color may be red having a wavelength band of approximately 600 to 750 nm, the second color may be green having a wavelength band of approximately 480 to 560 nm, and the third color may be blue having a wavelength band of approximately 370 to 460 nm. However, this is only an example, and the first, second and third subpixels RP, GP, and BP according to one or more embodiments of the present specification are not limited thereto.

Each of the subpixels RP, GP, and BP may include a light emitting element disposed in an emission area EA_R, EA_G, or EA_B. The light emitting element may be a light emitting diode including a photoelectric conversion material of an inorganic semiconductor. For example, the light emitting element may be a flip chip-type micro-light emitting diode, but one or more embodiments of the present specification is not limited thereto.

As illustrated in FIG. 2, the first subpixel RP, the second subpixel GP, and the third subpixel BP may be alternately disposed along the first direction DR1.

Alternatively, as illustrated in FIG. 3, the first subpixel RP and the second subpixel GP may be alternately disposed along the first direction DR1, and the third subpixel BP may be alternately disposed with each of the first subpixel RP and the second subpixel GP along the second direction DR2. In this case, each of the pixels PX may include one first subpixel RP and one second subpixel GP neighboring each other in the first direction DR1 and at least one third subpixel BP neighboring at least one of the first subpixel RP and the second subpixel GP in the second direction DR2.

As illustrated in FIGS. 2 and 3, the area of the first subpixel RP, the area of the second subpixel GP, and the area of the third subpixel BP may be substantially the same, but an embodiment of the present specification is not limited thereto. At least any one of the area of the first subpixel RP, the area of the second subpixel GP, and the area of the third subpixel BP may be different from another one. Alternatively, any two of the area of the first subpixel RP, the area of the second subpixel GP, and the area of the third subpixel BP may be substantially the same, and the other one may be different from the two. Alternatively, the area of the first subpixel RP, the area of the second subpixel GP, and the area of the third subpixel BP may be different from each other.

Figure 4:
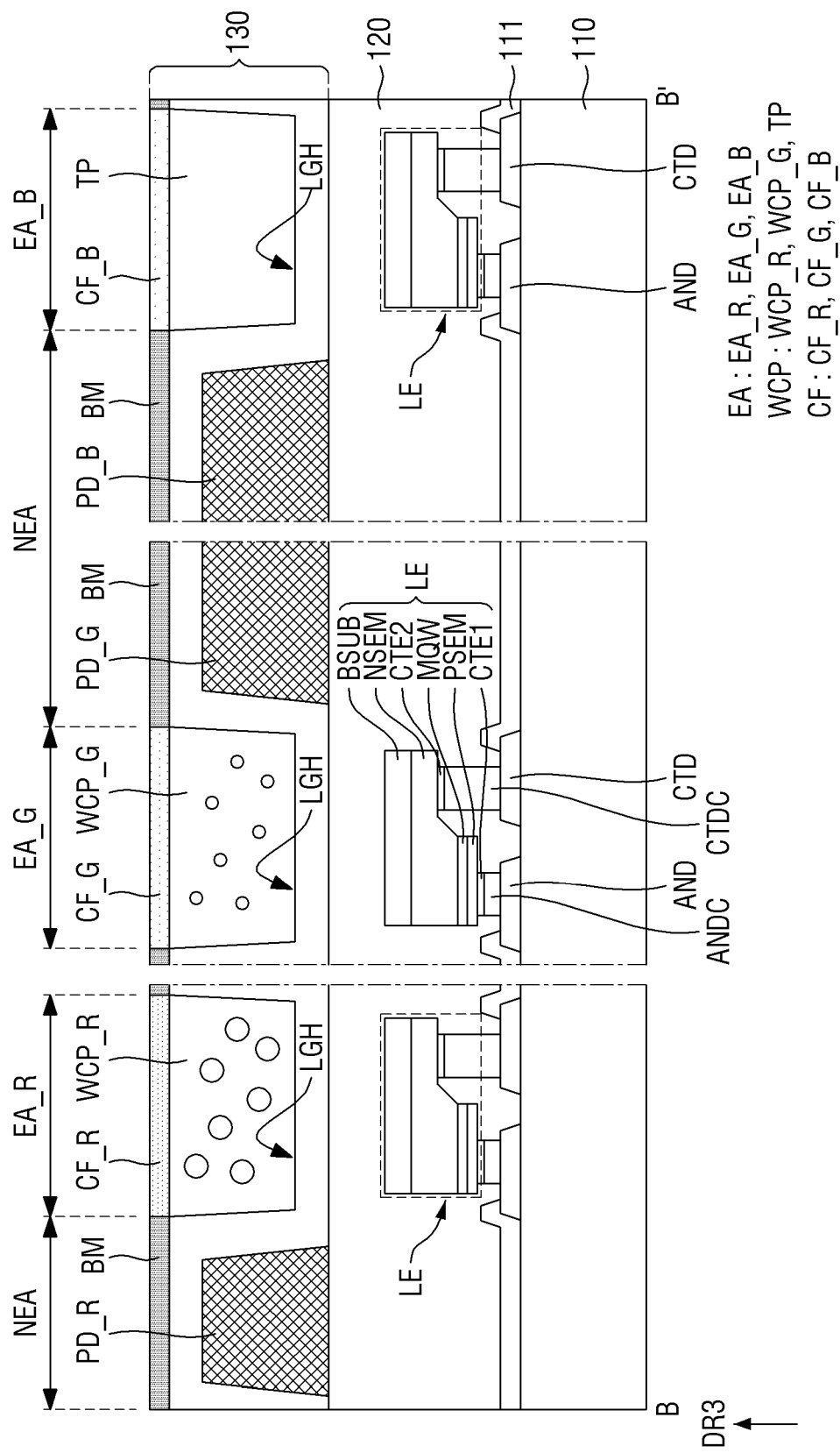
FIG. 4 is a cross-sectional view of an example of a plane cut along the line B-B' of FIG. 2.

FIG. 4 is a cross-sectional view of an example of a plane cut along the line B-B' of FIG. 2.

Referring to FIG. 4, the display device 10 according to one or more embodiments includes a substrate 110 including a plurality of emission areas EA_R, EA_G, and EA_B corresponding to a plurality of subpixels RP, GP, and BP for displaying an image, a plurality of light emitting elements LE respectively disposed in the emission areas EA_R, EA_G, and EA_B of a first surface of the substrate 110 and respectively corresponding to the subpixels RP, GP, and BP, a first planarization layer 120 disposed on the first surface of the substrate 110 and covering the light emitting elements LE, and an array layer 130 disposed on the first planarization layer 120.

Here, the array layer 130 includes a plurality of pixel drivers PD_R, PD_G, and PD_B respectively corresponding to the subpixels RP, GP, and BP, disposed in the non-emission area NEA which is an area between the emission areas EA_R, EA_G, and EA_B, and each including at least one transistor.

The emission areas EA_R, EA_G, and EA_B include a first emission area EA_R corresponding to the first color having a suitable wavelength band (e.g., a predetermined wavelength band), a second emission area EA_G corresponding to the second color having a wavelength band lower than that of the first color, and a third emission area EA_B corresponding to the third color having a wavelength band lower than that of the second color. For example, the first color, the second color, and the third color may be red, green, and blue.

The light emitting elements LE respectively corresponding to the subpixels RP, GP, and BP may emit light of the third color. In this case, the array layer 130 may further include a plurality of wavelength conversion patterns WCP_R, WCP_G, and TP.

The wavelength conversion patterns WCP_R, WCP_G, and TP may include a first wavelength conversion pattern WCP_R corresponding to the first emission area EA_R of the first subpixel RP and converting light of the third color emitted from a light emitting element LE into light of the first color, a second wavelength conversion pattern WCP_G corresponding to the second emission area EA_G of the second subpixel GP and converting light of the third color emitted from a light emitting element LE into light of the second color, and a transmission pattern TP corresponding to the third emission area EA_B of the third subpixel BP and transmitting light of the third color emitted from a light emitting element LE.

For example, the first wavelength conversion pattern WCP_R may include a base resin made of an organic material, which is cured by ultraviolet rays or heat and has light-transmitting properties, and wavelength conversion particles of the first color that are dispersed in the base resin and convert light of the third color into light of the first color having a higher wavelength band than the third color.

Similarly, the second wavelength conversion pattern WCP_G may include a base resin and wavelength conversion particles of the second color that are dispersed in the base resin and convert light of the third color into light of the second color having a higher wavelength band than the third color.

The transmission pattern TP may include a base resin.

Here, each of the wavelength conversion particles of the first color and the wavelength conversion particles of the second color may be provided as a phosphor.

In addition, each of the first wavelength conversion pattern WCP_R, the second wavelength conversion pattern WCP_G, and the transmission pattern TP may further include scatterers that are dispersed in the base resin and scatter light of a light emitting element LE.

In addition, according to one or more embodiments, the array layer 130 may further include a plurality of color filter patterns CF_R, CF_G, and CF_B respectively corresponding to the emission areas EA_R, EA_G, and EA_B and respectively overlapping the wavelength conversion patterns WCP_R, WCP_G, and TP and a black matrix BM corresponding to the non-emission area NEA.

The color filter patterns CF_R, CF_G, and CF_B may include a first color filter pattern CF_R corresponding to the first emission area EA_R of the first subpixel RP and transmitting light of the first color, a second color filter pattern CF_G corresponding to the second emission area EA_G of the second subpixel GP and transmitting light of the second color, and a third color filter pattern CF_B corresponding to the third emission area EA_B of the third subpixel BP and transmitting light of the third color.

The black matrix BM may be made of a material that absorbs or blocks light. The black matrix BM may reduce incidence or emission of light to or from the non-emission area NEA.

As mentioned above, each of the light emitting elements LE may be provided as a flip chip-type micro-light emitting diode.

In this case, each of the light emitting elements LE may include a base substrate BSUB, an n-type semiconductor NSEM, an active layer MQW, a p-type semiconductor PSEM, a first contact electrode CTE1, and a second contact electrode CTE2.

The base substrate BSUB may be a sapphire substrate, but one or more embodiments are not limited thereto.

The n-type semiconductor NSEM may be disposed on a surface of the base substrate BSUB. For example, the n-type semiconductor NSEM may be disposed on a lower surface of the base substrate BSUB.

The n-type semiconductor NSEM may be made of GaN doped with an n-type dopant such as Si, Ge, or Sn.

The active layer MQW may be disposed on a portion of the n-type semiconductor NSEM.

The active layer MQW may include a material having a single or multiple quantum well structure. When the active layer MQW includes a material having a multiple quantum well structure, a plurality of well layers and a plurality of barrier layers may be alternately stacked. In this case, the well layers may be made of InGaN, and the barrier layers may be made of GaN or AlGaN, but one or more embodiments are not limited thereto.

Alternatively, the active layer MQW may have a structure in which a semiconductor material having a large band gap energy and a semiconductor material having a small band gap energy are alternately stacked or may include different Group Ill to V semiconductor materials depending on the wavelength band of light that it emits.

The p-type semiconductor PSEM may be disposed on the active layer MQW. The p-type semiconductor PSEM may be made of GaN doped with a p-type dopant such as Mg, Zn, Ca, Se, or Ba.

The first contact electrode CTE1 may be disposed on the p-type semiconductor PSEM.

The second contact electrode CTE2 may be disposed on a portion of the n-type semiconductor NSEM except for a portion on which the active layer MQW is disposed. The portion of the n-type semiconductor NSEM on which the second contact electrode CTE2 is disposed may be spaced from the portion of the surface of the n-type semiconductor NSEM on which the active layer MQW is disposed.

The first contact electrode CTE1 may be bonded to an anode AND through an anode contact electrode ANDC.

The second contact electrode CTE2 may be bonded to a cathode CTD through a cathode contact electrode CTDC.

The first planarization layer 120 may be made of an organic layer such as acryl resin, epoxy resin, phenolic resin, polyamide resin, or polyimide resin.

In addition, the display device 10 may further include a bank buffer layer 111 disposed on the first surface of the substrate 110 and covered with the first planarization layer 120.

The bank buffer layer 111 may correspond to the non-emission area NEA and may cover a portion of an edge of the anode AND and a portion of an edge of the cathode CTD which correspond to edges of each of the emission areas EA_R, EA_G, and EA_B.

Because the bank buffer layer 111 prevents the edge of the anode AND and the edge of the cathode CTD from being directly exposed to the first planarization layer 120 made of an organic layer, the surface of the anode AND and the surface of the cathode CTD can be prevented from being damaged relatively quickly by reacting with impurities such as moisture or ions introduced through the organic layer.

The bank buffer layer 111 may not be disposed in an area where the anode AND and the cathode CTD face each other, that is, an area overlapping each light emitting element LE. Accordingly, a process of mounting the light emitting elements LE may be relatively easy.

Figure 5:
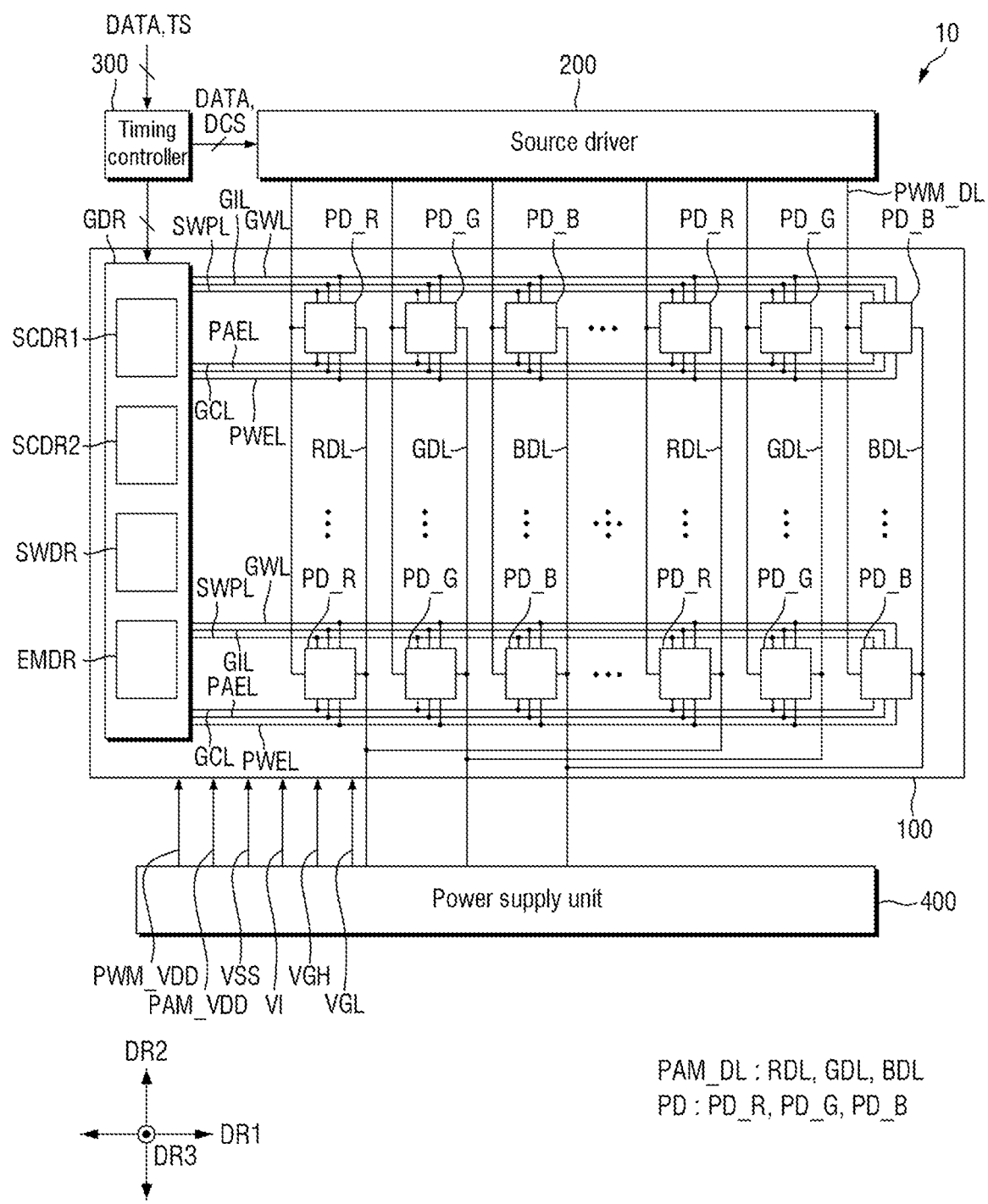
FIG. 5 is a block diagram of the display device according to one or more embodiments.

FIG. 5 is a block diagram of the display device 10 according to one or more embodiments.

Referring to FIG. 5, the display device 10 according to one or more embodiments may include a display panel 100, a gate driver GDR, a source driver 200, a timing controller 300, and a power supply unit 400.

The display panel 100 may include wirings for supplying various signals or various voltages to a plurality of pixel drivers PD (PD_R, PD_G, and PD_B) respectively corresponding to a plurality of subpixels RP, GP, and BP.

For example, the display panel 100 may include gate wirings, data wirings, and voltage wirings.

The gate wirings may extend in the first direction DR1 and include scan write wirings GWL, scan initialization wirings GIL, scan control wirings GCL, sweep signal wirings SWPL, pulse width modulation (PWM) emission wirings PWEL, and pulse amplitude modulation (PAM) emission wirings PAEL.

The data wirings may extend in the second direction DR2 and may include PWM data wirings PWM_DL and PAM data wirings PAM_DL. The PAM data wirings PAM_DL may include first PAM data wirings RDL connected to pixel drivers PD_R of first subpixels RP, second PAM data wirings GDL connected to pixel drivers PD_G of second subpixels GP, and third PAM data wirings BDL connected to pixel drivers PD_B of third subpixels BP. The first PAM data wirings RDL may be electrically connected to each other, the second PAM data wirings GDL may be electrically connected to each other, and the third PAM data wirings BDL may be electrically connected to each other.

The display panel 100 may include voltage wirings corresponding to a first power voltage PWM_VDD, a second power voltage PAM_VDD, a third power voltage VSS, an initialization voltage VI, and gate level voltages VGH and VGL.

Each of the pixel drivers PD_R, PD_G, and PD_B of the subpixels RP, GP and BP may be connected to any one of the scan write wirings GWL, any one of the scan initialization wirings GIL, any one of the scan control wirings GCL, any one of the sweep signal wirings SWPL, any one of the PWM emission wirings PWEL, and any one of the PAM emission wirings PAEL. In addition, each of the pixel drivers PD_R of the first subpixels RP may be connected to any one of the PWM data wirings PWM_DL and any one of the first PAM data wirings RDL. In addition, each of the pixel drivers PD_G of the second subpixels GP may be connected to any one of the PWM data wirings PWM_DL and any one of the second PAM data wirings GDL. In addition, each of the pixel drivers PD_B of the third subpixels BP may be connected to any one of the PWM data wirings PWM_DL and any one of the third PAM data wirings BDL.

The display panel 100 may include the gate driver GDR for transmitting signals respectively to the gate wirings including the scan write wirings GWL, the scan initialization wirings GIL, the scan control wirings GCL, the sweep signal wirings SWPL, the PWM emission wirings PWEL, and the PAM emission wirings PAEL. Although the gate driver GDR is illustrated in FIG. 5 as being disposed at an edge of the display panel 100 in the first direction DR1 for the sake of brevity, the gate driver GDR according to one or more embodiments may also be disposed at both edges of the display panel 100 in the first direction DR1 or may be divided into a plurality of drivers between the pixel drivers PD.

The gate driver GDR may include a first scan signal driver SCDR1, a second scan signal driver SCDR2, a sweep signal driver SWDR, and an emission signal driver EMDR.

The first scan signal driver SCDR1 may output scan initialization signals to the scan initialization wirings GIL and output scan write signals to the scan write wirings GWL according to a first scan driving control signal received from the timing controller 300. That is, the first scan signal driver SCDR1 may output the scan initialization signals and the scan write signals.

The second scan signal driver SCDR2 may output scan control signals to the scan control wirings GCL according to a second scan driving control signal received from the timing controller 300.

The sweep signal driver SWDR may receive a first emission control signal and a sweep control signal from the timing controller 300.

The sweep signal driver SWDR may output PWM emission signals to the PWM emission wirings PWEL according to the first emission control signal and output sweep signals to the sweep signal wirings SWPL according to the sweep control signal. That is, the sweep signal driver SWDR may output the PWM emission signals and the sweep signals.

The emission signal driver EMDR may output PAM emission signals to the PAM emission wirings PAEL according to a second emission control signal received from the timing controller 300.

The timing controller 300 receives digital video data and timing signals TS. The timing controller 300 may generate a scan timing control signal for controlling the operation timing of the gate driver GDR according to the timing signals TS. The scan timing control signal may include the first scan driving control signal, the second scan driving control signal, the first emission control signal, the second emission control signal, and the sweep control signal.

The timing controller 300 outputs the first scan driving control signal, the second scan driving control signal, the first emission control signal, the second emission control signal, and the sweep control signal to the gate driver GDR.

In addition, the timing controller 300 may further generate a source control signal DCS for controlling the operation timing of the source driver 200. The timing controller 300 outputs the digital video data DATA and the source control signal DCS to the source driver 200.

The source driver 200 converts the digital video data DATA into analog PWM data voltages and outputs the analog PWM data voltages to the PWM data wirings PWM_DL. Accordingly, the PWM data voltages may be supplied to the pixel drivers PD_R, PD_G, and PD_B of the subpixels RP, GP, and BP selected by the scan write signals of the gate driver GDR.

The power supply unit 400 may commonly output a first PAM data voltage to the first PAM data wirings RDL, commonly output a second PAM data voltage to the second PAM data wirings GDL, and commonly output a third PAM data voltage to the third PAM data wirings BDL. In addition, the power supply unit 400 may generate a plurality of various voltages and supply them to the display panel 100.

The power supply unit 400 may supply various voltages such as the first power voltage PWM_VDD, the second power voltage PAM_VDD, the third power voltage VSS, the initialization voltage VI, and the gate level voltages VGL and VGH to the display panel 100.

The first power voltage PWM_VDD and the second power voltage PAM_VDD may be high potential driving voltages for driving the light emitting elements LE.

The third power voltage VSS may be a low potential driving voltage for driving the light emitting elements LE.

The initialization voltage VI may be a voltage for initializing outputs of the pixel drivers PD_R, PD_G, and PD_B of the subpixels RP, GP, and BP.

The gate level voltages VGL and VGH may be voltages for turning on and off transistors included in each of the pixel drivers PD_R, PD_G, and PD_B and may be supplied to the gate driver GDR or the pixel drivers PD_R, PD_G, and PD_B.

Each of the source driver 200, the timing controller 300, and the power supply unit 400 may be formed as an integrated circuit. In addition, the source driver 200 may be formed as a plurality of integrated circuits.

These integrated circuits may be mounted on a flexible film disposed under a second surface of the substrate 110.

Figure 6:
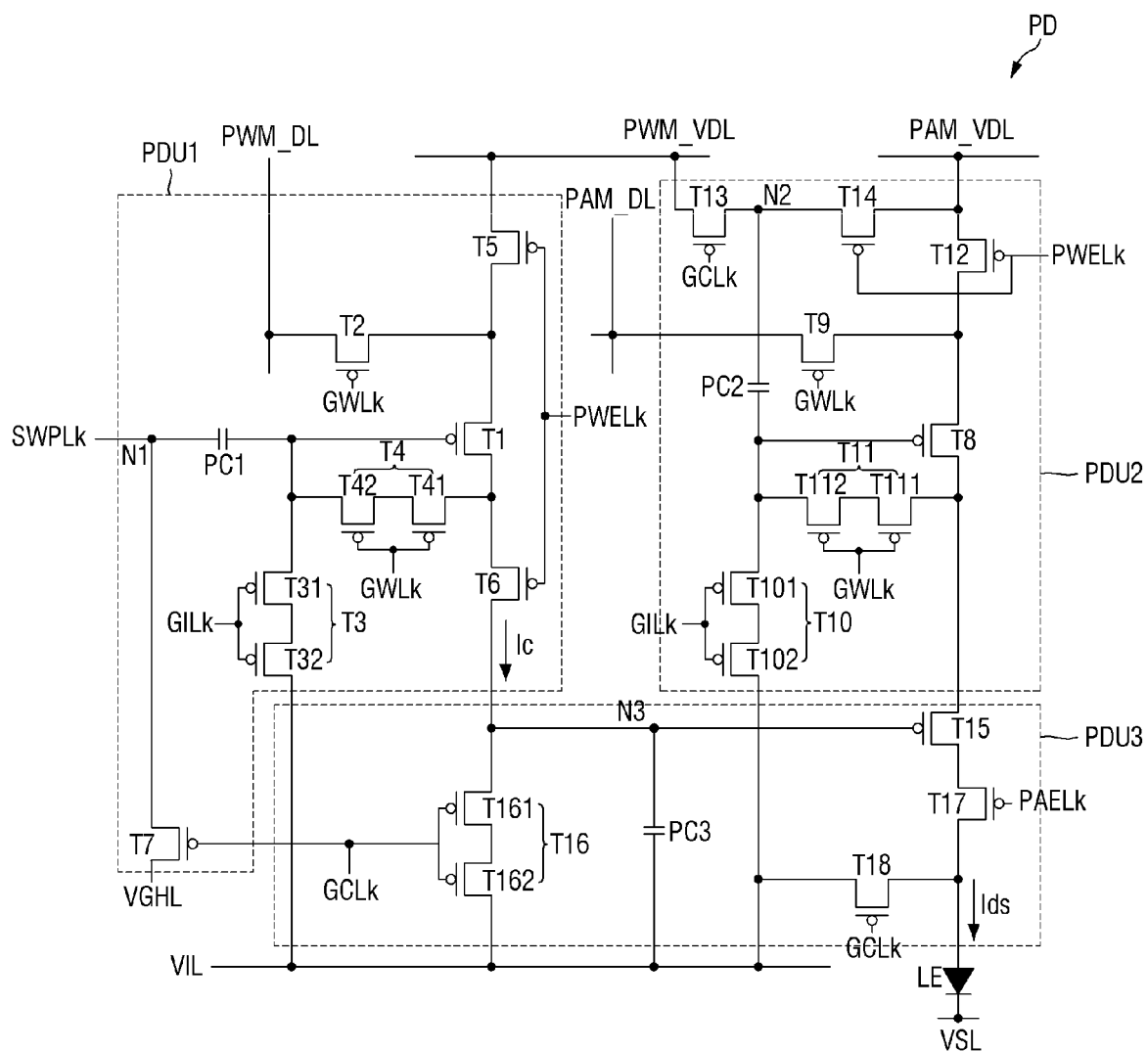
FIG. 6 is an equivalent circuit diagram of an example of any one pixel driver of FIG. 5.

FIG. 6 is an equivalent circuit diagram of an example of any one pixel driver PD of FIG. 5.

Referring to FIG. 6, a pixel driver PD of any one subpixel disposed on a $k^{th}$ horizontal line (where k is a natural number equal to or greater than 1) of the display panel 100 according to one or more embodiments may be connected to a $k^{th}$ scan write wiring GWLk, a $k^{th}$ scan initialization wiring GILk, a $k^{th}$ scan control wiring GCLk, a $k^{th}$ sweep signal wiring SWPLk, a $k^{th}$ PWM emission wiring PWELk, and a $k^{th}$ PAM emission wiring PAELk.

In addition, the pixel driver PD of any one subpixel may be connected to a PWM data wiring PWM_DL and a PAM data wiring PAM_DL. For ease of description, the PWM data wiring PWM_DL may hereinafter be referred to as a first data wiring, and the PAM data wiring PAM_DL may hereinafter be referred to as a second data wiring.

In addition, the pixel driver PD of any one subpixel may be connected to a first power wiring PWM_VDL to which the first power voltage PWM_VDD is applied, a second power wiring PAM_VDL to which the second power voltage PAM_VDD is applied, a third power wiring VSL to which the third power voltage VSS is applied, an initialization voltage wiring VIL to which the initialization voltage VI is applied, and a gate voltage wring VGHL to which a predetermined gate level voltage VGH for turning off a transistor is applied.

A light emitting element LE may be connected between the pixel driver PD and the third power wiring VSL and may emit light based on a driving current Ids supplied from the pixel driver PD.

A first electrode of the light emitting element LE may be connected to the pixel driver PD, and a second electrode of the light emitting element LE may be connected to the third power wiring VSL.

The first electrode of the light emitting element LE may be an anode (i.e., a pixel electrode) corresponding to the first contact electrode CTE1 (see FIG. 4) on the p-type semiconductor PSEM (see FIG. 4).

The second electrode of the light emitting element LE may be a cathode (i.e., a common electrode) corresponding to the second contact electrode CTE2 (see FIG. 4) on the n-type semiconductor NSEM (see FIG. 4).

The light emitting element LE may be an inorganic light emitting element including a first electrode, a second electrode, and an inorganic semiconductor disposed between the first electrode and the second electrode. For example, the light emitting element LE may be, but is not limited to, a micro-light emitting diode including an inorganic semiconductor.

The pixel driver PD may include a first pixel driving circuit unit PDU1, a second pixel driving circuit unit PDU2, and a third pixel driving circuit unit PDU3.

The first pixel driving circuit unit PDU1 generates a control current Ic according to a PWM data voltage of the PWM data wiring PWM_DL and supplies the PWM data voltage to a third node N3 between the first pixel driving circuit unit PDU1 and the third pixel driving circuit unit PDU3.

A pulse width of the driving current Ids flowing through the light emitting element LE may be adjusted by the control current Ic of the first pixel driving circuit unit PDU1. Accordingly, the first pixel driving circuit unit PDU1 may be a PWM unit that performs pulse width modulation of the driving current Ids flowing through the light emitting element LE.

The first pixel driving circuit unit PDU1 may include first through seventh transistors T1 through T7 and a first capacitor PC1.

The first transistor T1 generates the control current Ic according to the PWM data voltage applied to a first electrode of the first transistor T1.

The second transistor T2 may be connected between the first data wiring PWM_DL and the first electrode of the first transistor T1, and a gate electrode of the second transistor T2 may be connected to the $k^{th}$ scan write wiring GWLk. The second transistor T2 is turned on by a $k^{th}$ scan write signal of the $k^{th}$ scan write wiring GWLk to supply the PWM data voltage of the first data wiring PWM_DL to the first electrode of the first transistor T1.

The third transistor T3 may be connected between the initialization voltage wiring VIL and the gate electrode of the first transistor T1, and a gate electrode of the third transistor T3 may be connected to the $k^{th}$ scan initialization wiring GILk. The third transistor T3 is turned on by a $k^{th}$ scan initialization signal of the $k^{th}$ scan initialization wiring GILk to connect the initialization voltage wiring VIL to the gate electrode of the first transistor T1. Accordingly, during a period in which the third transistor T3 is turned on, the gate electrode of the first transistor T1 may be initialized to the initialization voltage VI of the initialization voltage wiring VIL.

Here, a second gate level voltage VGL of the $k^{th}$ scan initialization signal may be different from the initialization voltage VI of the initialization voltage wiring VIL. In particular, because a difference voltage between the second gate level voltage VGL and the initialization voltage VI is greater than a threshold voltage of the third transistor T3, the third transistor T3 may be stably turned on even after the initialization voltage VI is applied to the gate electrode of the first transistor T1. Therefore, when the third transistor T3 is turned on, the initialization voltage VI may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Therefore, it is possible to prevent the voltage of the gate electrode of the first transistor T1 from leaking through the third transistor T3. A first electrode of the first sub-transistor T31 may be connected to the gate electrode of the first transistor T1, and a second electrode of the first sub-transistor T31 may be connected to a first electrode of the second sub-transistor T32. A second electrode of the second sub-transistor T32 may be connected to the initialization voltage wiring VIL.

The fourth transistor T4 may be connected between the gate electrode of the first transistor T1 and a second electrode of the first transistor T1, and a gate electrode of the fourth transistor T4 may be connected to the $k^{th}$ scan write wiring GWLk. The fourth transistor T4 is turned on by the $k^{th}$ scan write signal of the $k^{th}$ scan write wiring GWLk to connect the gate electrode and the second electrode of the first transistor T1. Accordingly, during a period in which the fourth transistor T4 is turned on, the first transistor T1 may operate as a diode (e.g., the first transistor T1 may be diode-connected).

The fourth transistor T4 may include a plurality of transistors connected in series. For example, the fourth transistor T4 may include a third sub-transistor T41 and a fourth sub-transistor T42. Therefore, it is possible to prevent the voltage of the gate electrode of the first transistor T1 from leaking through the fourth transistor T4. A first electrode of the third sub-transistor T41 may be connected to the second electrode of the first transistor T1, and a second electrode of the third sub-transistor T41 may be connected to a first electrode of the fourth sub-transistor T42. A second electrode of the fourth sub-transistor T42 may be connected to the gate electrode of the first transistor T1.

The fifth transistor T5 may be connected between the first power wiring PWM_VDL and the first electrode of the first transistor T1, and a gate electrode of the fifth transistor T5 may be connected to the $k^{th}$ PWM emission wiring PWELk.

The sixth transistor T6 may be connected between the second electrode of the first transistor T1 and the third node N3, and a gate electrode of the sixth transistor T6 may be connected to the $k^{th}$ PWM emission wiring PWELk.

The fifth transistor T5 and the sixth transistor T6 are turned on by the $k^{th}$ PWM emission signal of the $k^{th}$ PWM emission wiring PWELk to connect the first power wiring PWM_VDL and the first transistor T1 and connect the first transistor T1 and the third node N3. Accordingly, the control current Ic generated by the first transistor T1 is supplied to the third node N3.

The seventh transistor T7 may be connected between the gate voltage wiring VGHL and a first node N1, and a gate electrode of the seventh transistor T7 may be connected to the $k^{th}$ scan control wiring GCLk. The first node N1 is a contact point between the $k^{th}$ sweep signal wiring SWPLk and the first capacitor PC1. The seventh transistor T7 may be turned on by the $k^{th}$ scan control signal of the $k^{th}$ scan control wiring GCLk to supply a first gate level voltage VGH of the gate voltage wiring VGHL to the first node N1. Accordingly, during a period in which the initialization voltage VI is applied to the gate electrode of the first transistor T1 and a period in which the PWM data voltage of the PWM data wiring PWM_DL and a threshold voltage Vth1 of the first transistor T1 are programmed, it is possible to prevent a voltage change of the gate electrode of the first transistor T1 from being reflected in a $k^{th}$ sweep signal of the $k^{th}$ sweep signal wiring SWPLk by the first capacitor PC1.

The first capacitor PC1 may be disposed between the gate electrode of the first transistor T1 and the first node N1.

The second pixel driving circuit unit PDU2 generates the driving current Ids to be supplied to the light emitting element LE according to a PAM data voltage of the second data wiring PAM_DL. The second pixel driving circuit unit PDU2 may be a PAM unit that performs pulse amplitude modulation. The second pixel driving circuit unit PDU2 may be a constant current generating unit that generates a constant driving current Ids according to the PAM data voltage.

The second pixel driving circuit unit PDU2 of each of the subpixels RP, GP, and BP may receive a constant PAM data voltage regardless of the luminance of the subpixel RP, GP, or BP and generate the same driving current Ids.

The second pixel driving circuit unit PDU2 may include eighth through fourteenth transistors T8 through T14 and a second capacitor PC2.

The eighth transistor T8 generates the driving current Ids to be supplied to the light emitting element LE.

The ninth transistor T9 may be connected between the second data wiring PAM_DL and a first electrode of the eighth transistor T8, and a gate electrode of the ninth transistor T9 may be connected to the $k^{th}$ scan write wiring GWLk. The ninth transistor T9 is turned on by the $k^{th}$ scan write signal of the $k^{th}$ scan write wiring GWLk to apply the PAM data voltage of the second data wiring PAM_DL to the first electrode of the eighth transistor T8.

The tenth transistor T10 may be connected between the initialization voltage wiring VIL and a gate electrode of the eighth transistor T8, and a gate electrode of the tenth transistor T10 may be connected to the $k^{th}$ scan initialization wiring GILk. The tenth transistor T10 is turned on by the $k^{th}$ scan initialization signal of the $k^{th}$ scan initialization wiring GILk to connect the initialization voltage wiring VIL to the gate electrode of the eighth transistor T8. Accordingly, during a period in which the tenth transistor T10 is turned on, the gate electrode of the eighth transistor T8 may be initialized to the initialization voltage VI of the initialization voltage wiring VIL. Here, the second gate level voltage VGL of the $k^{th}$ scan initialization signal may be different from the initialization voltage VI of the initialization voltage wiring VIL. In particular, because a difference voltage between the second gate level voltage VGL and the initialization voltage VI is greater than a threshold voltage of the tenth transistor T10, the tenth transistor T10 may be stably turned on even after the initialization voltage VI is applied to the gate electrode of the eighth transistor T8. Therefore, when the tenth transistor T10 is turned on, the initialization voltage VI may be stably applied to the gate electrode of the eighth transistor T8 regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. Therefore, it is possible to prevent the voltage of the gate electrode of the eighth transistor T8 from leaking through the tenth transistor T10. A first electrode of the fifth sub-transistor T101 may be connected to the gate electrode of the eighth transistor T8, and a second electrode of the fifth sub-transistor T101 may be connected to a first electrode of the sixth sub-transistor T102. A second electrode of the sixth sub-transistor T102 may be connected to the initialization voltage wiring VIL.

The eleventh transistor T11 may be connected between the gate electrode of the eighth transistor T8 and a second electrode of the eighth transistor T8, and a gate electrode of the eleventh transistor T11 may be connected to the $k^{th}$ scan write wiring GWLk. The eleventh transistor T11 is turned on by the $k^{th}$ scan write signal of the $k^{th}$ scan write wiring GWLk to connect the gate electrode of the eighth transistor T8 and the second electrode of the eighth transistor T8. Accordingly, during a period in which the eleventh transistor T11 is turned on, the eighth transistor T8 may operate as a diode (e.g., the eighth transistor T8 may be diode-connected).

The eleventh transistor T11 may include a plurality of transistors connected in series. For example, the eleventh transistor T11 may include a seventh sub-transistor T111 and an eighth sub-transistor T112. Therefore, it is possible to prevent the voltage of the gate electrode of the eighth transistor T8 from leaking through the eleventh transistor T11. A first electrode of the seventh sub-transistor T111 may be connected to the second electrode of the eighth transistor T8, and a second electrode of the seventh sub-transistor T111 may be connected to a first electrode of the eighth sub-transistor T112. A second electrode of the eighth sub-transistor T112 may be connected to the gate electrode of the eighth transistor T8.

The twelfth transistor T12 may be connected between the second power wiring PAM_VDL and the first electrode of the eighth transistor T8, and a gate electrode of the twelfth transistor T12 may be connected to the $k^{th}$ PWM emission wiring PWELk. The twelfth transistor T12 is turned on by the $k^{th}$ PWM emission signal of the $k^{th}$ PWM emission wiring PWELk to connect the first electrode of the eighth transistor T8 to the second power wiring PAM_VDL.

The thirteenth transistor T13 may be connected between the first power wiring PWM_VDL and a second node N2, and a gate electrode of the thirteenth transistor T13 may be connected to the $k^{th}$ scan control wiring GCLk. The thirteenth transistor T13 is turned on by the $k^{th}$ scan control signal of the $k^{th}$ scan control wiring GCLk to connect the first power wiring PWM_VDL to the second node N2.

The fourteenth transistor T14 may be connected between the second power wiring PAM_VDL and the second node N2, and a gate electrode of the fourteenth transistor T14 may be connected to the $k^{th}$ PWM emission wiring PWELk. The fourteenth transistor T14 is turned on by the $k^{th}$ PWM light emission signal of the $k^{th}$ PWM emission wiring PWELk to connect the second power wiring PAM_VDL to the second node N2. Therefore, when the fourteenth transistor T14 is turned on, the second power voltage PAM_VDD of the second power wiring PAM_VDL may be applied to the second node N2.

The second node N2 is a contact point to which a second electrode of the thirteenth transistor T13, a second electrode of the fourteenth transistor T14, and the second capacitor PC2 are connected.

The second capacitor PC2 may be connected between the gate electrode of the eighth transistor T8 and the second node N2.

The third pixel driving circuit unit PDU3 adjusts a period during which the driving current Ids generated by the second pixel driving circuit unit PDU2 is supplied to the light emitting element LE according to the control current Ic that is supplied to the third node N3 and generated by the first pixel driving circuit unit PDU1.

The third pixel driving circuit unit PDU3 may include fifteenth through eighteenth transistors T15 through T18 and a third capacitor PC3.

The fifteenth transistor T15 may be connected between the second electrode of the eighth transistor T8 of the second pixel driving circuit unit PDU2 and the seventeenth transistor T17, and a gate electrode of the fifteenth transistor T15 may be connected to the third node N3. The fifteenth transistor T15 is turned on or turned off according to the voltage of the third node N3. When the fifteenth transistor T15 is turned on, the driving current Ids of the eighth transistor T8 may be supplied to the light emitting element LE through the seventeenth transistor T17. That is, when the fifteenth transistor T15 is turned off, the driving current Ids of the eighth transistor T8 may not be supplied to the light emitting element LE. Therefore, a turn-on period of the fifteenth transistor T15 may be substantially the same as a light emission period of the light emitting element LE.

The sixteenth transistor T16 may be connected between the initialization voltage wiring VIL and the third node N3, and a gate electrode of the sixteenth transistor T16 may be connected to the $k^{th}$ scan control wiring GCLk. The sixteenth transistor T16 is turned on by the $k^{th}$ scan control signal of the $k^{th}$ scan control wiring GCLk to connect the initialization voltage wiring VIL to the third node N3. Accordingly, during a period in which the sixteenth transistor T16 is turned on, the third node N3 may be initialized to the initialization voltage VI of the initialization voltage wiring VIL.

The sixteenth transistor T16 may include a plurality of transistors connected in series. For example, the sixteenth transistor T16 may include a ninth sub-transistor T161 and a tenth sub-transistor T162. Therefore, it is possible to prevent the voltage of the third node N3 from leaking through the sixteenth transistor T16. A first electrode of the ninth sub-transistor T161 may be connected to the third node N3, and a second electrode of the ninth sub-transistor T161 may be connected to a first electrode of the tenth sub-transistor T162. A second electrode of the tenth sub-transistor T162 may be connected to the initialization voltage wiring VIL.

The seventeenth transistor T17 may be connected between a second electrode of the fifteenth transistor T15 and a first electrode of the light emitting element LE, and a gate electrode of the seventeenth transistor T17 may be connected to the $k^{th}$ PAM emission wiring PAELk. The first electrode of the light emitting element LE corresponds to the anode AND. The seventeenth transistor T17 is turned on by the $k^{th}$ PAM emission signal of the $k^{th}$ PAM emission wiring PAELk to connect the second electrode of the fifteenth transistor T15 to the first electrode of the light emitting element LE.

The eighteenth transistor T18 may be connected between the initialization voltage wiring VIL and the first electrode of the light emitting element LE, and a gate electrode of the eighteenth transistor T18 may be connected to the $k^{th}$ scan control wiring GCLk. The eighteenth transistor T18 is turned on by the $k^{th}$ scan control signal of the $k^{th}$ scan control wiring GCLk to connect the initialization voltage wiring VIL to the first electrode of the light emitting element LE. Accordingly, during a period in which the eighteenth transistor T18 is turned on, the first electrode of the light emitting element LE may be initialized to the initialization voltage VI of the initialization voltage wiring VIL.

The third capacitor PC3 may be connected between the third node N3 and the initialization voltage wiring VIL.

The third node N3 may be a contact point to which a second electrode of the sixth transistor T6, the gate electrode of the fifteenth transistor T15, the first electrode of the ninth sub-transistor T161, and the third capacitor PC3 are connected.

Any one of the first and second electrodes of each of the first through eighteenth transistors T1 through T18 may be a source electrode, and the other may be a drain electrode. A channel of each of the first through eighteenth transistors T1 through T18 may be made of any one of polysilicon, amorphous silicon, and an oxide semiconductor. When the channel of each of the first through eighteenth transistors T1 through T18 is made of polysilicon, it may be formed by a low temperature polysilicon (LTPS) process.

Although a case where each of the first through eighteenth transistors T1 through T18 is formed as a P-type metal oxide semiconductor field effect transistor (MOSFET) has been mainly described in FIG. 6, one or more embodiments are not limited thereto. For example, at least one of the first through eighteenth transistors T1 through T18 may also be formed as an N-type MOSFET.

For example, in order to increase the black expressing capability of the light emitting element LE by blocking a leakage current, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as N-type MOSFETs.

In this case, a gate electrode of the third sub-transistor T41 and a gate electrode of the fourth sub-transistor T42 of the fourth transistor T4 and a gate electrode of the seventh sub-transistor T111 and a gate electrode of the eighth sub-transistor T112 of the eleventh transistor T11 may be connected to a $k^{th}$ control signal. The $k^{th}$ scan initialization signal GILk and the $k^{th}$ control signal may have pulses generated using the first gate level voltage VGH.

In addition, channels of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be made of an oxide semiconductor, and channels of the other transistors may be made of polysilicon.

Alternatively, any one of the first sub-transistor T31 and the second sub-transistor T32 of the third transistor T3 may be formed as an N-type MOSFET and the other may be formed as a P-type MOSFET. In this case, a channel of a transistor formed as an N-type MOSFET from among the first sub-transistor T31 and the second sub-transistor T32 of the third transistor T3 may be made of an oxide semiconductor, and a channel of a transistor formed as a P-type MOSFET may be made of polysilicon.

Alternatively, any one of the third sub-transistor T41 and the fourth sub-transistor T42 of the fourth transistor T4 may be formed as an N-type MOSFET, and the other may be formed as a P-type MOSFET. In this case, a channel of a transistor formed as an N-type MOSFET from among the third sub-transistor T41 and the fourth sub-transistor T42 of the fourth transistor T4 may be made of an oxide semiconductor, and a channel of a transistor formed as a P-type MOSFET may be made of polysilicon.

Alternatively, any one of the fifth sub-transistor T101 and the sixth sub-transistor T102 of the tenth transistor T10 may be formed as an N-type MOSFET, and the other may be formed as a P-type MOSFET. In this case, a channel of a transistor formed as an N-type MOSFET from among the fifth sub-transistor T101 and the sixth sub-transistor T102 of the tenth transistor T10 may be made of an oxide semiconductor, and a channel of a transistor formed as a P-type MOSFET may be made of polysilicon.

Alternatively, any one of the seventh sub-transistor T111 and the eighth sub-transistor T112 of the eleventh transistor T11 may be formed as an N-type MOSFET, and the other may be formed as a P-type MOSFET. In this case, a channel of a transistor formed as an N-type MOSFET from among the seventh sub-transistor T111 and the eighth sub-transistor T112 of the eleventh transistor T11 may be made of an oxide semiconductor, and a channel of a transistor formed as a P-type MOSFET may be made of polysilicon.

Figure 7:
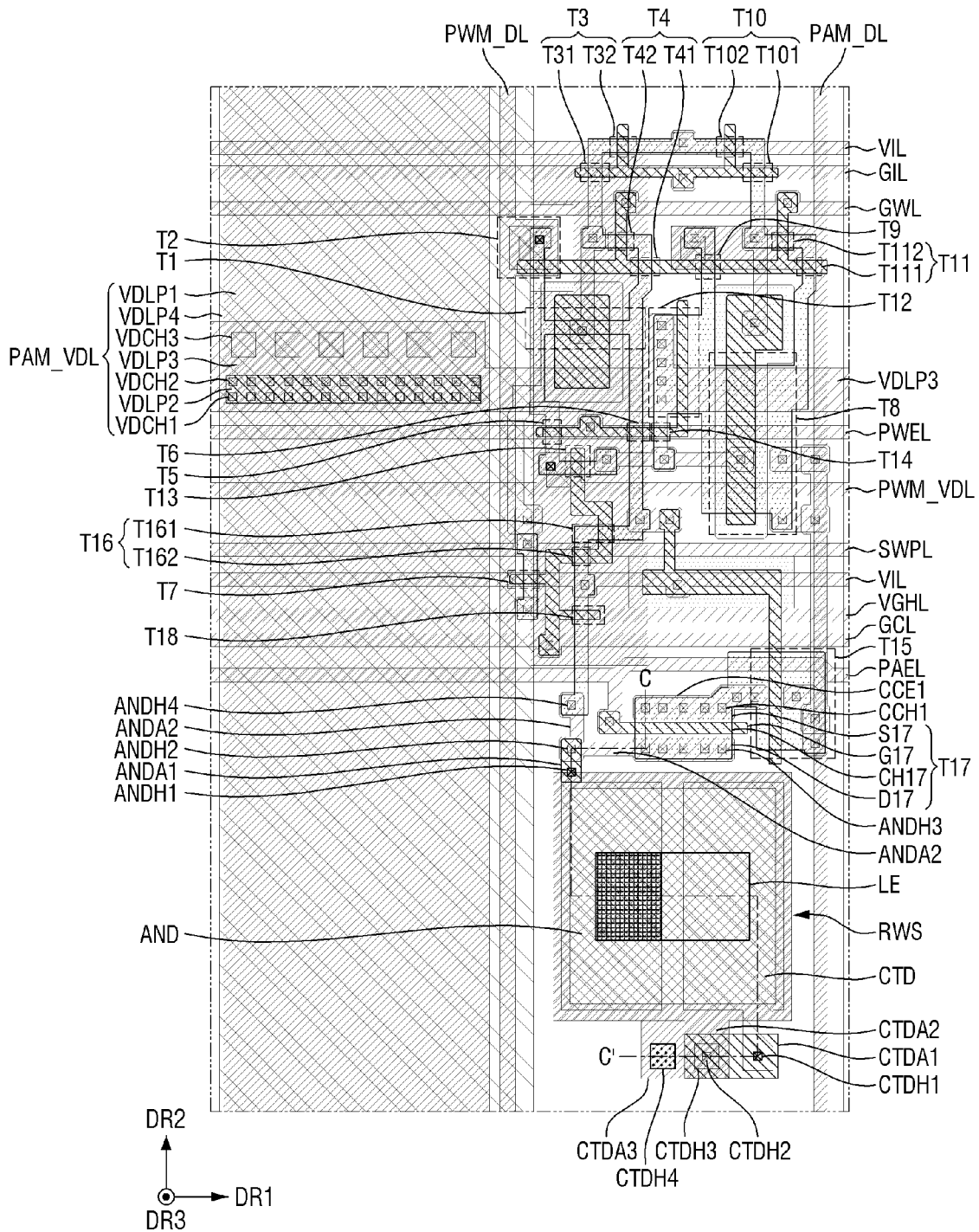
FIG. 7 is a layout view of an example of any one subpixel of FIG. 2.
Figure 8:
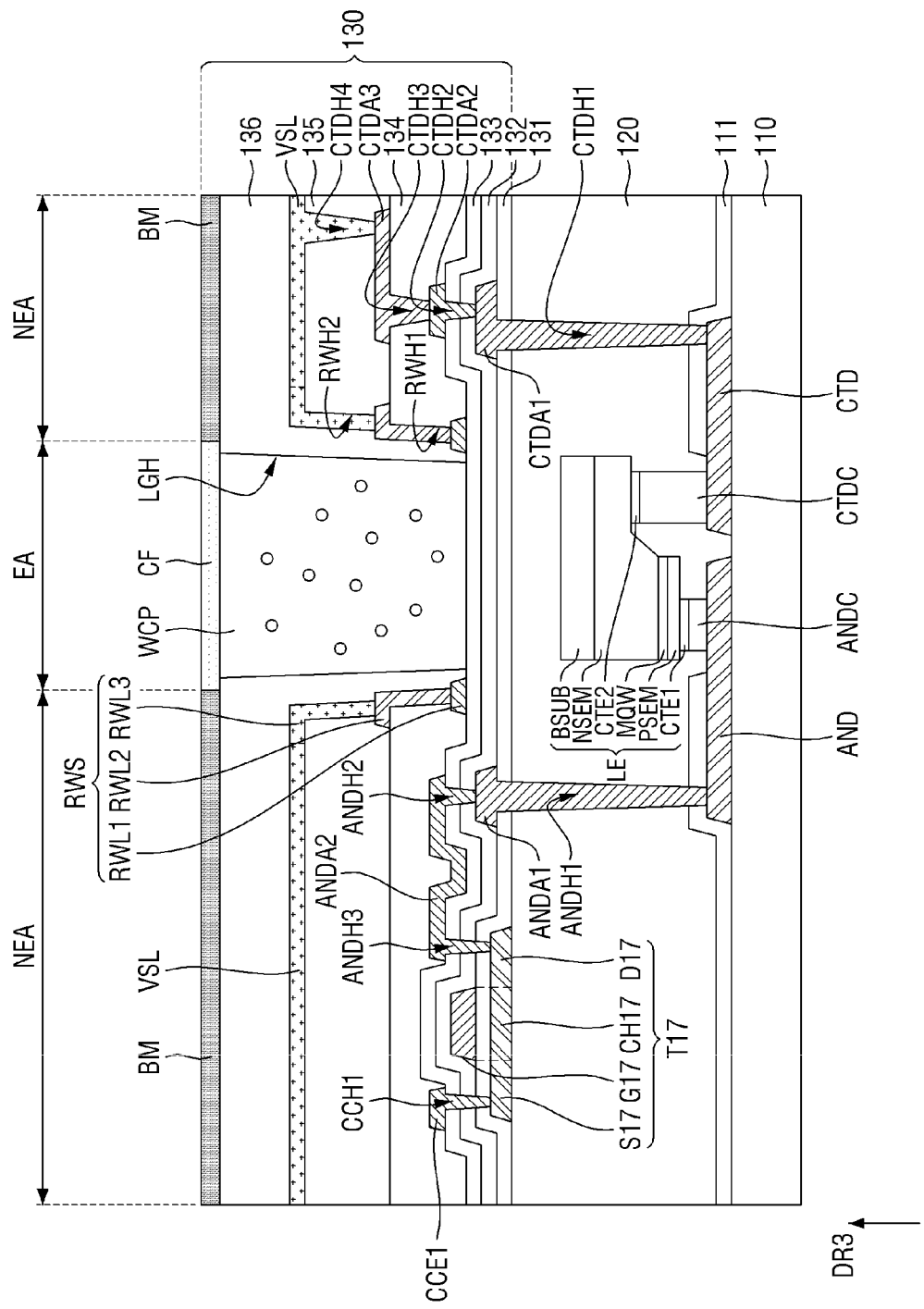
FIG. 8 is a cross-sectional view of an example of a plane cut along the line C-C' of FIG. 7.
Figure 9:
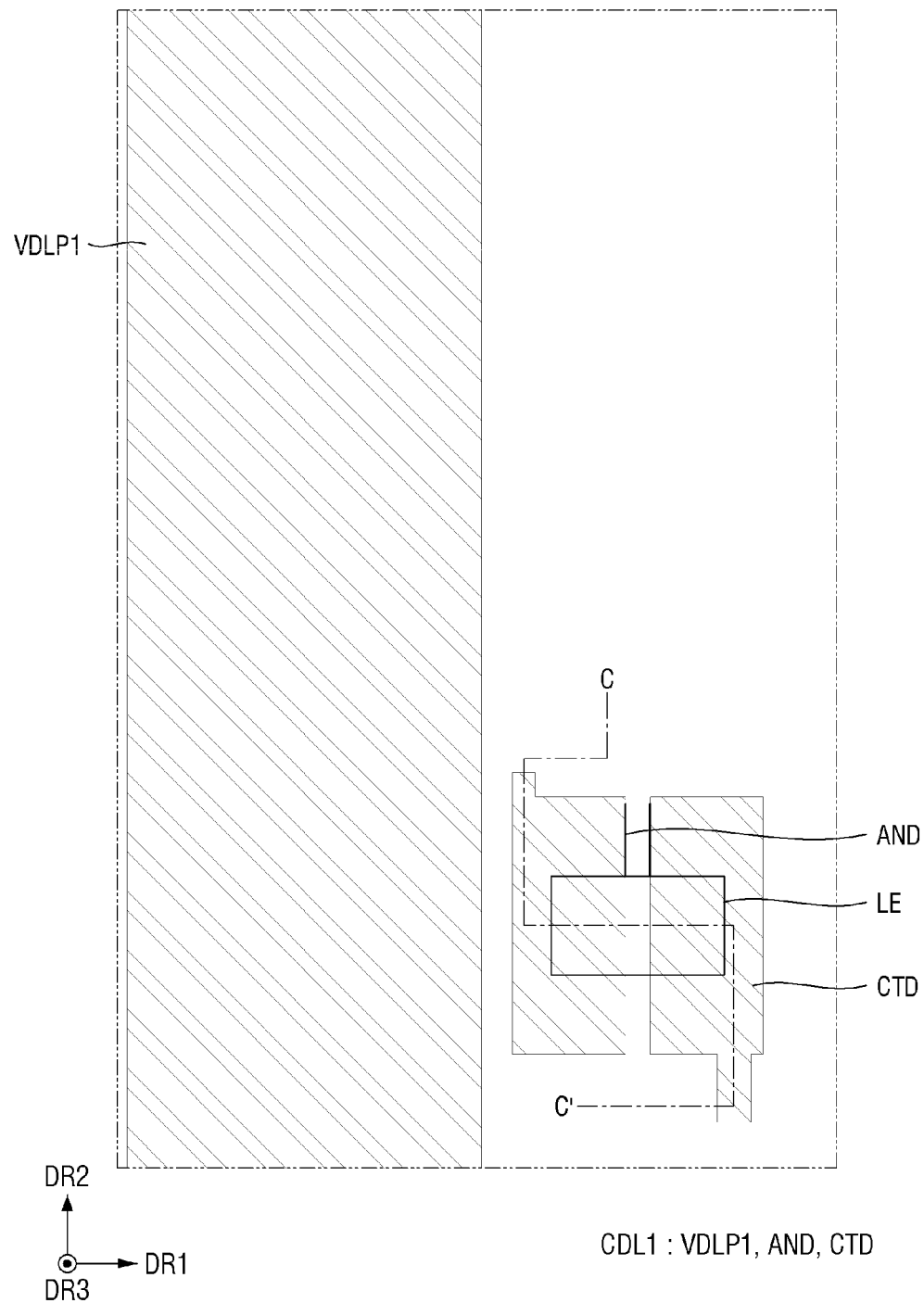
FIG. 9 is a layout view illustrating a first conductive layer and a light emitting element of FIG. 7.
Figure 10:
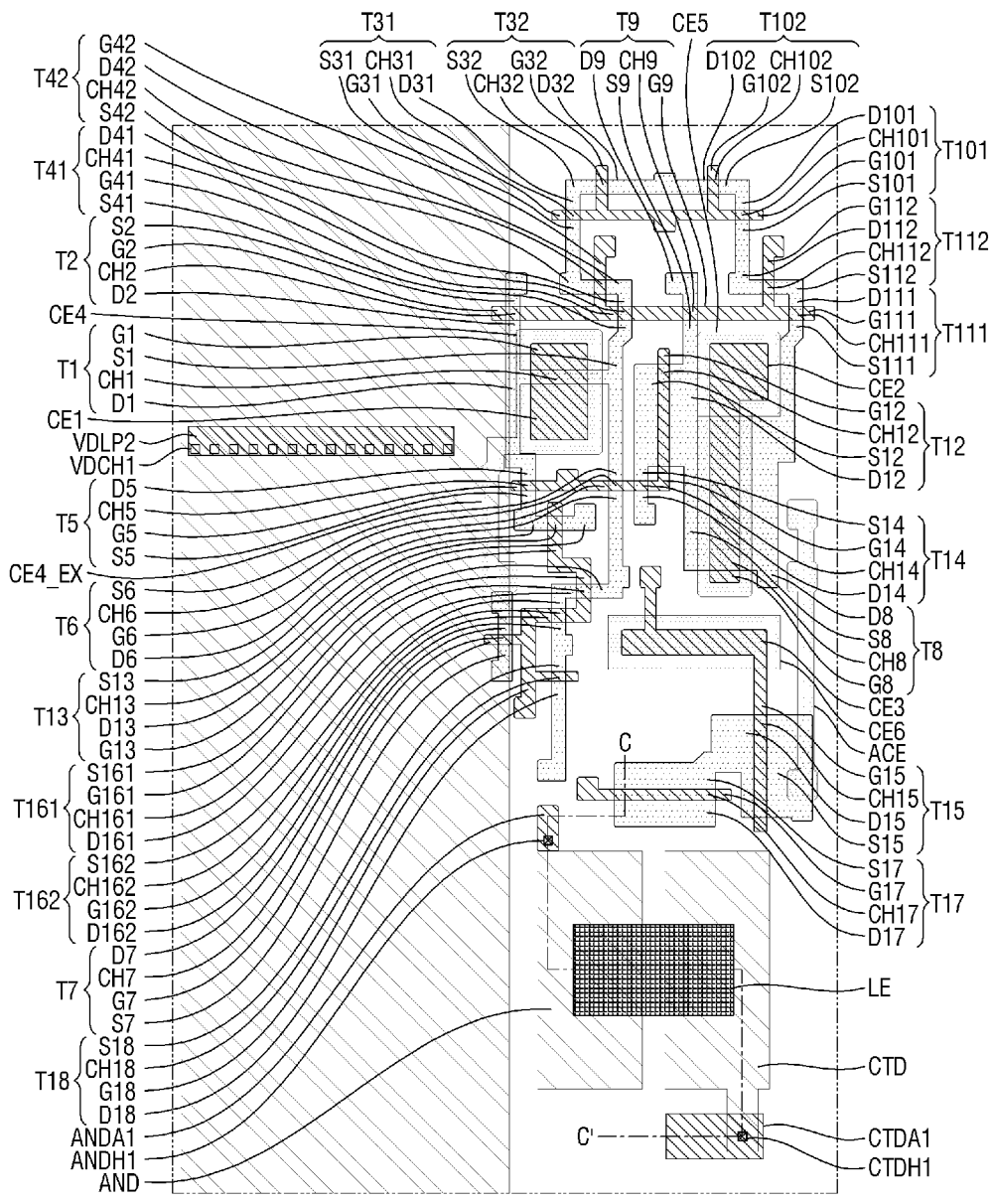
FIG. 10 is a layout view illustrating the first conductive layer, the light emitting element, a semiconductor layer, a second conductive layer, and a third conductive layer of FIG. 7.
Figure 11:
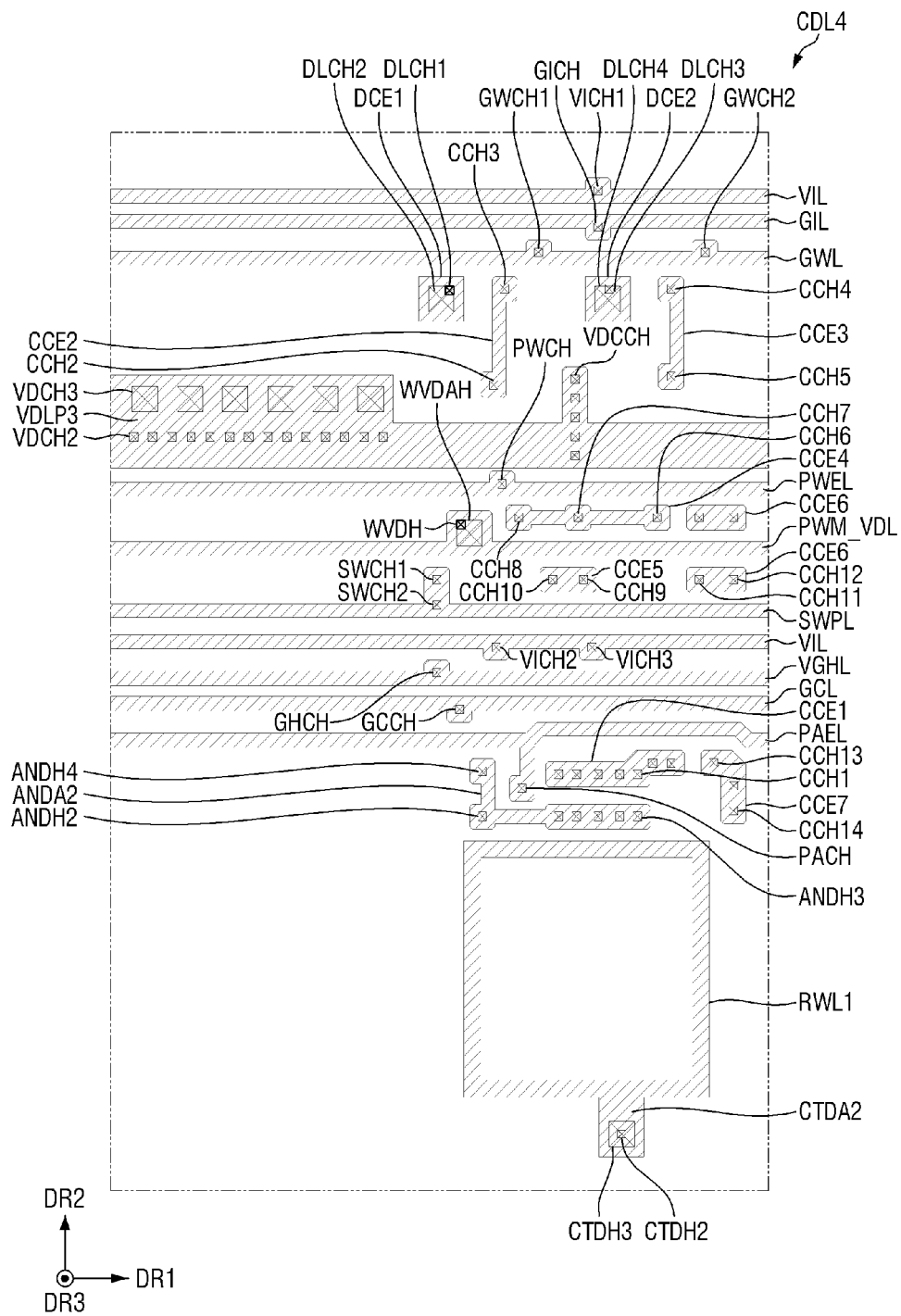
FIG. 11 is a layout view illustrating a fourth conductive layer of FIG. 7.
Figure 12:
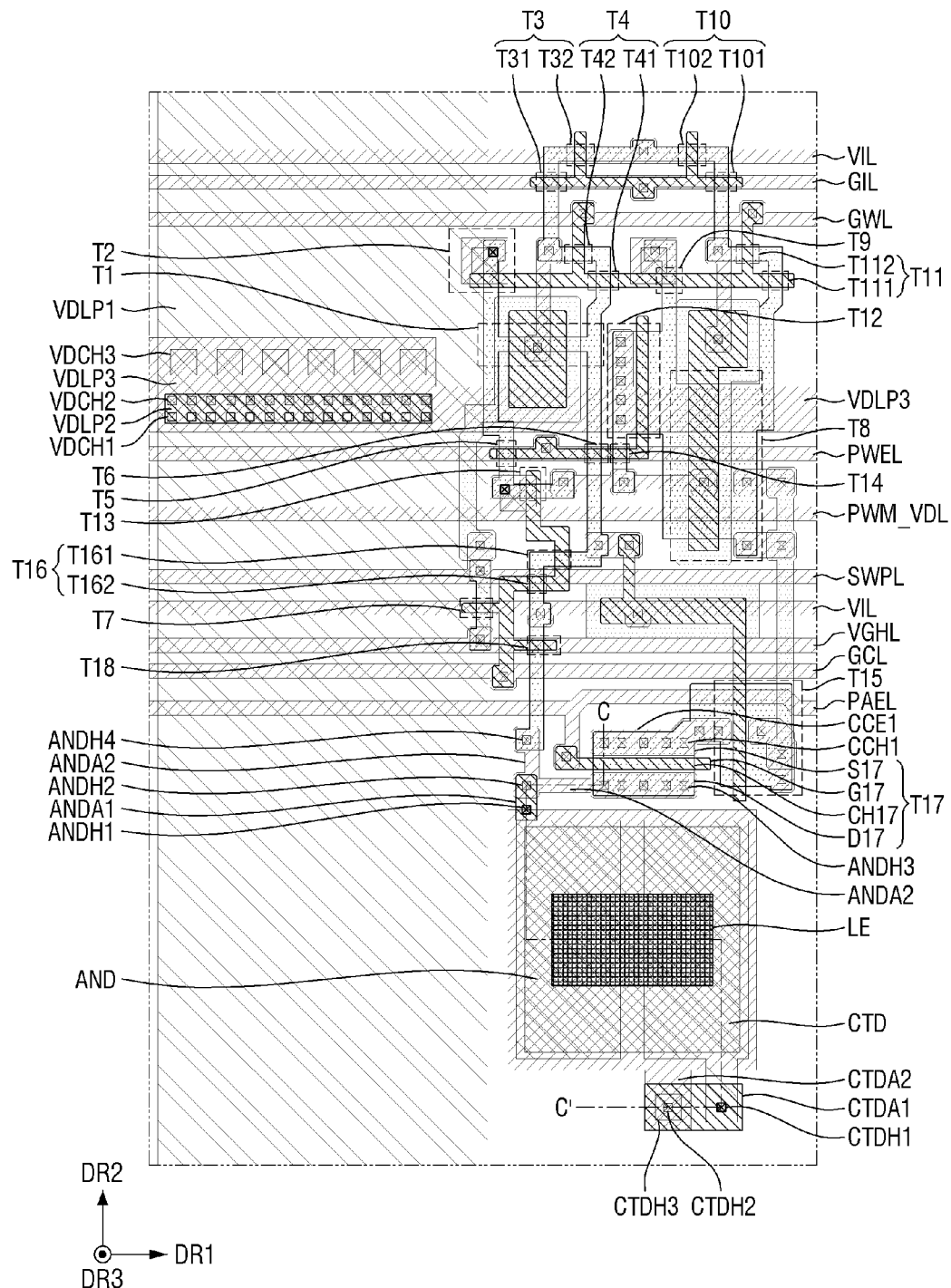
FIG. 12 is a layout view illustrating the first conductive layer, the light emitting element, the semiconductor layer, the second conductive layer, the third conductive layer, and the fourth conductive layer of FIG. 7.
Figure 13:
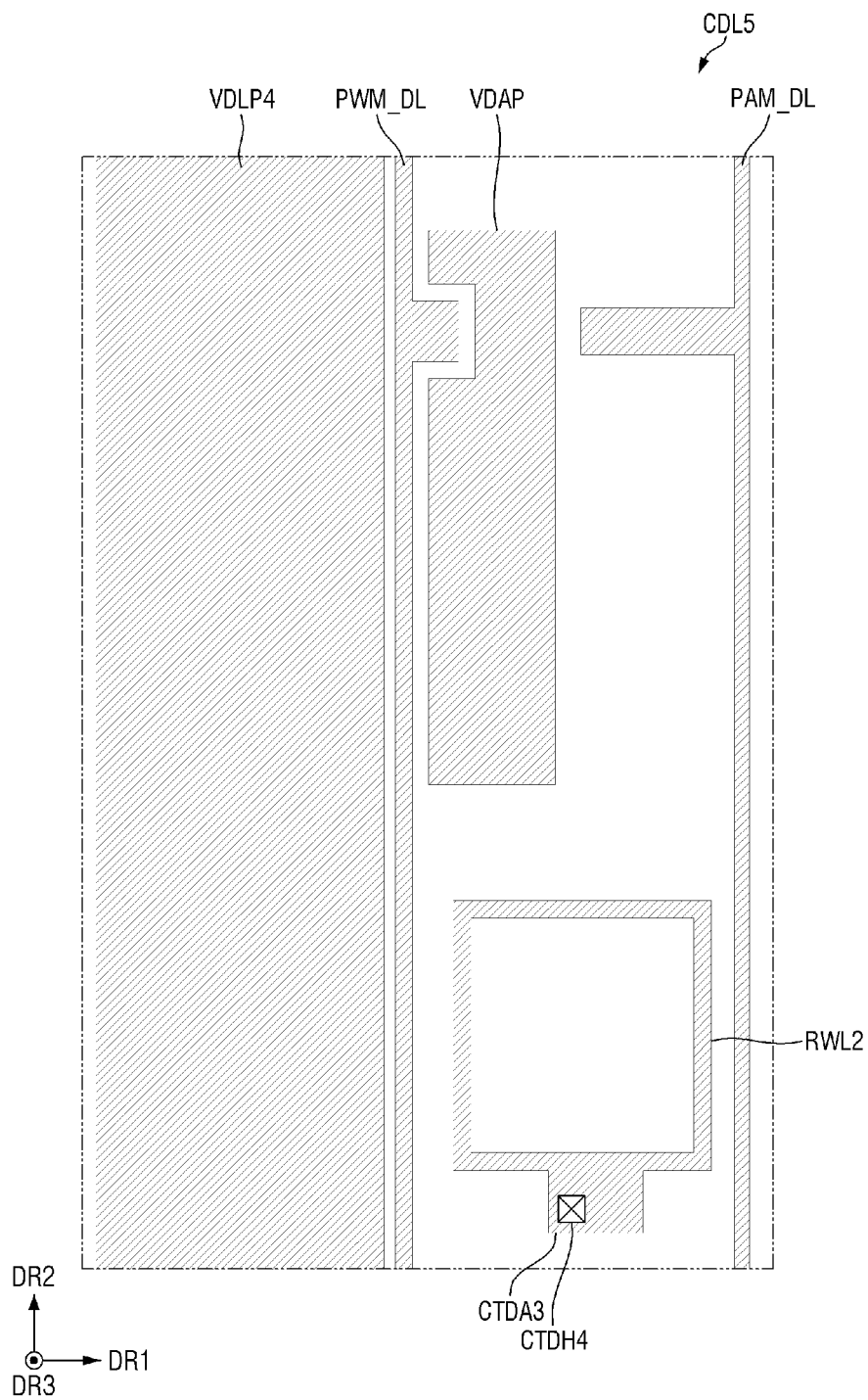
FIG. 13 is a layout view illustrating a fifth conductive layer of FIG. 7.
Figure 14:
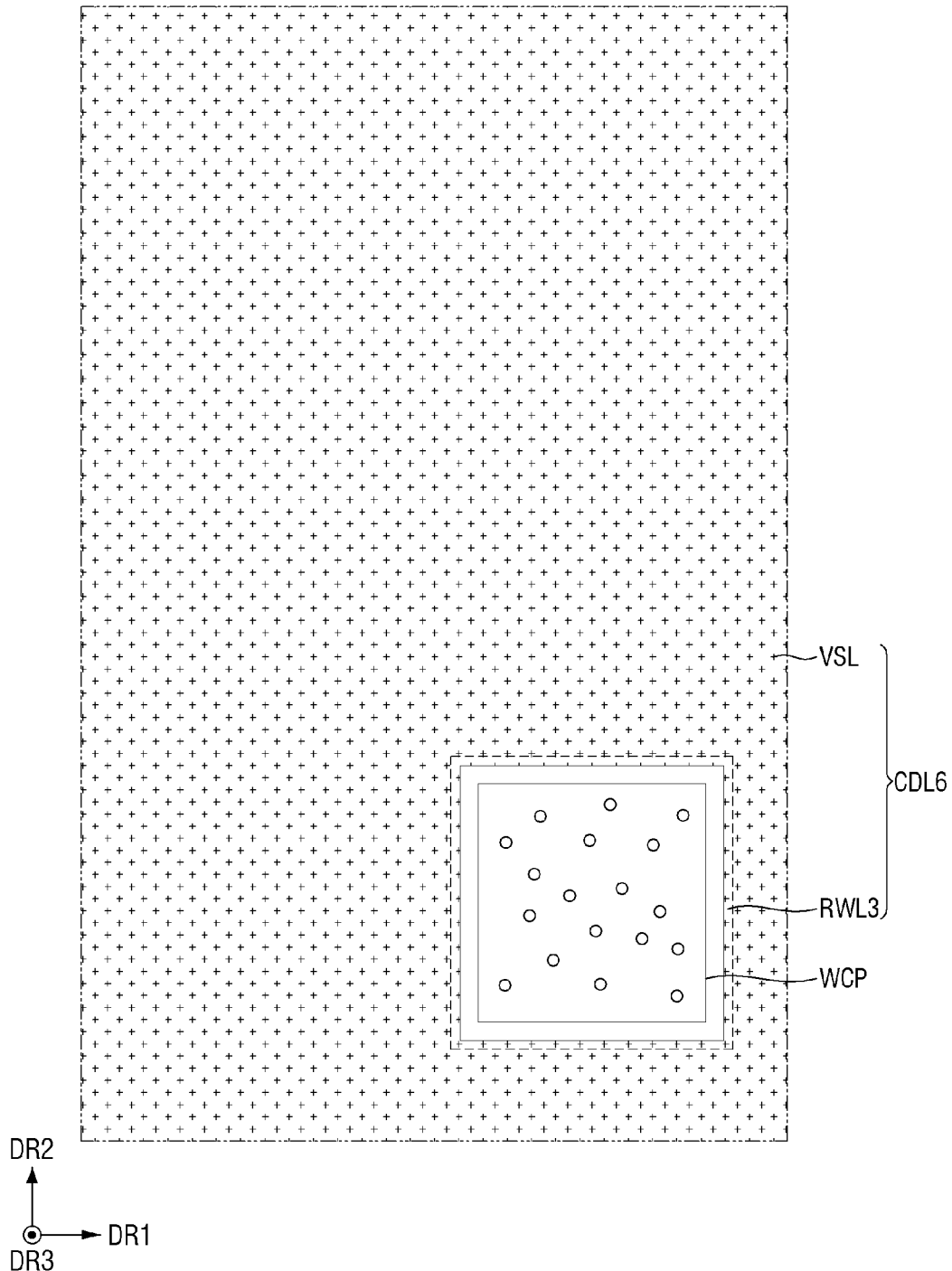
FIG. 14 is a layout view illustrating a sixth conductive layer of FIG. 7.

FIG. 7 is a layout view of an example of any one subpixel of FIG. 2. FIG. 8 is a cross-sectional view of an example of a plane cut along the line C-C' of FIG. 7. FIG. 9 is a layout view illustrating a first conductive layer CDL1 and a light emitting element LE of FIG. 7. FIG. 10 is a layout view illustrating the first conductive layer CDL1, the light emitting element LE, a semiconductor layer SEL, a second conductive layer CDL2, and a third conductive layer CDL3 of FIG. 7. FIG. 11 is a layout view illustrating a fourth conductive layer CDL4 of FIG. 7. FIG. 12 is a layout view illustrating the first conductive layer CDL1, the light emitting element LE, the semiconductor layer SEL, the second conductive layer CDL2, the third conductive layer CDL3, and the fourth conductive layer CDL4 of FIG. 7. FIG. 13 is a layout view illustrating a fifth conductive layer CDL5 of FIG. 7. FIG. 14 is a layout view illustrating a sixth conductive layer CDL6 of FIG. 7.

Referring to FIGS. 7 and 8, the display device 10 according to one or more embodiments includes the substrate 110 including a plurality of emission areas EA (EA_R, EA_G, and EA_B of FIGS. 2 and 4) corresponding to a plurality of subpixels RP, GP, and BP, a plurality of light emitting elements LE respectively disposed in the emission areas EA of the first surface of the substrate 110, the first planarization layer 120 disposed on the first surface of the substrate 110 and covering the light emitting elements LE, and the array layer 130 disposed on the first planarization layer 120.

The array layer 130 includes a plurality of pixel drivers PD respectively corresponding to the subpixels RP, GP, and BP. The pixel drivers PD are disposed in the non-emission area NEA, which is an area between the emission areas EA, and each include at least one transistor T1 through T18 (see FIG. 6).

The display device 10 according to the present embodiment may further include a plurality of anodes AND disposed in respective portions of the emission areas EA of the first surface of the substrate 110 and respectively corresponding to the subpixels RP, GP, and BP and a plurality of cathodes CTD disposed in other respective portions of the emission areas EA of the first surface of the substrate 110 and respectively corresponding to the subpixels RP, GP, and BP.

The anodes AND and the cathodes CTD may be made of the first conductive layer CDL1 on the first surface of the substrate 110 and may be covered with the first planarization layer 120. That is, the first planarization layer 120 further covers the anodes AND and the cathodes CTD as well as the light emitting elements LE.

The substrate 110 may include a plurality of emission areas EA respectively corresponding to the subpixels RP, GP, and BP and the non-emission area NEA which is an area between the emission areas EA.

The substrate 110 may be a rigid substrate made of a glass material.

Alternatively, the substrate 110 may be a flexible substrate made of a plastic material that can be bent, folded, or rolled. In this case, the substrate 110 may include an insulating material, e.g., polymer resin such as polyimide (PI).

The first conductive layer CDL1 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The anodes AND are respectively connected to the pixel drivers PD, and the cathodes CTD are connected to the third power wiring VSL.

In order to connect each of the cathodes CTD to the third power wiring VSL, the array layer 130 may further include a plurality of first cathode auxiliary electrodes CTDA1 that are made of the second conductive layer CDL2 (see FIG. 10) on a first gate insulating layer 131 and respectively connected to the cathodes CTD through first cathode contact holes CTDH1 penetrating the first gate insulating layer 131, the first planarization layer 120, and the bank buffer layer 111 (e.g., see FIG. 8), a plurality of second cathode auxiliary electrodes CTDA2 that are made of the fourth conductive layer CDL4 (see FIG. 11) on an interlayer insulating layer 133 and respectively connected to the first cathode auxiliary electrodes CTDA1 through second cathode contact holes CTDH2 penetrating the interlayer insulating layer 133 and a second gate insulating layer 132, and a plurality of third cathode auxiliary electrodes CTDA3 that are made of the fifth conductive layer CDL5 (see FIG. 13) on a second planarization layer 134 and respectively connected to the second cathode auxiliary electrodes CTDA2 through third cathode contact holes CTDH3 penetrating the second planarization layer 134.

The third power wiring VSL made of the sixth conductive layer CDL6 (see FIG. 14) on the third planarization layer 135 may be connected to the third cathode auxiliary electrodes CTDA3 through fourth cathode contact holes CTDH4 penetrating a third planarization layer 135.

Accordingly, the cathode CTD of each emission area EA may be connected to the third power wiring VSL through a first cathode contact hole CTDH1, a first cathode auxiliary electrode CTDA1, a second cathode contact hole CTDH2, a second cathode auxiliary electrode CTDA2, a third cathode contact hole CTDH3, a third cathode auxiliary electrode CTDA3, and a fourth cathode contact hole CTDH4.

In addition, in order to connect the anodes AND to the pixel drivers PD, respectively, the array layer 130 may further include a plurality of first anode auxiliary electrodes ANDA1 that are made of the second conductive layer CDL2 (see FIG. 10) on the first gate insulating layer 131 and respectively connected to the anodes AND through first anode contact holes ANDH1 penetrating the first gate insulating layer 131, the first planarization layer 120, and the bank buffer layer 111 (e.g., see FIG. 8), and a plurality of second anode auxiliary electrodes ANDA2 that are made of the fourth conductive layer CDL4 (see FIG. 11) on the interlayer insulating layer 133 and respectively connected to the first anode auxiliary electrodes ANDA1 through second anode contact holes ANDH2 penetrating the interlayer insulating layer 133 and the second gate insulating layer 132.

Each of the second anode auxiliary electrodes ANDA2 may be connected to a seventeenth drain electrode D17 of a seventeenth transistor T17 through third anode contact holes ANDH3 penetrating the interlayer insulating layer 133, the second gate insulating layer 132, and the first gate insulating layer 131.

A seventeenth source electrode S17 of the seventeenth transistor T17 may be connected to a first connection electrode CCE1 made of the fourth conductive layer CDL4 (see FIG. 11) on the interlayer insulating layer 133 through a first connection auxiliary contact hole CCH1 penetrating the interlayer insulating layer 133, the second gate insulating layer 132, and the first gate insulating layer 131. The first connection auxiliary contact hole CCH1 may be provided in plural numbers, which may be suitable for reducing resistance of the seventeenth source electrode S17.

In addition, each of the second anode auxiliary electrodes ANDA2 may be connected to an eighteenth drain electrode D18 of an eighteenth transistor T18 through a fourth anode contact hole ANDH4 (e.g., see FIG. 11) penetrating the interlayer insulating layer 133, the second gate insulating layer 132, and the first gate insulating layer 131.

Accordingly, the anode AND of each emission area EA may be connected to the seventeenth drain electrode D17 and the eighteenth drain electrode D18 through a first anode contact hole ANDH1, a first anode auxiliary electrode ANDA1, a second anode contact hole ANDH2, a second anode auxiliary electrode ANDA2, third anode contact holes ANDH3, and a fourth anode contact hole ANDH4.

In each of the emission areas EA, a light emitting element LE may be disposed on an anode AND and a cathode CTD and may be connected to a pixel driver PD through the anode AND.

That is, the first contact electrode CTE1 of the light emitting element LE may be disposed on the anode AND and electrically connected to the anode AND and thus may be connected to the pixel driver PD through the anode AND. In addition, the second contact electrode CTE2 of the light emitting element LE may be disposed on the cathode CTD and electrically connected to the cathode CTD and thus may be connected to the third power wiring VSL through the cathode CTD.

As illustrated in FIG. 7, a second power wiring PAM_VDL may include two or more wiring patterns disposed on different layers and connected to each other to reduce resistance.

For example, the second power wiring PAM_VDL may include a first wiring pattern VDLP1 disposed as the first conductive layer CDL1 (see FIG. 9) on the first surface of the substrate 110, a second wiring pattern VDLP2 disposed as the second conductive layer CDL2 (see FIG. 10) on the first gate insulating layer 131, a third wiring pattern VDLP3 disposed as the fourth conductive layer CDL4 (see FIG. 11) on the interlayer insulating layer 133, and a fourth wiring pattern VDLP4 disposed as the fifth conductive layer CDL5 (see FIG. 13) on the second planarization layer 134.

The first wiring pattern VDLP1 may be made of the first conductive layer CDL1 on the first surface of the substrate 110, together with the anode AND and the cathode CTD. The first wiring pattern VDLP1 may correspond to the non-emission area NEA and extend in the second direction DR2.

The second wiring pattern VDLP2 may be made of the second conductive layer CDL2 on the first gate insulating layer 131, together with gate electrodes G. The second wiring pattern VDLP2 may be shaped like an island overlapping a portion of the first wiring pattern VDLP1. The second wiring pattern VDLP2 may be connected to the first wiring pattern VDLP1 through first power contact holes VDCH1 penetrating the first gate insulating layer 131 and the first planarization layer 120.

The third wiring pattern VDLP3 may be made of the fourth conductive layer CDL4 (see FIG. 11) on the interlayer insulating layer 133, together with gate wirings VIL, GIL, GCL, PWEL, PWAL, and SWPL extending in the first direction DR1. The third wiring pattern VDLP3 may extend in the first direction DR1. The third wiring pattern VDLP3 may be connected to the second wiring pattern VDLP2 through second power contact holes VDCH2 penetrating the interlayer insulating layer 133 and the second gate insulating layer 132.

The fourth wiring pattern VDLP4 may be made of the fifth conductive layer CDL5 (see FIG. 13) on the second planarization layer 134, together with the data wirings PWM_DL and PAM_DL extending in the second direction DR2. The fourth wiring pattern VDLP4 may correspond to the non-emission area NEA and may extend in the second direction DR2. That is, the fourth wiring pattern VDLP4 may overlap the first wiring pattern VDLP1. The fourth wiring pattern VDLP4 may be connected to the third wiring pattern VDLP3 through third power contact holes VDCH3 penetrating the second planarization layer 134.

Referring to FIGS. 7 through 14, the array layer 130 may include the first gate insulating layer 131 covering the semiconductor layer CH17, S17, and D17 (e.g., see FIG. 8 and SEL in FIG. 10) on the first planarization layer 120, the second gate insulating layer 132 covering the second conductive layer G17, CTDA1, ANDA1 (e.g., see FIG. 8 and CDL2 in FIG. 10) on the first gate insulating layer 131, the interlayer insulating layer 133 covering the third conductive layer CDL3 (see FIG. 10) on the second gate insulating layer 132, the second planarization layer 134 covering the fourth conductive layer CCE1, ANDA2, RWL1 and CTDA2 (CDL4 in FIG. 11) on the interlayer insulating layer 133, the third planarization layer 135 covering the fifth conductive layer RWL2 and CTDA3 (CDL5 in FIG. 13) on the second planarization layer 134, and the sixth conductive layer RWL3 and VSL (CDL6 in FIG. 14) on the third planarization layer 135.

The array layer 130 may further include a plurality of reflective wall structures RWS shaped to correspond to edges of the emission areas EA, respectively.

Each of the reflective wall structures RWS may include a first reflective wall layer RWL1 made of the fourth conductive layer CDL4 (see FIG. 11) on the interlayer insulating layer 133, a first reflective wall hole RWH1 penetrating the second planarization layer 134 and corresponding to a portion of the first reflective wall layer RWL1 and an emission area EA, a second reflective wall layer RWL2 made of the fifth conductive layer CDL5 (see FIG. 13) on the second planarization layer 134, covering the first reflective wall hole RWH1 (e.g., see FIG. 8) and contacting a portion of the first reflective wall layer RWL1 through the first reflective wall hole RWH1, a second reflective wall hole RWH2 (e.g., see FIG. 8) penetrating the third planarization layer 135 and corresponding to a portion of the second reflective wall layer RWL2 and the emission area EA, and a third reflective wall layer RWL3 made of the sixth conductive layer CDL6 (see FIG. 14) on the third planarization layer 135, covering the second reflective wall hole RWH2 and contacting a portion of the second reflective wall layer RWL2 through the second reflective wall hole RWH2.

The reflective wall structures RWS may surround the emission areas EA to reflect light emitted from the light emitting elements LE toward a light emission surface. Accordingly, the light emission efficiency of the emission areas EA can be improved, and the luminance of the display device 10 can be improved.

The array layer 130 may further include a fourth planarization layer 136 covering the reflective wall structures RWS, each composed of the first reflective wall layer RWL1, the second reflective wall layer RWL2, and the third reflective wall layer RWL3, and the sixth conductive layer CDL6 and VSL.

The emission areas EA may include the first emission area EA_R corresponding to the first color, the second emission area EA_G corresponding to the second color, and the third emission area EA_B corresponding to the third color.

In addition, each of the emission areas EA may include a light emitting element LE emitting light of the third color.

Accordingly, the array layer 130 of the display device 10 according to the present embodiment may further include a plurality of wavelength conversion patterns WCP for changing light of the third color emitted from the light emitting elements LE to a higher wavelength band.

That is, the array layer 130 may further include a plurality of light guide holes LGH respectively corresponding to the emission areas EA, penetrating the fourth planarization layer 136 and respectively being surrounded by the reflective wall structures RWS and a plurality of wavelength conversion patterns WCP respectively disposed in the light guide holes LGH and converting characteristics of light emitted from the light emitting elements LE.

The wavelength conversion patterns WCP may fill the light guide holes LGH, respectively.

The light guide holes LGH and the light emitting elements LE correspond to the emission areas EA, respectively, and the wavelength conversion patterns WCP are disposed in the light guide holes LGH, respectively. Therefore, the wavelength conversion patterns WCP may overlap the light emitting elements LE, respectively.

The wavelength conversion patterns WCP may include the first wavelength conversion pattern WCP_R (see FIG. 4) that corresponds to the first emission area EA_R emitting light of the first color and converts light of the third color emitted from a light emitting element LE into light of the first color, the second wavelength conversion pattern WCP_G (see FIG. 4) that corresponds to the second emission area EA_G emitting light of the second color and converts light of the third color emitted from a light emitting element LE into light of the second color, and the transmission pattern TP (see FIG. 4) that corresponds to the third emission area EA_B emitting light of the third color and transmits light of the third color emitted from a light emitting element LE.

In the first emission area EA_R, a portion of light of the third color emitted from the light emitting element LE may be converted into light of the first color by the first wavelength conversion pattern WCP_R, but the other portion may be transmitted through the first wavelength conversion pattern WCP_R as the light of the third color. In addition, in the second emission area EA_G, a portion of light of the third color emitted from the light emitting element LE may be converted into light of the second color by the second wavelength conversion pattern WCP_G, but the other portion may be transmitted through the second wavelength conversion pattern WCP_G as the light of the third color. Accordingly, the color purity of the first color light emitted in the first emission area EA_R and the color purity of the second color light emitted in the second emission area EA_G may be reduced.

In order to prevent this, the array layer 130 according to one or more embodiments may further include a plurality of color filter patterns CF (CF_R, CF_G, and CF_B in FIG. 4) disposed on the fourth planarization layer 136 and respectively overlapping the wavelength conversion patterns WCP and a black matrix BM disposed on the fourth planarization layer 136 and corresponding to the non-emission area NEA.

The color filter patterns CF may include the first color filter pattern CF_R (see FIG. 4) that corresponds to the first emission area EA_R emitting light of the first color and transmits the light of the first color, the second color filter pattern CF_G (see FIG. 4) that corresponds to the second emission area EA_G emitting light of the second color and transmits the light of the second color, and the third color filter pattern CF_B (see FIG. 4) that corresponds to the third emission area EA_B emitting light of the third color and transmits the light of the third color.

The black matrix BM is designed to reduce light emission in the non-emission area NEA or reflection of external light in the non-emission area NEA. The black matrix BM may be made of a light blocking material or a light absorbing material.

Referring to FIG. 9, the first conductive layer CDL1 on the first surface of the substrate 110 may include the anode AND and the cathode CTD of each of the emission areas EA and the first wiring pattern VDLP1.

The first wiring pattern VDLP1 may be spaced from the anode AND and the cathode CTD, may correspond to the non-emission area NEA, and may extend in the second direction DR2.

In addition, as illustrated in FIG. 8, the display device 10 according to the present embodiment may further include the bank buffer layer 111 disposed on the first surface of the substrate 110 and corresponding to the non-emission area NEA.

The bank buffer layer 111 may cover the first wiring pattern VDLP1 of the non-emission area NEA and a portion of an edge of the anode AND and a portion of an edge of the cathode CTD that correspond to edges of each emission area EA.

For example, for electrical connection between each of the anode AND and the cathode CTD and the light emitting element LE in each emission area EA, the bank buffer layer 111 may include a hole corresponding to each emission area EA and exposing the anode AND and the cathode CTD. As another example, the bank buffer layer 111 may include a hole corresponding to the anode AND of each emission area EA and a hole corresponding to the cathode CTD of each emission area EA.

For example, the bank buffer layer 111 may be made of an inorganic layer such as a silicon nitride layer, a silicon oxynitride layer, a silicon oxide layer, a titanium oxide layer, or an aluminum oxide layer.

The light emitting element LE may be disposed on the anode AND and the cathode CTD and may be electrically connected to each of the anode AND and the cathode CTD.

The light emitting element LE may include the base substrate BSUB, the n-type semiconductor NSEM disposed on the base substrate BSUB, the active layer MQW disposed on a portion of the n-type semiconductor NSEM, the p-type semiconductor PSEM disposed on the active layer MQW, the first contact electrode CTE1 disposed the p-type semiconductor PSEM, and the second contact electrode CTE2 disposed on other portion of the n-type semiconductor NSEM.

The first contact electrode CTE1 of the light emitting element LE may be fixed on the anode AND through the anode contact electrode ANDC, and the second contact electrode CTE2 of the light emitting element LE may be fixed on the cathode CTD through the cathode contact electrode CTDC.

The first planarization layer 120 may be disposed on the bank buffer layer 111 and may flatly cover the light emitting element LE.

The first planarization layer 120 may be made of an organic layer such as acryl resin, epoxy resin, phenolic resin, polyamide resin, or polyimide resin.

The array layer 130 may include a plurality of pixel drivers PD disposed on the first planarization layer 120 in the non-emission area NEA and respectively corresponding to the subpixels RP, GP, and BP.

The pixel drivers PD included in the array layer 130 may be implemented as the semiconductor layer SEL (see FIG. 10) on the first planarization layer 120, the second conductive layer CDL2 (see FIG. 10) on the first gate insulating layer 131, the third conductive layer CDL3 (see FIG. 10) on the second gate insulating layer 132, the fourth conductive layer CDL4 (see FIG. 11) on the interlayer insulating layer 133, the fifth conductive layer CDL5 (see FIG. 13) on the second planarization layer 134, and the sixth conductive layer CDL6 (see FIG. 14) on the third planarization layer 135.

Each of the pixel drivers PD may include at least one transistor T1 through T18 (see FIG. 6).

For example, each pixel driver PD may include the first through eighteenth transistors T1 through T18 (see FIG. 6) and the first through third capacitors PC1 through PC3 (see FIG. 6).

One or more transistors T1 through T18 (see FIG. 6) included in each of the pixel drivers PD may be implemented as the semiconductor layer SEL (see FIG. 10) on the first planarization layer 120 and the second conductive layer CDL2 (see FIG. 10) on the first gate insulating layer 131 and may be connected to signal wirings respectively made of the fourth conductive layer CDL4 (see FIG. 11) on the interlayer insulating layer 133 and the fifth conductive layer CDL5 (see FIG. 13) on the second planarization layer 134.

Referring to FIG. 10, each of the transistors T1, T2, T31, T32, T41, T42, T5 through T9, T101, T102, T111, T112, T12 through T15, T161, T162, T17 and T18 included in each pixel driver PD includes a channel CH1, CH2, CH31, CH32, CH41, CH42, CH5, CH6, CH7, CH8, CH9, CH101, CH102, CH111, CH112, CH12, CH13, CH14, CH15, CH161, CH162, CH17 or CH18, a source electrode S1, S2, S31, S32, S41, S42, S5, S6, S7, S8, S9, S101, S102, S111, S112, S12, S13, S14, S15, S161, S162, S17 or S18 connected to an end of the channel, a drain electrode D1, D2, D31, D32, D41, D42, D5, D6, D7, D8, D9, D101, D102, D111, D112, D12, D13, D14, D15, D161, D162, D17 or D18 connected to the other end of the channel, and a gate electrode G1, G2, G31, G32, G41, G42, G5, G6, G7, G8, G9, G101, G102, G111, G112, G12, G13, G14, G15, G161, G162, G17 or G18 overlapping the channel.

The channels CH1, CH2, CH31, CH32, CH41, CH42, CH5 through CH9, CH101, CH102, CH111, CH112, CH12 through CH15, CH161, CH162, CH17 and CH18, the source electrodes S1, S2, S31, S32, S41, S42, S5 through S9, S101, S102, S111, S112, S12 through S15, S161, S162, S17 and S18, and the drain electrodes D1, D2, D31, D32, D41, D42, D5 through D9, D101, D102, D111, D112, D12 through D15, D161, D162, D17 and D18 may be made of the semiconductor layer SEL (see FIG. 10) on the first planarization layer 120 (see FIG. 8).

The semiconductor layer SEL may be made of any one of polysilicon, amorphous silicon, and an oxide semiconductor.

For example, the semiconductor layer SEL may be made of low temperature polysilicon (LTPS).

In addition, portions of the semiconductor layer SEL excluding the channels CH overlapping the gate electrodes G may be conductive.

In addition, the gate electrodes G1, G2, G31, G32, G41, G42, G5 through G9, G101, G102, G111, G112, G12 through G15, G161, G162, G17 and G18 of the transistors T1, T2, T31, T32, T41, T42, T5 through T9, T101, T102, T111, T112, T12 through T15, T161, T162, T17 and T18 included in each pixel driver PD may be made of the second conductive layer CDL2 (see FIG. 10) on the first gate insulating layer 131 (see FIG. 8).

A first capacitor electrode CE1 corresponding to an end of the first capacitor PC1 (see FIG. 6) may be integrally formed with a first gate electrode G1 of the first transistor T1.

A second capacitor electrode CE2 corresponding to an end of the second capacitor PC2 (see FIG. 6) may be integrally formed with an eighth gate electrode G8 of the eighth transistor T8.

A third capacitor electrode CE3 corresponding to an end of the third capacitor PC3 (see FIG. 6) may be integrally formed with a fifteenth gate electrode G15 of the fifteenth transistor T15.

Accordingly, the first capacitor electrode CE1, the second capacitor electrode CE2, and the third capacitor electrode CE3 along with the gate electrodes G1, G2, G31, G32, G41, G42, G5 through G9, G101, G102, G111, G112, G12 through G15, G161, G162, G17 and G18 of the transistors T1, T2, T31, T32, T41, T42, T5 through T9, T101, T102, T111, T112, T12 through T15, T161, T162, T17 and T18 may be provided as the second conductive layer CDL2.

In addition, the second conductive layer CDL2 may further include a first anode auxiliary electrode ANDA1 and a first cathode auxiliary electrode CTDA1.

In addition, the second conductive layer CDL2 may further include the second wiring pattern VDLP2 overlapping a portion of the first wiring pattern VDLP1.

In addition, a fourth capacitor electrode CE4 overlapping the first capacitor electrode CE1, a fifth capacitor electrode CE5 overlapping the second capacitor electrode CE2, and a sixth capacitor electrode CE6 overlapping the third capacitor electrode CE3 may be made of the third conductive layer CDL3 (see FIG. 10) on the second gate insulating layer 132.

The first capacitor PC1 (see FIG. 6) may be arranged by an overlap area between the first capacitor electrode CE1 and the fourth capacitor electrode CE4.

The second capacitor PC2 (see FIG. 6) may be arranged by an overlap area between the second capacitor electrode CE2 and the fifth capacitor electrode CE5.

The third capacitor PC3 (see FIG. 6) may be arranged by an overlap area between the third capacitor electrode CE3 and the sixth capacitor electrode CE6.

Each of the second conductive layer CDL2 and the third conductive layer CDL3 may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

Each of the first gate insulating layer 131, the second gate insulating layer 132, and the interlayer insulating layer 133 may be made of an inorganic layer such as a silicon nitride layer, a silicon oxynitride layer, a silicon oxide layer, a titanium oxide layer, or an aluminum oxide layer.

As illustrated in FIG. 10, the first transistor T1 may be disposed adjacent to the second transistor T2, the third transistor T3, the fourth transistor T4, the fifth transistor T5, and the sixth transistor T6.

A first channel CH1 of the first transistor T1 overlaps the first gate electrode G1 of the first transistor T1, and both ends of the first channel CH1 are connected to a first source electrode S1 and a first drain electrode D1, respectively.

The first source electrode S1 of the first transistor T1 may be connected to a second drain electrode D2 of the second transistor T2 and a fifth drain electrode D5 of the fifth transistor T5.

The first drain electrode D1 of the first transistor T1 may be connected to a third sub-source electrode S41 of the third sub-transistor T41 of the fourth transistor T4 and a sixth source electrode S6 of the sixth transistor T6.

A second channel CH2 of the second transistor T2 overlaps a second gate electrode G2 of the second transistor T2, and both ends of the second channel CH2 are connected to a second source electrode S2 and the second drain electrode D2, respectively.

The third transistor T3 may be composed of the first sub-transistor T31 and the second sub-transistor T32.

A first sub-channel CH31 of the first sub-transistor T31 overlaps a first sub-gate electrode G31 of the first sub-transistor T31, and both ends of the first sub-channel CH31 are connected to a first sub-source electrode S31 and a first sub-drain electrode D31, respectively.

The first sub-source electrode S31 may be connected to a fourth sub-drain electrode D42 of the fourth sub-transistor T42.

The first sub-drain electrode D31 may be connected to a second sub-source electrode S32 of the second sub-transistor T32.

A second sub-channel CH32 of the second sub-transistor T32 overlaps a second sub-gate electrode G32 of the second sub-transistor T32, and both ends of the second sub-channel CH32 are connected to the second sub-source electrode S32 and a second sub-drain electrode D32, respectively.

The first sub-gate electrode G31 and the second sub-gate electrode G32 may be connected to each other.

The fourth transistor T4 may be composed of the third sub-transistor T41 and the fourth sub-transistor T42.

A third sub-channel CH41 of the third sub-transistor T41 overlaps a third sub-gate electrode G41 of the third sub-transistor T41, and both ends of the third sub-channel CH41 are connected to the third sub-source electrode S41 and a third sub-drain electrode D41, respectively.

The third sub-source electrode S41 may be connected to the first drain electrode D1 of the first transistor T1 and the sixth source electrode S6 of the sixth transistor T6.

The third sub-drain electrode D41 may be connected to a fourth sub-source electrode S42 of the fourth sub-transistor T42.

A fourth sub-channel CH42 of the fourth sub-transistor T42 overlaps a fourth sub-gate electrode G42 of the fourth sub-transistor T42, and both ends of the fourth sub-channel CH42 are connected to the fourth sub-source electrode S42 and the fourth sub-drain electrode D42, respectively.

The third sub-gate electrode G41 and the fourth sub-gate electrode G42 may be connected to each other. In addition, the third sub-gate electrode G41 and the fourth sub-gate electrode G42 may be connected to the second gate electrode G2.

A fifth channel CH5 of the fifth transistor T5 may overlap a fifth gate electrode G5 of the fifth transistor T5, and both ends of the fifth channel CH5 may be connected to a fifth source electrode S5 and the fifth drain electrode D5.

The fifth drain electrode D5 may be connected to the first source electrode S1 of the first transistor T1.

A sixth channel CH6 of the sixth transistor T6 may overlap a sixth gate electrode G6 of the sixth transistor T6, and both ends of the sixth channel CH6 may be connected to the sixth source electrode S6 and a sixth drain electrode D6.

The sixth source electrode S6 may be connected to the first drain electrode D1 of the first transistor T1 and the third sub-source electrode S41 of the third sub-transistor T41.

The fifth gate electrode G5 and the sixth gate electrode G6 may be connected to each other.

A seventh channel CH7 of the seventh transistor T7 may overlap a seventh gate electrode G7 of the seventh transistor T7, and both ends of the seventh channel CH7 may be connected to a seventh source electrode S7 and a seventh drain electrode D7.

The eighth transistor T8 may be disposed adjacent to the ninth transistor T9, the tenth transistor T10, the eleventh transistor T11, and the twelfth transistor T12.

An eighth channel CH8 of the eighth transistor T8 may overlap the eighth gate electrode G8 of the eighth transistor T8, and both ends of the eighth channel CH8 may be connected to an eighth source electrode S8 and an eighth drain electrode D8.

The eighth source electrode S8 may be connected to a ninth source electrode S9 of the ninth transistor T9 and a twelfth source electrode S12 of the twelfth transistor T12.

The eighth drain electrode D8 may be connected to a seventh sub-source electrode S111 of the seventh sub-transistor T111 of the eleventh transistor T11 and a fifteenth source electrode S15 of the fifteenth transistor T15.

A ninth channel CH9 of the ninth transistor T9 may overlap a ninth gate electrode G9 of the ninth transistor T9, and both ends of the ninth channel CH9 may be connected to the ninth source electrode S9 and a ninth drain electrode D9.

The ninth gate electrode G9 may be connected to the second gate electrode G2, the third sub-gate electrode G41, and the fourth sub-gate electrode G42.

The tenth transistor T10 may be composed of the fifth sub-transistor T101 and the sixth sub-transistor T102.

A fifth sub-channel CH101 of the fifth sub-transistor T101 overlaps a fifth sub-gate electrode G101 of the fifth sub-transistor T101, and both ends of the fifth sub-channel CH101 are connected to a fifth sub-source electrode S101 and a fifth sub-drain electrode D101, respectively.

A sixth sub-channel CH102 of the sixth sub-transistor T102 overlaps a sixth sub-gate electrode G102 of the sixth sub-transistor T102, and both ends of the sixth sub-channel CH102 are connected to a sixth sub-source electrode S102 and a sixth sub-drain electrode D102, respectively.

The sixth sub-source electrode S102 may be connected to the fifth sub-drain electrode D101.

The fifth sub-gate electrode G101 and the sixth sub-gate electrode G102 may be connected to each other. In addition, the fifth sub-gate electrode G101 and the sixth sub-gate electrode G102 may be connected to the first sub-gate electrode G31 and the second sub-gate electrode G32.

The eleventh transistor T11 may be composed of the seventh sub-transistor T111 and the eighth sub-transistor T112.

A seventh sub-channel CH111 of the seventh sub-transistor T111 overlaps a seventh sub-gate electrode G111 of the seventh sub-transistor T111, and both ends of the seventh sub-channel CH111 are connected to the seventh sub-source electrode S111 and a seventh sub-drain electrode D111, respectively.

The seventh sub-source electrode S111 may be connected to the eighth drain electrode D8.

An eighth sub-channel CH112 of the eighth sub-transistor T112 overlaps an eighth sub-gate electrode G112 of the eighth sub-transistor T112, and both ends of the eighth sub-channel CH112 are connected to an eighth sub-source electrode S112 and an eighth sub-drain electrode D112, respectively.

The eighth sub-source electrode S112 may be connected to the seventh sub-drain electrode D111.

The eighth sub-drain electrode D112 may be connected to the fifth sub-source electrode S101.

The seventh sub-gate electrode G111 and the eighth sub-gate electrode G112 may be connected to each other. In addition, the seventh sub-gate electrode G111 and the eighth sub-gate electrode G112 may be connected to the second gate electrode G2, the third sub-gate electrode G41, the fourth sub-gate electrode G42, and the ninth gate electrode G9.

A twelfth channel CH12 of the twelfth transistor T12 may overlap a twelfth gate electrode G12 of the twelfth transistor T12, and both ends of the twelfth channel CH12 may be connected to the twelfth source electrode S12 and a twelfth drain electrode D12.

The twelfth source electrode S12 may be connected to a fourteenth source electrode S14 of the fourteenth transistor T14.

The twelfth drain electrode D12 may be connected to the eighth source electrode S8 and the ninth source electrode S9.

A thirteenth channel CH13 of the thirteenth transistor T13 may overlap a thirteenth gate electrode G13 of the thirteenth transistor T13, and both ends of the thirteenth channel CH13 may be connected to a thirteenth source electrode S13 and a thirteenth drain electrode D13.

The thirteenth source electrode S13 may be connected to the fifth source electrode S5.

The thirteenth gate electrode G13 may be connected to the seventh gate electrode G7.

A fourteenth channel CH14 of the fourteenth transistor T14 may overlap a fourteenth gate electrode G14 of the fourteenth transistor T14, and both ends of the fourteenth channel CH14 may be connected to the fourteenth source electrode S14 and a fourteenth drain electrode D14.

The fourteenth source electrode S14 may be connected to the twelfth source electrode S12.

The fourteenth gate electrode G14 may be connected to the twelfth gate electrode G12.

The fifteenth transistor T15 may be disposed between the eighth transistor T8 and the seventeenth transistor T17, and the sixteenth transistor T16 may be disposed adjacent to the sixth transistor T6 and the seventh transistor T7. In addition, the seventeenth transistor T17 and the eighteenth transistor T18 may be disposed adjacent to the anode AND.

A fifteenth channel CH15 of the fifteenth transistor T15 may overlap the fifteenth gate electrode G15 of the fifteenth transistor T15, and both ends of the fifteenth channel CH15 may be connected to the fifteenth source electrode S15 and a fifteenth drain electrode D15.

The fifteenth source electrode S15 may overlap an end of an auxiliary connection electrode ACE.

The auxiliary connection electrode ACE may be shaped like an island extending in the second direction DR2 and may be made of the third conductive layer CDL3 on the second gate insulating layer 132. An end of the auxiliary connection electrode ACE may overlap the fifteenth source electrode S15, and the other end of the auxiliary connection electrode ACE may be disposed adjacent to the eighth drain electrode D8.

The fifteenth drain electrode D15 may be connected to the seventeenth source electrode S17.

The sixteenth transistor T16 may be composed of the ninth sub-transistor T161 and the tenth sub-transistor T162.

A ninth sub-channel CH161 of the ninth sub-transistor T161 overlaps a ninth sub-gate electrode G161 of the ninth sub-transistor T161, and both ends of the ninth sub-channel CH161 are connected to a ninth sub-source electrode S161 and a ninth sub-drain electrode D161, respectively.

The ninth sub-source electrode S161 may be connected to the sixth drain electrode D6.

A tenth sub-channel CH162 of the tenth sub-transistor T162 overlaps a tenth sub-gate electrode G162 of the tenth sub-transistor T162, and both ends of the tenth sub-channel CH162 are connected to a tenth sub-source electrode S162 and a tenth sub-drain electrode D162, respectively.

The tenth sub-source electrode S162 may be connected to the ninth sub-drain electrode D161.

The ninth sub-gate electrode G161 and the tenth sub-gate electrode G162 may be connected to each other. In addition, the ninth sub-gate electrode G161 and the tenth sub-gate electrode G162 may be connected to the seventh gate electrode G7 and the thirteenth gate electrode G13.

A seventeenth channel CH17 of the seventeenth transistor T17 may overlap a seventeenth gate electrode G17 of the seventeenth transistor T17, and both ends of the seventeenth channel CH17 may be connected to the seventeenth source electrode S17 and the seventeenth drain electrode D17.

The seventeenth source electrode S17 may be connected to the fifteenth drain electrode D15.

An eighteenth channel CH18 of the eighteenth transistor T18 may overlap an eighteenth gate electrode G18 of the eighteenth transistor T18, and both ends of the eighteenth channel CH18 may be connected to an eighteenth source electrode S18 and the eighteenth drain electrode D18.

The eighteenth drain electrode D18 may be disposed adjacent to the anode AND.

The eighteenth gate electrode G18 may be connected to the seventh gate electrode G7, the thirteenth gate electrode G13, the ninth sub-gate electrode G161, and the tenth sub-gate electrode G162.

The second gate electrode G2, the third sub-gate electrode G41, the fourth sub-gate electrode G42, the ninth gate electrode G9, the seventh sub-gate electrode G111, and the eighth sub-gate electrode G112 to which the scan write signal of the scan write wiring GWLk (see FIG. 6) is transmitted may be made of different portions of a first gate connection electrode GCE1, respectively, and thus may be connected to each other.

The first sub-gate electrode G31, the second sub-gate electrode G32, the fifth sub-gate electrode G101, and the sixth sub-gate electrode G102 to which the scan initialization signal of the scan initialization wiring GILk (see FIG. 6) is transmitted may be made of different portions of a second gate connection electrode GCE2, respectively, and thus may be connected to each other.

The seventh gate electrode G7, the thirteenth gate electrode G13, the ninth sub-gate electrode G161, the tenth sub-gate electrode G162, and the eighteenth gate electrode G18 to which the scan control signal of the scan control wiring GCLk (see FIG. 6) is transmitted may be made of different portions of a third gate connection electrode GCE3, respectively, and thus may be connected to each other.

The fifth gate electrode G5, the sixth gate electrode G6, the twelfth gate electrode G12, and the fourteenth gate electrode G14 to which the PWM emission signal of the PWM emission wiring PWELk (see FIG. 6) is transmitted may be made of different portions, respectively, and thus may be connected to each other.

Referring to FIGS. 11 and 12, the fourth conductive layer CDL4 on the interlayer insulating layer 133 (see FIG. 8) may include the gate wirings GIL, GWL, PWEL, SWPL, PAEL, and GCL, initialization voltage wirings VIL, a gate voltage wiring VGHL, a first power wiring PWM_VDL, and the third wiring pattern VDLP3 extending in the first direction DR1.

In addition, the fourth conductive layer CDL4 on the interlayer insulating layer 133 (see FIG. 8) may further include a second anode auxiliary electrode ANDA2, a second cathode auxiliary electrode CTDA2, and the first reflective wall layer RWL1.

The second anode auxiliary electrode ANDA2 may be connected to the first anode auxiliary electrode ANDA1 (see FIG. 10) through a second anode contact hole ANDH2. The second anode auxiliary electrode ANDA2 may be connected to the seventeenth drain electrode D17 (see FIG. 10) through third anode contact holes ANDH3 and may be connected to the eighteenth drain electrode D18 (see FIG. 10) through a fourth anode contact hole ANDH4.

Accordingly, the anode AND may be connected to the seventeenth drain electrode D17 and the eighteenth drain electrode D18 through the first anode auxiliary electrode ANDA1 and the second anode auxiliary electrode ANDA2.

The second cathode auxiliary electrode CTDA2 and the first reflective wall layer RWL1 may be integrally formed.

The second cathode auxiliary electrode CTDA2 may be connected to the first cathode auxiliary electrode CTDA1 through a second cathode contact hole CTDH2. In addition, the second cathode auxiliary electrode CTDA2 may correspond to a third cathode contact hole CTDH3 penetrating the second planarization layer 134.

The second cathode auxiliary electrode CTDA2 may be connected to a third cathode auxiliary electrode CTDA3 (see FIG. 13) through the third cathode contact hole CTDH3.

In addition, the fourth conductive layer CDL4 on the interlayer insulating layer 133 (see FIG. 8) may further include first through seventh connection electrodes CCE1 through CCE7 and first and second data connection electrodes DCE1 and DCE2.

The gate wirings GIL, GWL, PWEL, SWPL, PAEL, and GCL may include a scan initialization wiring GIL, a scan write wiring GWL, a sweep signal wiring SWPL, a scan control wiring GCL, a PWM emission wiring PWEL, and a PAM emission wiring PAEL.

The scan write wiring GWL may be connected to both ends of the first gate connection electrode GCE1 (see FIG. 10) through a first scan write wiring contact hole GWCH1 and a second scan write wiring contact hole GWCH2. The first gate connection electrode GCE1 may include the second gate electrode G2, the third sub-gate electrode G41, the fourth sub-gate electrode G42, the ninth gate electrode G9, the seventh sub-gate electrode G111, and the eighth sub-gate electrode G112.

The scan initialization wiring GIL may be connected to the second gate connection electrode GCE2 (see FIG. 10) through a scan initialization wiring contact hole GICH. The second gate connection electrode GCE2 may include the first sub-gate electrode G31, the second sub-gate electrode G32, the fifth sub-gate electrode G101, and the sixth sub-gate electrode G102.

The scan control wiring GCL may be connected to the third gate connection electrode GCE3 (see FIG. 10) through a scan control wiring contact hole GCCH. The third gate connection electrode GCE3 may include the seventh gate electrode G7, the thirteenth gate electrode G13, the ninth sub-gate electrode G161, the tenth sub-gate electrode G162, and the eighteenth gate electrode G18.

The PWM emission wiring PWEL may be connected to a fourth gate connection electrode GCE4 (see FIG. 10) through a PWM emission wiring contact hole PWCH. The fourth gate connection electrode GCE4 may include the fifth gate electrode G5, the sixth gate electrode G6, the twelfth gate electrode G12, and the fourteenth gate electrode G14.

Each of the pixel drivers PD may be connected to two initialization voltage wirings VIL.

Any one of the initialization voltage wirings VIL may be connected to the second sub-source electrode S32 (see FIG. 10) of the second sub-transistor T32 of the third transistor T3 and the sixth sub-source electrode S102 (see FIG. 10) of the sixth sub-transistor T102 of the tenth transistor T10 through a first initialization voltage wiring contact hole VICH1.

The other initialization voltage wiring VIL may be connected to the tenth sub-source electrode S162 (see FIG. 10) of the tenth sub-transistor T162 of the sixteenth transistor T16 through a second initialization voltage wiring contact hole VICH2.

In addition, the other initialization voltage wiring VIL may be connected to the sixth capacitor electrode CE6 (see FIG. 10) through a third initialization voltage wiring contact hole VICH3.

The first power wiring PWM_VDL may be connected to the fifth source electrode S5 (see FIG. 10) of the fifth transistor T5 and the thirteenth source electrode S13 (see FIG. 10) of the thirteenth transistor T13 through a first power wiring contact hole WVDH.

A portion of the first power wiring PWM_VDL may correspond to a first power wiring auxiliary contact hole WVDAH penetrating the second planarization layer 134.

The first power wiring PWM_VDL may be connected to a power auxiliary pattern VDAP made of the fifth conductive layer CDL5 (see FIG. 13) on the second planarization layer 134 through the first power wiring auxiliary contact hole WVDAH.

The sweep signal wiring SWPL may be connected to an extension portion CE4_EX (see FIG. 10) of the fourth capacitor electrode CE4 through a first sweep signal wiring contact hole SWCH1.

The sweep signal wiring SWPL may be connected to the seventh drain electrode D7 (see FIG. 10) of the seventh transistor T7 through a second sweep signal wiring contact hole SWCH2.

The gate voltage wiring VGHL may be connected to the seventh source electrode S7 (see FIG. 10) of the seventh transistor T7 through a gate voltage wiring contact hole GHCH.

The PAM emission wiring PAEL may be connected to the seventeenth gate electrode G17 (see FIG. 10) of the seventeenth transistor T17 through a PAM emission wiring contact hole PACH.

The third wiring pattern VDLP3 may extend in the first direction DR1 and may be connected to the second wiring pattern VDLP2 through the second power contact holes VDCH2.

A portion of the third wiring pattern VDLP3 may correspond to the third power contact holes VDCH3 penetrating the second planarization layer 134.

The third wiring pattern VDLP3 may be connected to the fourth wiring pattern VDLP4 made of the fifth conductive layer CDL5 (see FIG. 13) on the second planarization layer 134 through the third power contact holes VDCH3.

The third wiring pattern VDLP3 may be connected to the twelfth source electrode S12 (see FIG. 10) of the twelfth transistor T12 and the fourteenth source electrode S14 (see FIG. 10) of the fourteenth transistor T14 through second power wiring contact holes VDCCH.

Accordingly, the twelfth source electrode S12 of the twelfth transistor T12 and the fourteenth source electrode S14 of the fourteenth transistor T14 may be connected to the second power wiring PAM_VDL corresponding to the third wiring pattern VDLP3.

The first connection electrode CCE1 may be connected to the seventeenth source electrode S17 (see FIG. 10) of the seventeenth transistor T17 through a plurality of first connection auxiliary contact holes CCH1.

The second connection electrode CCE2 may be connected to the first gate electrode G1 (see FIG. 10) of the first transistor T1 through a second connection auxiliary contact hole CCH2 and may be connected to the first sub-source electrode S31 (see FIG. 10) of the first sub-transistor T31 of the third transistor T3 and the fourth sub-drain electrode D42 (see FIG. 10) of the fourth sub-transistor T42 of the fourth transistor T4 through a third connection auxiliary contact hole CCH3.

Accordingly, the first gate electrode G1 may be connected to the first sub-source electrode S31 and the fourth sub-drain electrode D42 through the second connection electrode CCE2.

The third connection electrode CCE3 may be connected to the fifth sub-source electrode S101 (see FIG. 10) of the fifth sub-transistor T101 of the tenth transistor T10 and the eighth sub-drain electrode D112 (see FIG. 10) of the eighth sub-transistor T112 of the eleventh transistor T11 through a fourth connection auxiliary contact hole CCH4. In addition, the third connection electrode CCE3 may be connected to the eighth gate electrode G8 (see FIG. 10) of the eighth transistor T8 through a fifth connection auxiliary contact hole CCH5.

Accordingly, the eighth gate electrode G8 may be connected to the fifth sub-source electrode S101 and the eighth sub-drain electrode D112 through the third connection electrode CCE3.

The fourth connection electrode CCE4 may be connected to the fourth capacitor electrode CE4 (see FIG. 10) through a sixth connection auxiliary contact hole CCH6, may be connected to the fourteenth drain electrode D14 (see FIG. 10) of the fourteenth transistor T14 through a seventh connection auxiliary contact hole CCH7, and may be connected to the thirteenth drain electrode D13 (see FIG. 10) of the thirteenth transistor T13 through an eighth connection auxiliary contact hole CCH8.

Accordingly, the fourth capacitor electrode CE4 of the second capacitor PC2 may be connected to the thirteenth drain electrode D13 and the fourteenth drain electrode D14 through the fourth connection electrode CCE4. That is, the fourth connection electrode CCE4 may correspond to the second node N2 (see FIG. 6).

The fifth connection electrode CCE5 may be connected to the third capacitor electrode CE3 (see FIG. 10) and the fifteenth gate electrode G15 (see FIG. 10) of the fifteenth transistor T15 through a ninth connection auxiliary contact hole CCH9. In addition, the fifth connection electrode CCE5 may be connected to the sixth drain electrode D6 (see FIG. 10) of the sixth transistor T6 and the ninth sub-source electrode S161 (see FIG. 10) of the ninth sub-transistor T161 of the sixteenth transistor T16 through a tenth connection auxiliary contact hole CCH10.

Accordingly, the fifteenth gate electrode G15 may be integrally formed with the third capacitor electrode CE3 and may be connected to the sixth drain electrode D6 and the ninth sub-source electrode S161 through the fifth connection electrode CCE5. That is, the fifth connection electrode CCE5 may correspond to the third node N3 (see FIG. 6).

Each of the sixth connection electrodes CCE6 may be connected to the eighth drain electrode D8 (see FIG. 10) of the eighth transistor T8 through an eleventh connection auxiliary contact hole CCH11 and may be connected to the auxiliary connection electrode ACE (see FIG. 10) through a twelfth connection auxiliary contact hole CCH12.

The sixth connection electrodes CCE6 may be provided as a pair arranged in parallel in the second direction DR2.

The seventh connection electrode CCE7 may be connected to the fifteenth source electrode S15 (see FIG. 10) of the fifteenth transistor T15 through a thirteenth connection auxiliary contact hole CCH13 and may be connected to the auxiliary connection electrode ACE (see FIG. 10) through a fourteenth connection auxiliary contact hole CCH14.

Accordingly, the eighth drain electrode D8 may be connected to the fifteenth source electrode S15 through the sixth connection electrode CCE6, the auxiliary connection electrode ACE, and the seventh connection electrode CCE7.

The first data connection electrode DCE1 may be connected to the second source electrode S2 of the second transistor T2 through a first data connection contact hole DLCH1.

The first data connection electrode DCE1 may correspond to a second data connection contact hole DLCH2 penetrating the second planarization layer 134.

The first data connection electrode DCE1 may be connected to a PWM data wiring PWM_DL (see FIG. 13) made of the fifth conductive layer CDL5 (see FIG. 13) on the second planarization layer 134 through the second data connection contact hole DLCH2.

Accordingly, the second source electrode S2 of the second transistor T2 may be connected to the PWM data wiring PWM_DL through the first data connection electrode DCE1.

The second data connection electrode DCE2 may be connected to the ninth source electrode S9 (see FIG. 10) of the ninth transistor T9 through a third data connection contact hole DLCH3.

The second data connection electrode DCE2 may correspond to a fourth data connection contact hole DLCH4 penetrating the second planarization layer 134.

The second data connection electrode DCE2 may be connected to a PAM data wiring PAM_DL (see FIG. 13) made of the fifth conductive layer CDL5 (see FIG. 13) on the second planarization layer 134 through the fourth data connection contact hole DLCH4.

Accordingly, the ninth source electrode S9 of the ninth transistor T9 may be connected to the PAM data wiring PAM_DL through the second data connection electrode DCE2.

Referring to FIG. 13, the fifth conductive layer CDL5 on the second planarization layer 134 may include the PWM data wiring PWM_DL, the PAM data wiring PAM_DL, and the fourth wiring pattern VDLP4 extending in the second direction DR2.

The fifth conductive layer CDL5 on the second planarization layer 134 may further include the power auxiliary pattern VDAP disposed between the PWM data wiring PWM_DL and the PAM data wiring PAM_DL.

In addition, the fifth conductive layer CDL5 on the second planarization layer 134 may further include the third cathode auxiliary electrode CTDA3 and the second reflective wall layer RWL2.

The third cathode auxiliary electrode CTDA3 and the second reflective wall layer RWL2 may be integrally formed.

The third cathode auxiliary electrode CTDA3 may be connected to the second cathode auxiliary electrode CTDA2 (see FIG. 11) through the third cathode contact hole CTDH3 of FIG. 11.

A portion of the third cathode auxiliary electrode CTDA3 may correspond to a fourth cathode contact hole CTDH4 penetrating the third planarization layer 135.

The third cathode auxiliary electrode CTDA3 may be connected to the third power wiring VSL (see FIG. 14) made of the sixth conductive layer CDL6 (see FIG. 14) on the third planarization layer 135 through the fourth cathode contact hole CTDH4.

The second reflective wall layer RWL2 contacts a portion of the first reflective wall layer RWL1 through the first reflective wall hole RWH1 penetrating the second planarization layer 134.

The PWM data wiring PWM_DL may be connected to the first data connection electrode DCE1 (see FIG. 11) through the second data connection contact hole DLCH2 (see FIG. 11).

The PAM data wiring PAM_DL may be connected to the second data connection electrode DCE2 (see FIG. 11) through the fourth data connection contact hole DLCH4 (see FIG. 11).

The power auxiliary pattern VDAP may be connected to the first power wiring PWM_VDL (see FIG. 11) through the first power wiring auxiliary contact hole WVDAH (see FIG. 11). The resistance of the first power wiring PWM_VDL (see FIG. 11) may be reduced by the power auxiliary pattern VDAP.

Referring to FIG. 14, the sixth conductive layer CDL6 on the third planarization layer 135 may include the third power wiring VSL and the third reflective wall layer RWL3 integrally formed with the third power wiring VSL.

The third power wiring VSL may be connected to the third cathode auxiliary electrode CTDA3 through the fourth cathode contact hole CTDH4 penetrating the third planarization layer 135.

Accordingly, the cathode CTD may be connected to the third power wiring VSL through the first, second, and third cathode auxiliary electrodes CTDA1, CTDA2 and CTDA3.

In addition, the third reflective wall layer RWL3 contacts a portion of the second reflective wall layer RWL2 through the second reflective wall hole RWH2 penetrating the third planarization layer 135.

Accordingly, the first and second reflective wall layers RWL1 and RWL2 may be connected to the third power wiring VSL integrally formed with the third reflective wall layer RWL3.

The sixth conductive layer CDL6 is covered with the fourth planarization layer 136.

A wavelength conversion pattern WCP may be disposed in a light guide hole LGH corresponding to an emission area EA and penetrating the fourth planarization layer 136 and may be surrounded by a reflective wall structure RWS composed of the first, second and third reflective wall layers RWL1, RWL2 and RWL3 (e.g., see FIG. 8).

As described above, the display device 10 according to the present embodiment includes a plurality of light emitting elements LE disposed on the substrate 110 and the array layer 130 disposed on the first planarization layer 120 covering the light emitting elements LE.

Therefore, because the light emitting elements LE are disposed under the array layer 130, misalignment of the light emitting elements LE due to a step difference of the array layer 130 can be prevented.

In addition, because a lighting test can be performed on the light emitting elements LE before the array layer 130 is placed, deterioration of display quality and yield reduction due to defects in the light emitting elements LE can be reduced.

Next, a method of fabricating the display device 10 according to one or more embodiments will be described with reference to FIGS. 15 through 32.

Figure 15:
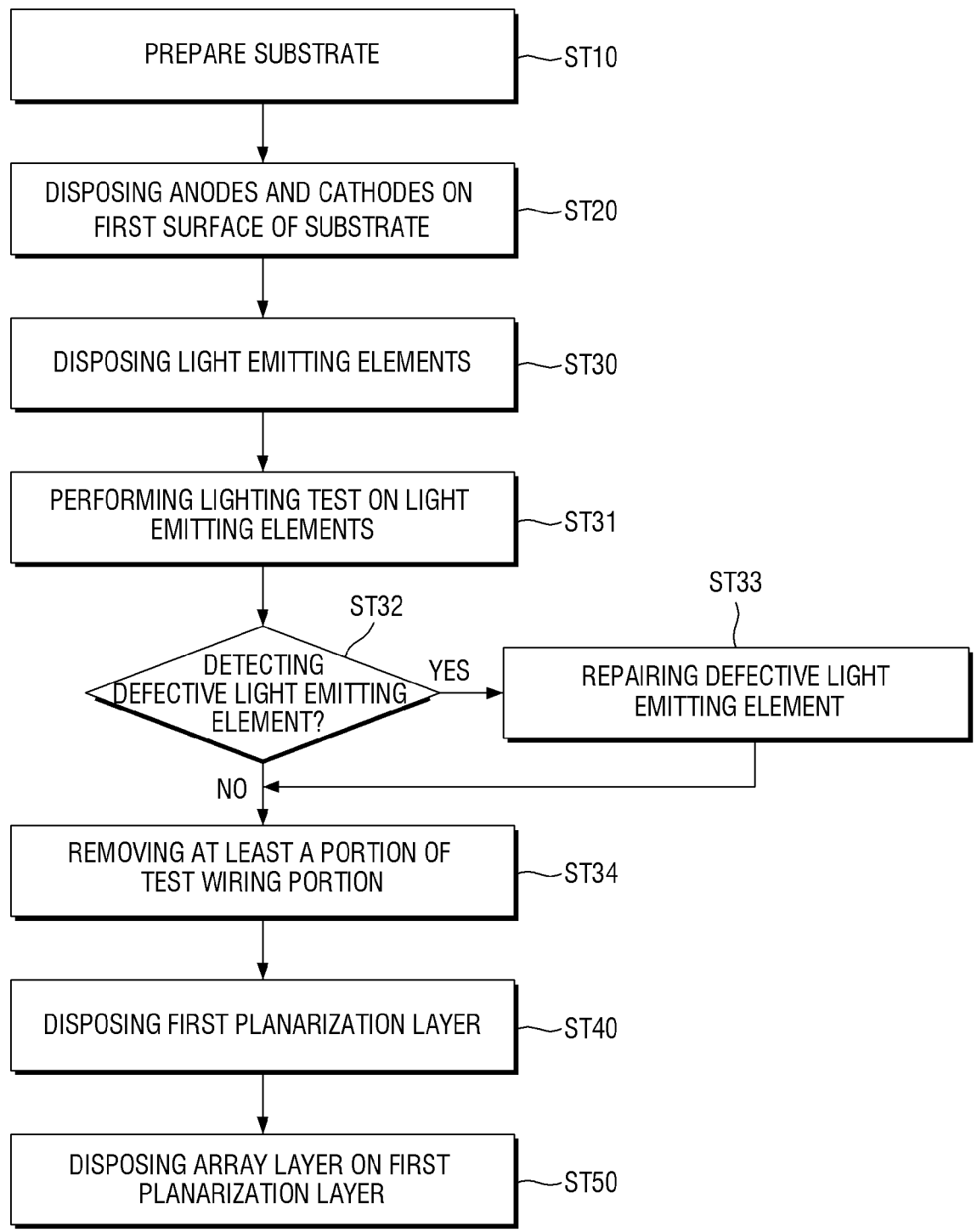
FIG. 15 is a flowchart illustrating a method of fabricating a display device according to one or more embodiments.
Figure 16:
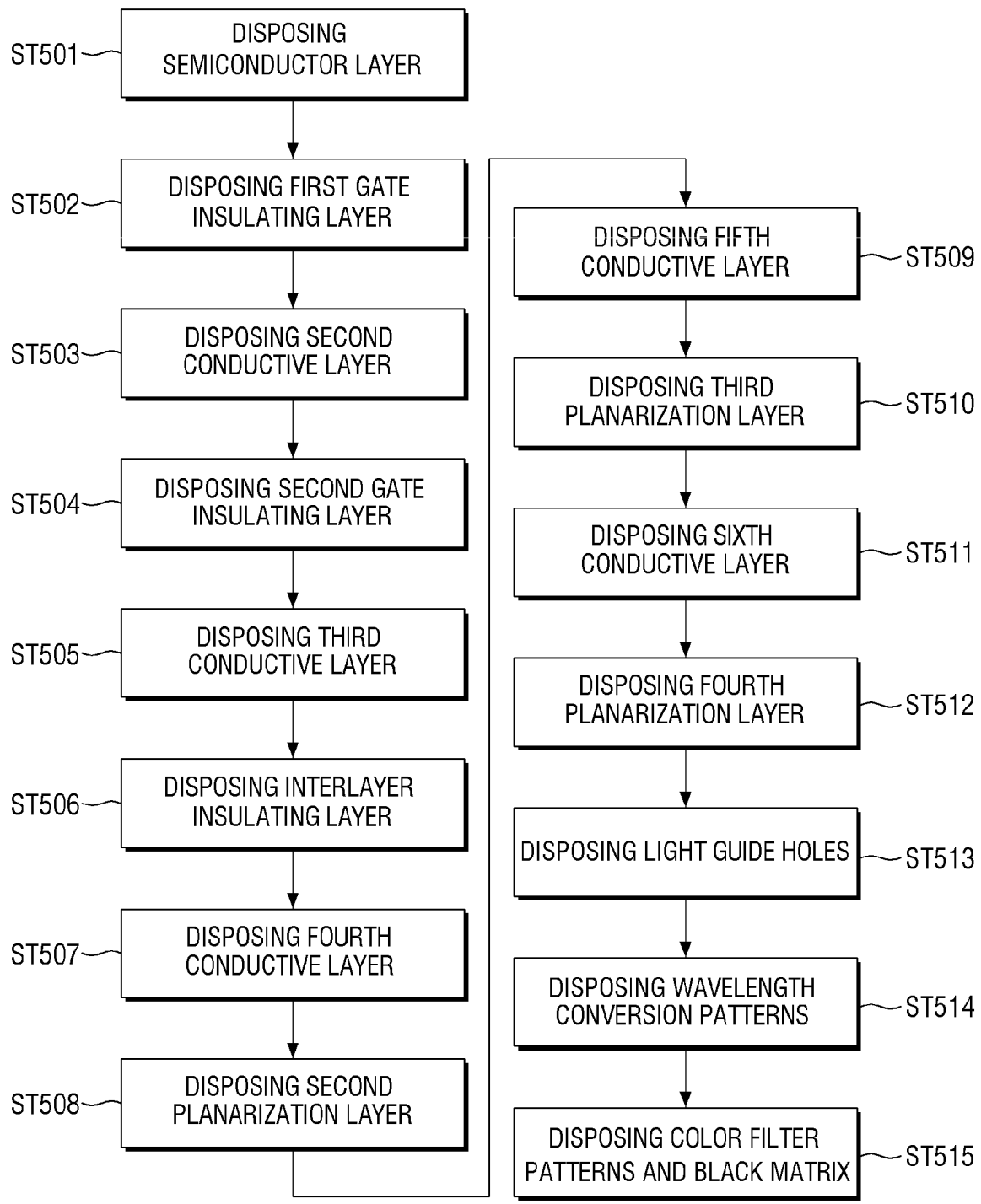
FIG. 16 is a flowchart illustrating an operation of placing an array layer in FIG. 15.

FIG. 15 is a flowchart illustrating a method of fabricating a display device 10 according to one or more embodiments. FIG. 16 is a flowchart illustrating an operation of placing an array layer 130 in FIG. 15. FIGS. 17 through 33 are process diagrams illustrating each operation of FIGS. 15 and 16.

Referring to FIG. 15, the method of fabricating the display device 10 according to one or more embodiments include preparing a substrate 110 that includes a plurality of emission areas EA respectively corresponding to a plurality of subpixels RP, GP, and BP for displaying an image (operation ST10), placing a plurality of anodes AND and a plurality of cathodes CTD, which are made of a first conductive layer CDL1 on a first surface of the substrate 110 and respectively correspond to the subpixels RP, GP, and BP, in the emission areas EA, respectively (operation ST20), placing a plurality of light emitting elements LE, which correspond to the subpixels RP, GP, and BP, on the anodes AND and the cathodes CTD, respectively (operation ST30), placing a first planarization layer 120 that covers the light emitting elements LE (operation ST40), and placing the array layer 130 on the first planarization layer 120 (operation ST50).

In the placing of the array layer 130 (operation ST50), the array layer 130 includes a plurality of pixel drivers PD respectively corresponding to the subpixels RP, GP, and BP, disposed in a non-emission area NEA which is an area between the emission areas EA, and each including at least one transistor T1 through T18. The pixel drivers PD are connected to the anodes AND, respectively.

In addition, the method of fabricating the display device 10 according to the present embodiment may further include, before the placing of the first planarization layer 120 (operation ST40), performing a lighting test on the light emitting elements LE (operation ST31) and, when a defective light emitting element LE is detected by the lighting test (operation ST32), repairing the defective light emitting element LE (operation ST33), and removing at least a portion of the test wiring portion for the lighting test (operation ST34).

According to one or more embodiments, in the placing of the anodes AND and the cathodes CTD (operation ST20), a test wiring portion for the lighting test (operation ST31) may be further provided. That is, the test wiring portion for the lighting test (operation ST31) may be made of the first conductive layer CDL1 on the first surface of the substrate 110, together with the anodes AND and the cathodes CTD.

The test wiring portion for the lighting test (operation ST31) may include a first test pad TSTP1 (see FIG. 17) and a second test pad TSTP2 (see FIG. 17) corresponding to portions of an edge of the first surface of the substrate 110 spaced from the emission areas EA, a first test wiring TSTL1 (see FIG. 17) connected between the first test pad TSTP1 and the anodes AND, and a second test wiring TSTL2 (see FIG. 17) connected between the second test pad TSTP2 and the cathodes CTD.

For example, the first test wiring TSTL1 may include two or more first test sub-wirings TSTL11 (see FIG. 17) connected to anodes AND neighboring each other in a suitable direction (e.g., a predetermined direction, i.e., any one of the first direction DR1 and the second direction DR2) and a first test main wiring TSTL12 (see FIG. 17) connected between the first test pad TSTP1 and the two or more first test sub-wirings TSTL11.

The second test wiring TSTL2 may include two or more second test sub-wirings TSTL21 (see FIG. 17) connected to cathodes CTD neighboring each other in a suitable direction (e.g., a predetermined direction, i.e., any one of the first direction DR1 and the second direction DR2) and a second test main wiring TSTL22 (see FIG. 17) connected between the second test pad TSTP2 and the two or more second test sub-wirings TSTL21.

The method of fabricating the display device 10 according to the present embodiment may further include removing at least a portion of the test wiring portion (operation ST34) after the performing of the lighting test (operation ST31) and before the placing of the first planarization layer 120 (operation ST40).

For example, in the removing of at least a portion of the test wiring portion (operation ST34), the first test pad TSTP1, the second test pad TSTP2, and the first test wiring TSTL1, which correspond to the anodes AND, in the test wiring portion may be removed.

As another example, in the removing of at least a portion of the test wiring portion, the entire test wiring portion, that is, all of the first test pad TSTP1, the second test pad TSTP2, the first test wiring TSTL1, and the second test wiring TSTL2 corresponding to the cathodes CTD may be removed.

Referring to FIG. 16, the placing of the array layer 130 (operation ST50) may include placing a semiconductor layer SEL on the first planarization layer 120 (operation ST501), placing a first gate insulating layer 131 covering the semiconductor layer SEL (operation ST502), placing a second conductive layer CDL2 on the first gate insulating layer 131 (operation ST503), placing a second gate insulating layer 132 covering the second conductive layer CDL2 (operation ST504), placing a third conductive layer CDL3 on the second gate insulating layer 132 (operation ST505), placing an interlayer insulating layer 133 covering the third conductive layer CDL3 (operation ST506), placing a fourth conductive layer CDL4 on the interlayer insulating layer 133 (operation ST507), placing a second planarization layer 134 covering the fourth conductive layer CDL4 (operation ST508), placing a fifth conductive layer CDL5 on the second planarization layer 134 (operation ST509), placing a third planarization layer 135 covering the fifth conductive layer CDL5 (operation ST510), and placing a sixth conductive layer CDL6 on the third planarization layer 135 (operation ST511).

In the placing of the fourth conductive layer CDL4 (operation ST507), the fourth conductive layer CDL4 may include a first reflective wall layer RWL1 shaped to correspond to edges of each of the emission areas EA.

Before the placing of the fifth conductive layer CDL5 (operation ST509), the second planarization layer 134 may be patterned to form a first reflective wall hole RWH1 corresponding to each of the emission areas EA and exposing a portion of the first reflective wall layer RWL1.

In the placing of the fifth conductive layer CDL5 (operation ST509), the fifth conductive layer CDL5 may include a second reflective wall layer RWL2. The second reflective wall layer RWL2 covers the first reflective wall hole RWH1 and contacts a portion of the first reflective wall layer RWL1 through the first reflective wall hole RWH1.

Before the placing of the sixth conductive layer CDL6 (operation ST511), the third planarization layer 135 may be patterned to form a second reflective wall hole RWH2 corresponding to each of the emission areas EA and exposing a portion of the second reflective wall layer RWL2.

In the placing of the sixth conductive layer CDL6 (operation ST511), the sixth conductive layer CDL6 may include a third reflective wall layer RWL3 covering the second reflective wall hole RWH2 and contacting a portion of the second reflective wall layer RWL2 through the second reflective wall hole RWH2.

Therefore, in the placing of the array layer 130 (operation ST50), a plurality of reflective wall structures RWS shaped to correspond to the edges of the emission areas EA, respectively, and each including the first reflective layer RWL1, the second reflective wall layer RWL2 and the third reflective wall layer RWL3 may be provided.

In addition, the placing of the array layer 130 (operation ST50) may further include, after the placing of the sixth conductive layer CDL6 (operation ST511), placing a fourth planarization layer 136 covering the reflective wall structures RWS, each including the first reflective wall layer RWL1, the second reflective wall layer RWL2, and the third reflective wall layer RWL3, and the sixth conductive layer CDL6 (operation ST512), placing a plurality of light guide holes LGH respectively corresponding to the emission areas EA and respectively surrounded by the reflective wall structures RWS by patterning the fourth planarization layer 136 (operation ST513), and placing a plurality of wavelength conversion patterns WCP in the light guide holes LGH, respectively (operation ST514).

The wavelength conversion patterns WCP overlap the light emitting elements LE, respectively.

In addition, the placing of the array layer 130 (operation ST50) may further include, after the placing of the wavelength conversion patterns WCP (operation ST514), placing a plurality of color filter patterns CF respectively overlapping the wavelength conversion patterns WCP and a black matrix BM corresponding to the non-emission area NEA on the fourth planarization layer 136 (operation ST515).

The emission areas EA may include a first emission area EA_R corresponding to a first color having a suitable wavelength band (e.g., a predetermined wavelength band), a second emission area EA_G corresponding to a second color having a suitable wavelength band (e.g., a predetermined wavelength band) lower than that of the first color, and a third emission area EA_B corresponding to a third color having a suitable wavelength band (e.g., a predetermined wavelength band) lower than that of the second color.

In addition, the light emitting elements LE corresponding to the emission areas EA may emit light of the third color.

In this case, the wavelength conversion patterns WCP may include a first wavelength conversion pattern WCP_R corresponding to the first emission area EA_R and converting light of the third color emitted from a light emitting element LE into light of the first color, a second wavelength conversion pattern WCP_G corresponding to the second emission area EA_G and converting light of the third color emitted from a light emitting element LE into light of the second color, and a transmission pattern TP corresponding to the third emission area EA_B and transmitting light of the third color emitted from a light emitting element LE.

In addition, the color filter patterns CF may include a first color filter pattern CF_R corresponding to the first emission area EA_R and transmitting light of the first color, a second color filter pattern CF_G corresponding to the second emission area EA_G and transmitting light of the second color, and a third color filter pattern CF_B corresponding to the third emission area EA_B and transmitting light of the third color.

In the preparing of the substrate 110 (operation ST10), the substrate 110 may include the emission areas EA respectively corresponding to the subpixels RP, GP, and BP and the non-emission area NEA which is an area between the emission areas EA.

The substrate 110 may be a rigid substrate made of a glass material.

Alternatively, the substrate 110 may be a flexible substrate made of a plastic material that can be bent, folded, or rolled. In this case, the substrate 110 may include an insulating material, e.g., polymer resin such as polyimide (PI).

Figure 17:
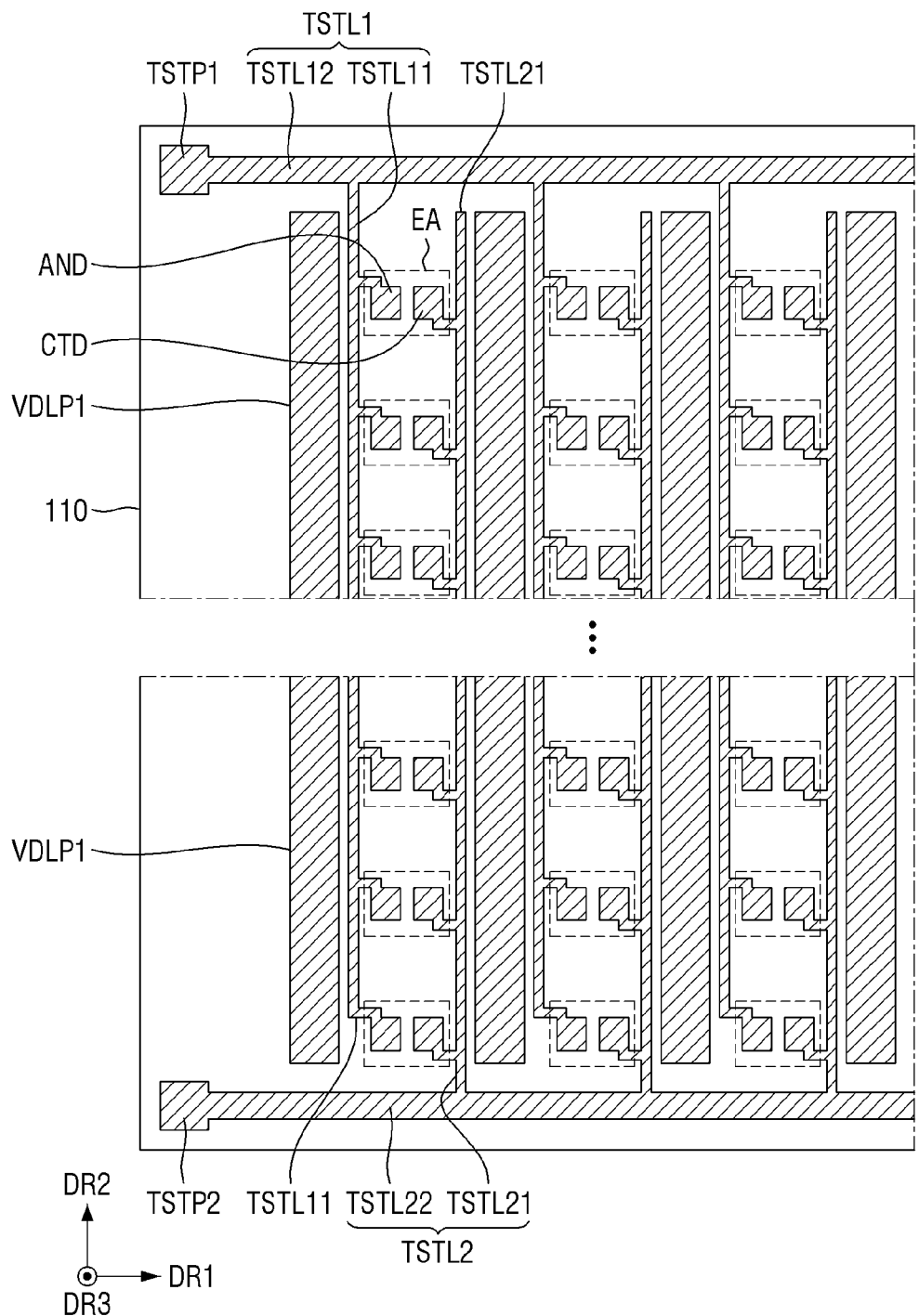
FIGS. 17 through 33 are process diagrams illustrating each operation of FIGS. 15 and 16.
Figure 18:
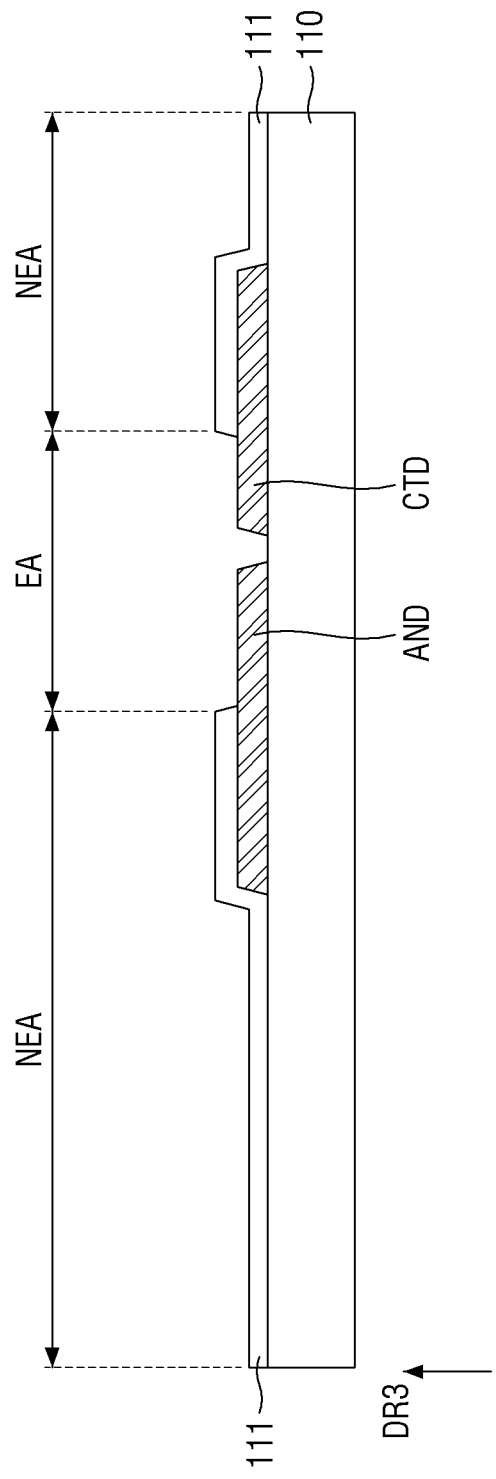

Referring to FIGS. 17 and 18, the anodes AND and the cathodes CTD made of the first conductive layer CDL1 on the first surface of the substrate 110 may be respectively placed in the emission areas EA by patterning the first conductive layer CDL1 on the first surface of the substrate 110 (operation ST20).

In addition, as illustrated in FIG. 17, in the placing of the anodes AND and the cathodes CTD (operation ST20), first wiring patterns VDLP1 made of the first conductive layer CDL1 on the first surface of the substrate 110, placed in the non-emission area NEA, and extending in the second direction DR2 may be further provided.

In addition, in the placing of the anodes AND and the cathodes CTD (operation ST20), a test wiring portion for a lighting test may be further provided.

The test wiring portion is made of the first conductive layer CDL1 on the first surface of the substrate 110 and is connected to the anodes AND and the cathodes CTD.

For example, the test wiring portion may include the first test pad TSTP1 and the second test pad TSTP2 adjacent to an edge of the substrate 110 and spaced from each other, the first test wiring TSTL1 connecting the first test pad TSTP1 and the anodes AND, and the second test wiring TSTL2 connecting the second test pad TSTP2 and the cathodes CTD.

The first test pad TSTP1 and the second test pad TSTP2 may be provided for connection to an external device that supplies a test signal for the lighting test.

The first test wiring TSTL1 may include two or more first test sub-wirings TSTL11 connected to anodes AND neighboring each other in a suitable direction (e.g., a predetermined direction, e.g., the second direction DR2) from among the anodes AND and the first test main wiring TSTL12 connecting the first test pad TSTP1 and the two or more first test sub-wirings TSTL11.

The two or more first test sub-wirings TSTL11 may extend in the second direction DR2 and may be spaced apart from each other in the first direction DR1.

The first test main wiring TSTL12 may extend in the first direction DR1 and may be connected to an end of each of the two or more first test sub-wirings TSTL11. The first test pad TSTP1 may be formed of an end of the first test main wiring TSTL12.

The second test wiring TSTL2 may include two or more second test sub-wirings TSTL21 connected to cathodes CTD neighboring each other in a suitable direction (e.g., a predetermined direction, e.g., the second direction DR2) from among the cathodes CTD and the second test main wiring TSTL22 connecting the second test pad TSTP2 and the two or more second test sub-wirings TSTL21.

The two or more second test sub-wirings TSTL21 may extend in the second direction DR2 and may be spaced from each other in the first direction DR1.

The second test main wiring TSTL22 may extend in the first direction DR1 and may be connected to an end of each of the two or more second test sub-wirings TSTL21. The second test pad TSTP2 may be formed of an end of the second test main wiring TSTL22.

As illustrated in FIG. 18, after the placing of the anodes AND and the cathodes CTD made of the first conductive layer CDL1 (operation ST20), a bank buffer layer 111 placed on the first surface of the substrate 110 and covering the first conductive layer CDL1 may be provided.

Next, the bank buffer layer 111 may be patterned to form a plurality of holes corresponding to the emission areas EA, respectively. Accordingly, the anodes AND and the cathodes CTD may be exposed by the bank buffer layer 111.

Figure 19:
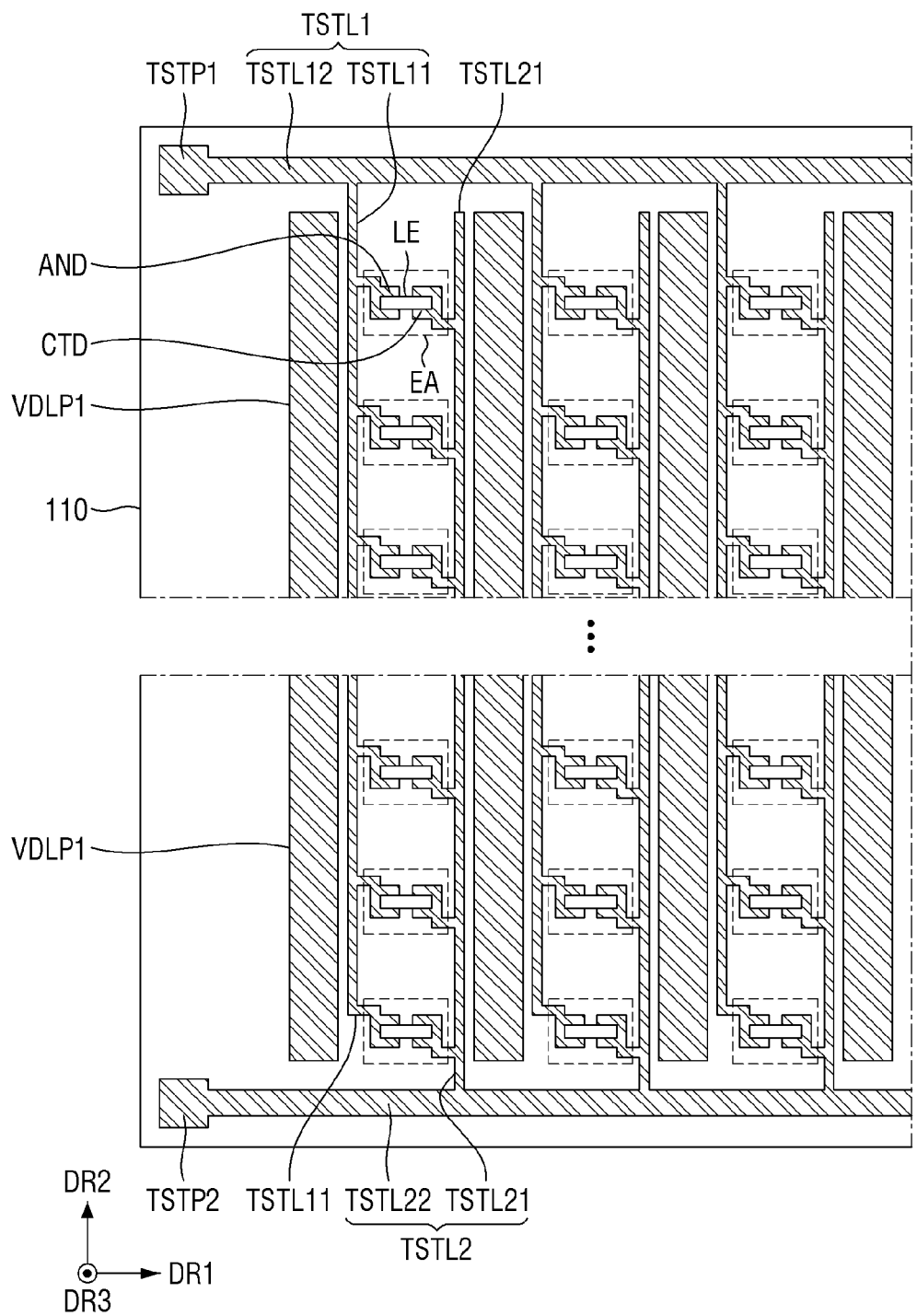
Figure 20:
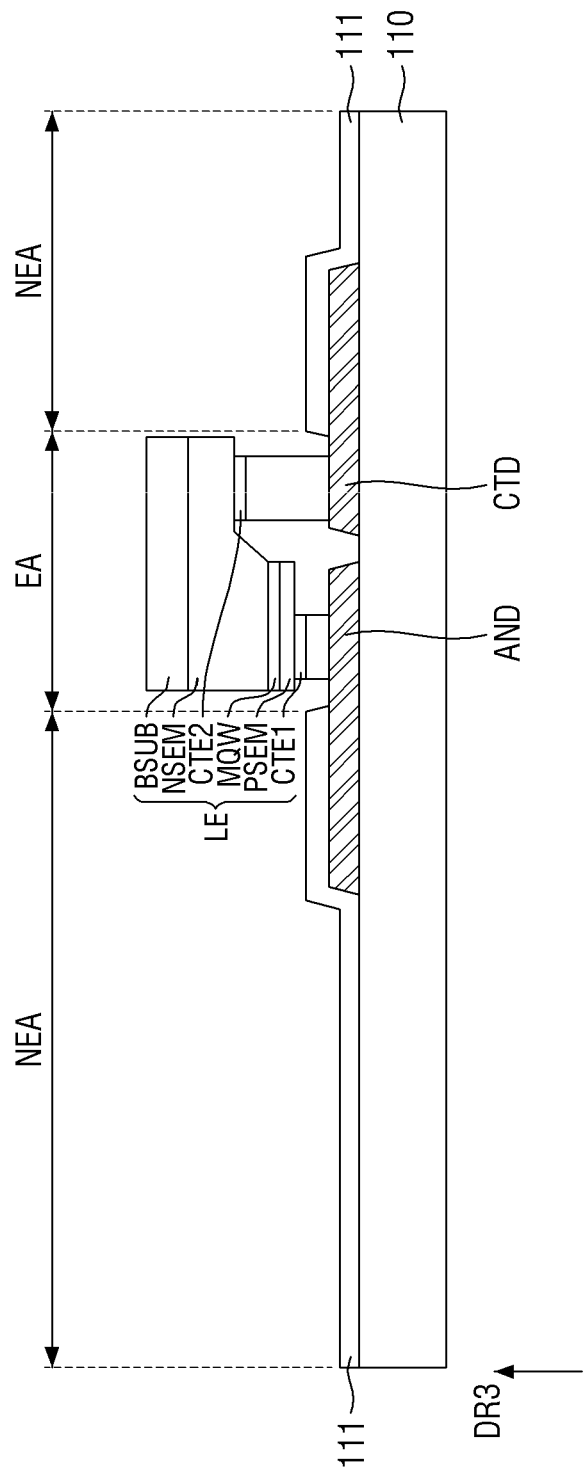

Referring to FIGS. 19 and 20, after the anodes AND and the cathodes CTD are placed, a plurality of light emitting elements LE respectively corresponding to the emission areas EA may be placed on the anodes AND and the cathodes CTD (operation ST30).

The light emitting elements LE may be flip chip-type micro-light emitting diodes. That is, each of the light emitting elements LE may include an n-type semiconductor NSEM, an active layer MQW, and a p-type semiconductor PSEM sequentially stacked on a base substrate BSUB, a first contact electrode CTE1 placed on the p-type semiconductor PSEM and facing an anode AND, and a second contact electrode CTE2 placed on the n-type semiconductor NSEM and facing a cathode CTD.

The first contact electrode CTE1 may be connected to the anode AND through an anode contact electrode ANDC.

The second contact electrode CTE2 may be connected to the cathode CTD through a cathode contact electrode CTDC.

All of the light emitting elements LE respectively placed in the emission areas EA may be elements that emit light of the third color.

As described above, because the light emitting elements LE are placed before the placing of the array layer 130 (operation ST50), each of the light emitting elements LE may be supported by the anode AND and the cathode CTD on the substrate 110. Therefore, misalignment of the light emitting elements LE due to a step difference of the array layer 130 can be prevented in advance.

Figure 21:
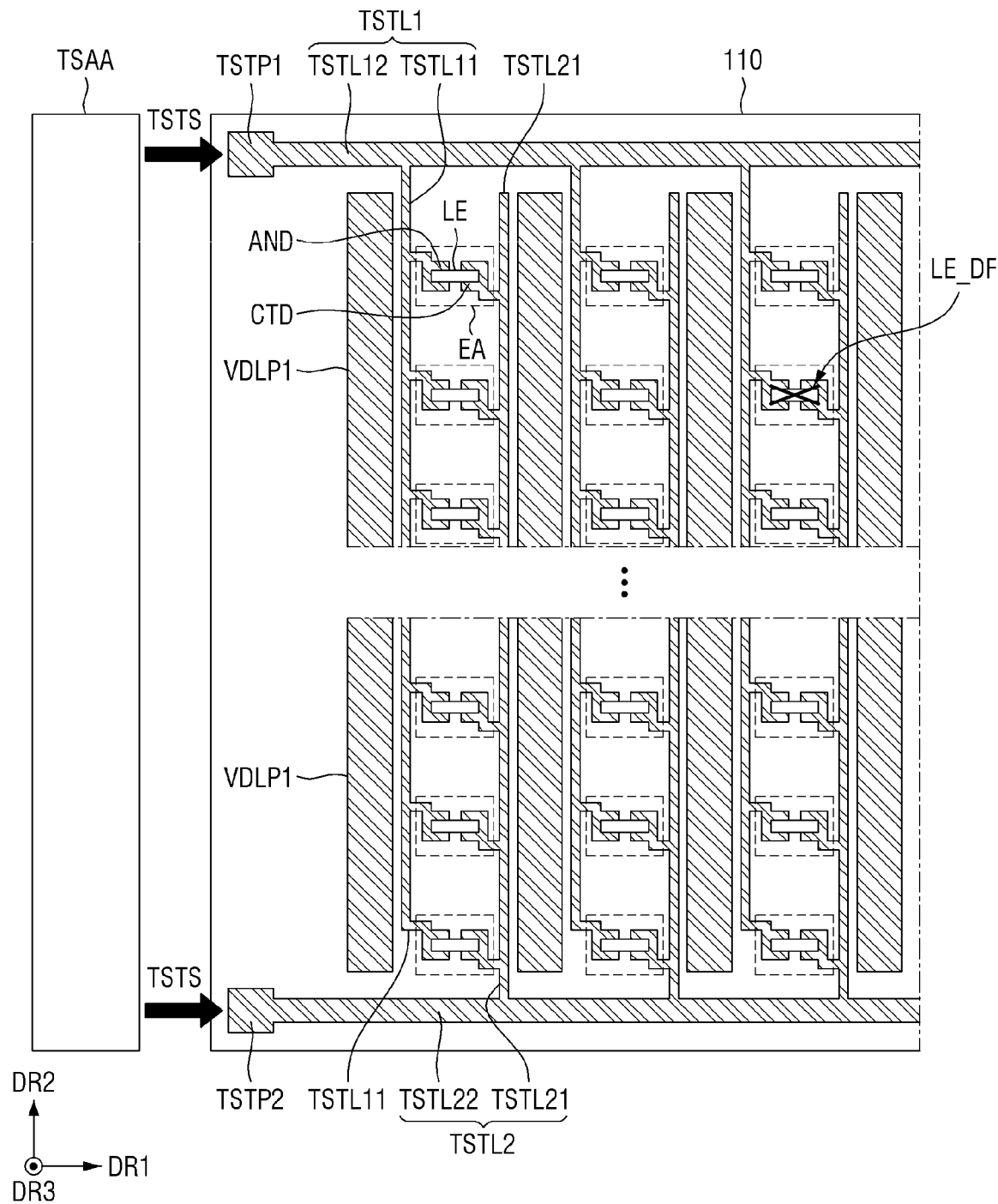

Referring to FIG. 21, a lighting test may be performed on the light emitting elements LE placed on the substrate 110 (operation ST31).

That is, in the lighting test (operation ST31), all of the light emitting elements LE may be driven by supplying a test signal TSTS to the light emitting elements LE through the test wiring portion TSTL1 and TSTL2 using a lighting test device TSAA connected to the first test pad TSTP1 and the second test pad TSTP2. Accordingly, it may be checked whether the lighting of the light emitting elements LE is normal.

In the lighting test (operation ST31), one or more light emitting elements that do not emit light of normal luminance, that is, a defective light emitting element LE_DF that is not driven normally may be detected among the light emitting elements LE to which the test signal TSTS is supplied (operation ST32).

Figure 22:
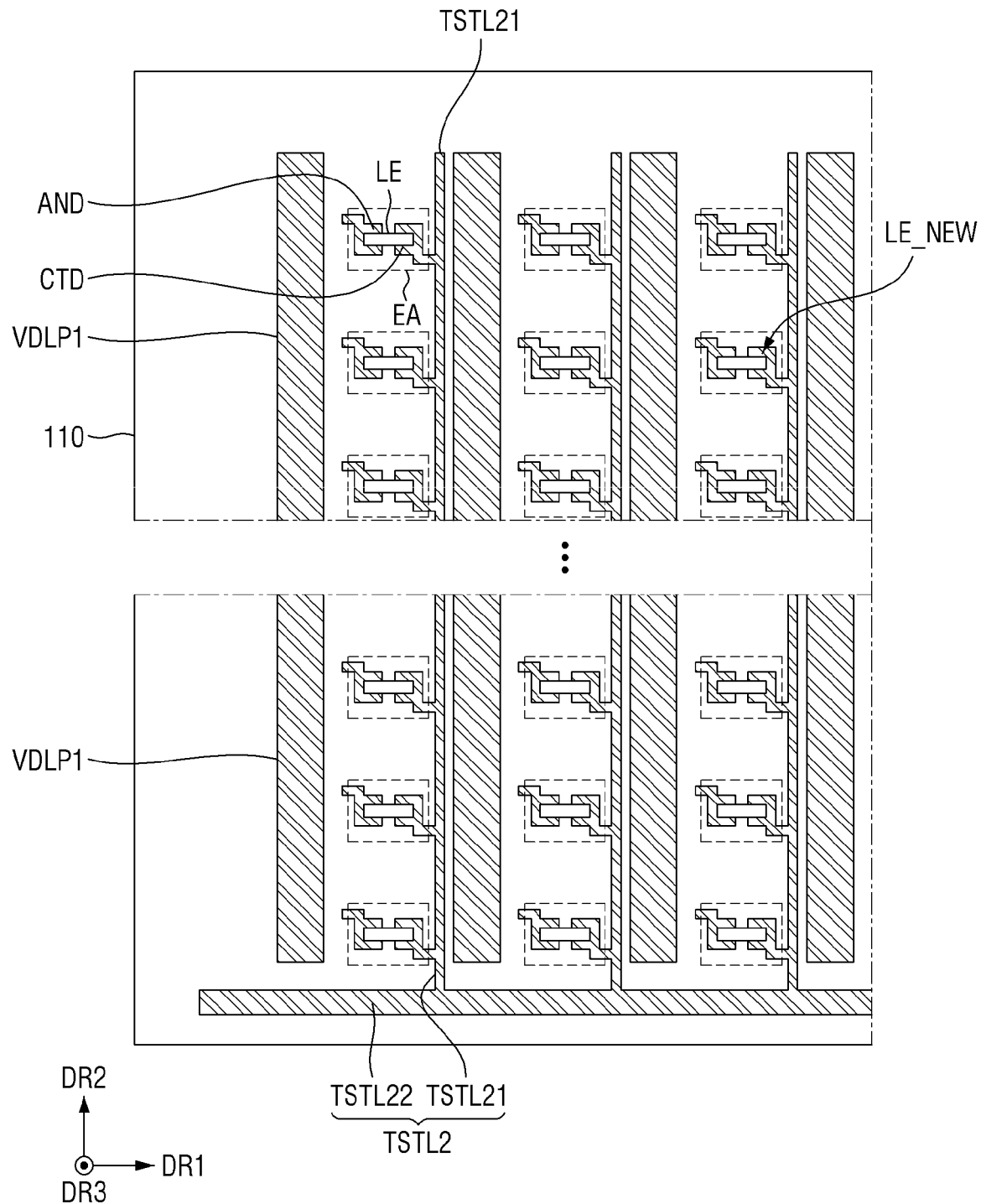

In this case, referring to FIG. 22, the defective light emitting element LE_DF may be repaired through a process of placing a new light emitting element LE_NEW at a position from which the defective light emitting element LE_DF has been removed (operation ST33).

Then, the lighting test (operation ST31) may be repeated until a preset number or more of light emitting elements LE from among the light emitting elements LE of all the emission areas EA are confirmed as being normal.

Alternatively, in order to simplify and speed up the fabrication process, the repairing of the defective light emitting element LE_DF (operation ST33) may be performed only a preset number of times.

When the defective light emitting element LE_DF is not detected in the lighting test (operation ST32), at least a portion of the test wiring portion for the lighting test (operation ST31) may be removed before the placing of the first planarization layer 120 (operation ST40).

In this case, the first test pad TSTP1, the second test pad TSTP2, and the first test wiring TSTL1 of the test wiring portion for the lighting test (operation ST31) may be removed (operation ST34). That is, all of the cathodes CTD are connected to a third power wiring VSL. Therefore, even if the second test wiring TSTL2 is maintained, the display device 10 may have no problem in displaying an image. Further, due to the second test wiring TSTL2, the resistance of the cathodes CTD may be reduced, and a uniform voltage may be supplied to the cathodes CTD.

Alternatively, the entire test wiring portion for the lighting test (operation ST31) may be removed.

Because the lighting test (operation ST31) is performed on the light emitting elements LE and the defective light emitting element LE_DF is repaired (operations ST32 and ST33) before the placing of the array layer 130 (operation ST50) as described above, a defect rate of the light emitting elements LE may be eliminated from factors that reduce the yield of the display device 10.

Figure 23:
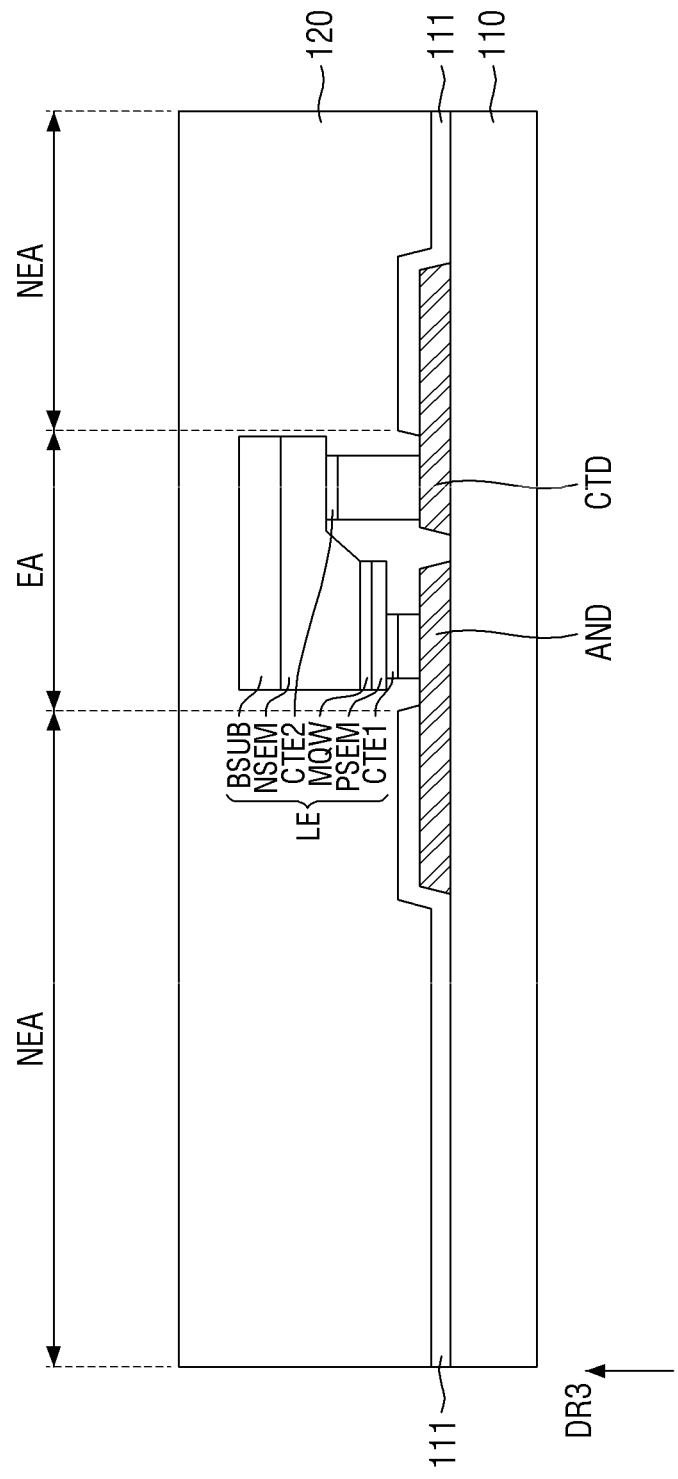

Referring to FIG. 23, the first planarization layer 120 flatly covering the light emitting elements LE may be placed by applying an organic insulating material onto the entire first surface of the substrate 110 after the light emitting elements LE are placed (operation ST40).

For example, the first planarization layer 120 may be made of any one of acryl resin, epoxy resin, phenolic resin, polyamide resin, and polyimide resin.

Figure 24:
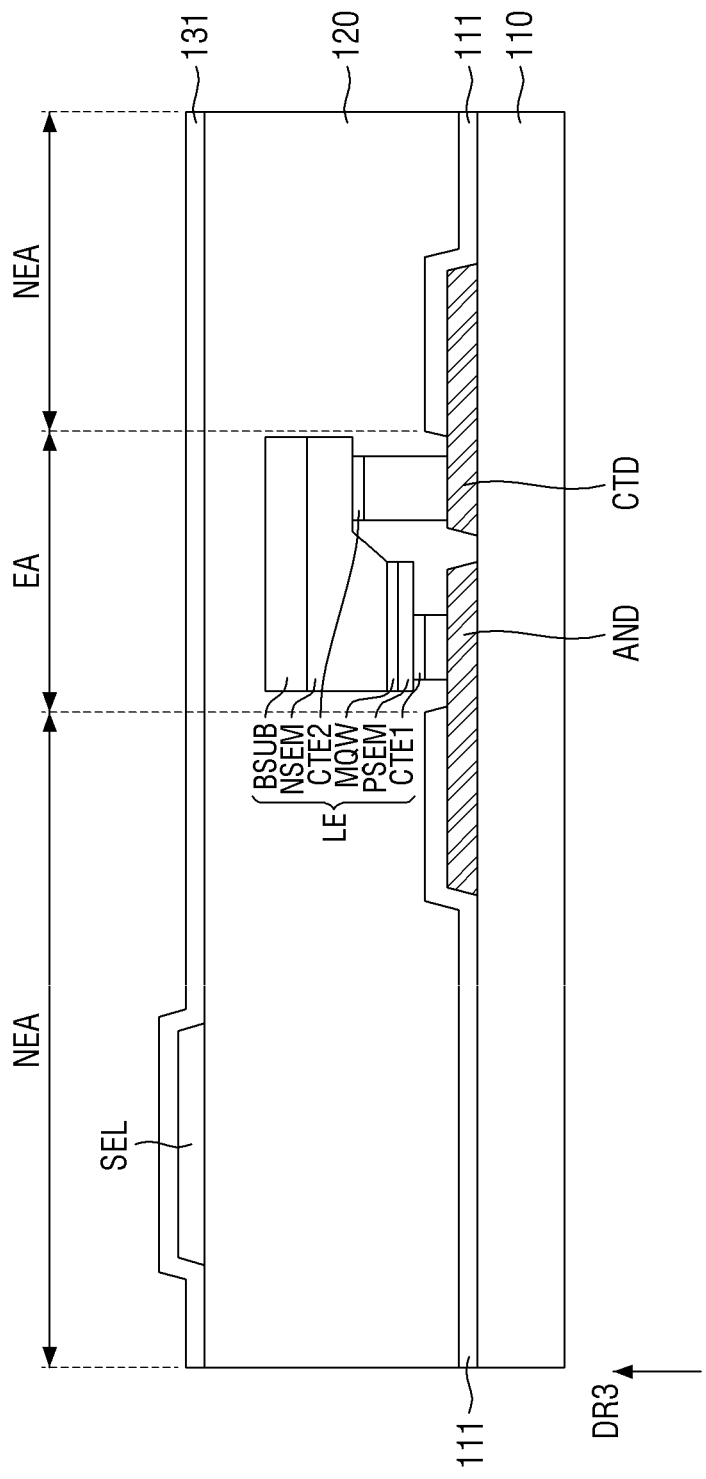

Next, referring to FIG. 24, the semiconductor layer SEL may be placed by patterning a semiconductor material layer on the first planarization layer 120 (operation ST501). Then, the first gate insulating layer 131 covering the semiconductor layer SEL may be placed by applying an inorganic insulating material to the entire surface of the first planarization layer 120 (operation ST502).

In the placing of the semiconductor layer SEL (operation ST501), the semiconductor layer SEL may be made of any one of polysilicon, amorphous silicon, and an oxide semiconductor.

As illustrated in FIG. 10, the semiconductor layer SEL may include a channel CH, a source electrode S and a drain electrode D of at least one transistor T1 through T18 included in each of the pixel drivers PD of the subpixels RP, GP, and BP.

In the placing of the first gate insulating layer 131 (operation ST502), the first gate insulating layer 131 may be made of at least one of a silicon nitride layer, a silicon oxynitride layer, a silicon oxide layer, a titanium oxide layer, and an aluminum oxide layer.

After the placing of the first gate insulating layer 131 (operation ST502), the first gate insulating layer 131 and the first planarization layer 120 may be patterned to form first power contact holes VDCH1, a first anode contact hole ANDH1, and a first cathode contact hole CTDH1.

One or more first power contact holes VDCH1 may correspond to a portion of each of the first power patterns VDLP1.

The first anode contact hole ANDH1 corresponds to a portion of each of the anodes AND.

The first cathode contact hole CTDH1 corresponds to a portion of each of the cathodes CTD.

Figure 25:
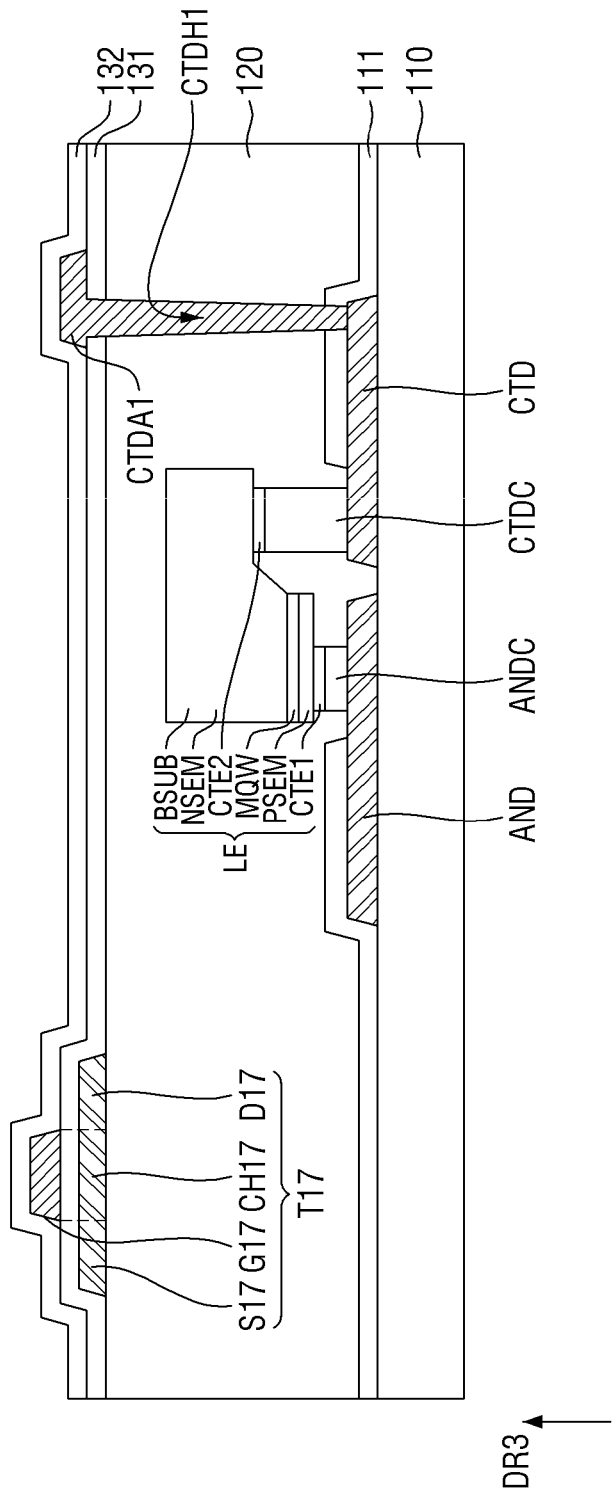

Referring to FIG. 25, the second conductive layer CDL2 may be placed by patterning a conductive material layer on the first gate insulating layer 131 (operation ST503). Then, the second gate insulating layer 132 covering the second conductive layer CDL2 may be placed by applying an inorganic insulating material onto the entire surface of the first gate insulating layer 131 (operation ST504).

In the placing of the second conductive layer CDL2 (operation ST503), the second conductive layer CDL2 may be formed as a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

As illustrated in FIG. 10, the second conductive layer CDL2 may include a gate electrode G of at least one transistor T1 through T18 included in each of the pixel drivers PD of the subpixels RP, GP, and BP, first through third capacitor electrodes CE1 through CE3, a second wiring pattern VDLP2, a first anode auxiliary electrode ANDA1, and a first cathode auxiliary electrode CTDA1.

In the placing of the second conductive layer CDL2 (operation ST503), a portion of the semiconductor layer SEL that overlaps the gate electrode G of each of the transistors T1 through T18 may be the channel CH of each of the transistors T1 through T18, and both sides of the channel CH of each of the transistors T1 through T18 may be the source electrode S and the drain electrode D, respectively. In the semiconductor layer SEL, the source electrode S and the drain electrode D of each of the transistors T1 through T18 may be conductive regions.

The first capacitor electrode CE1 may be formed integrally with a first gate electrode G1.

The second capacitor electrode CE2 may be formed integrally with an eighth gate electrode G8.

The third capacitor electrode CE3 may be formed integrally with a fifteenth gate electrode G15.

The second wiring pattern VDLP2 may overlap a portion of the first wiring pattern VDLP1 and may be connected to the first wiring pattern VDLP1 through the first wiring contact holes VDCH1.

The first anode auxiliary electrode ANDA1 may be connected to each of the anodes AND through the first anode contact hole ANDH1.

The first cathode auxiliary electrode CTDA1 may be connected to each of the cathodes CTD through the first cathode contact hole CTDH1.

In the placing of the second gate insulating layer 132 (operation ST504), the second gate insulating layer 132 may be made of at least one of a silicon nitride layer, a silicon oxynitride layer, a silicon oxide layer, a titanium oxide layer, and an aluminum oxide layer.

Figure 26:
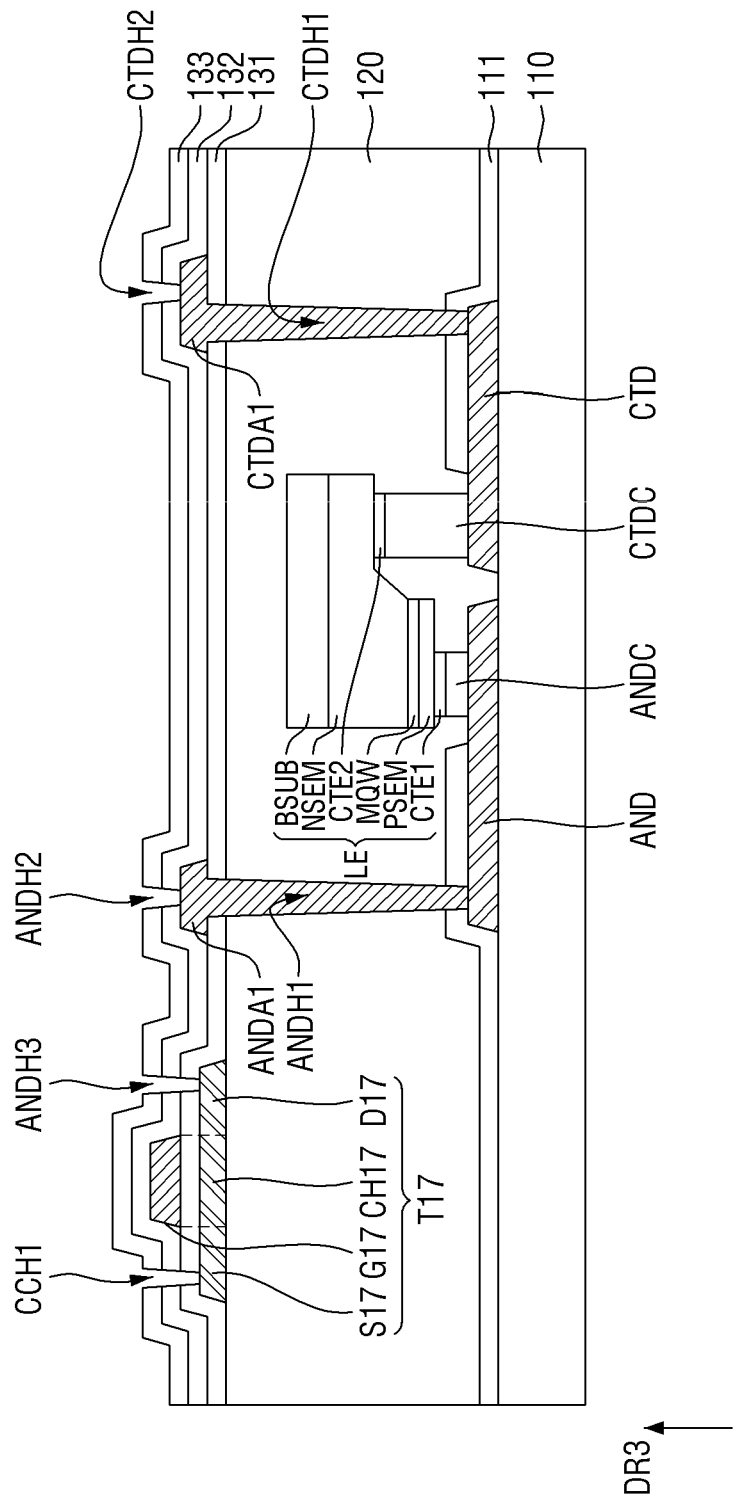

Referring to FIG. 26, the third conductive layer CDL3 may be placed by patterning a conductive material layer on the second gate insulating layer 132 (operation ST505). In addition, the interlayer insulating layer 133 covering the third conductive layer CDL3 may be placed by applying an inorganic insulating material onto the entire surface of the second gate insulating layer 132 (operation ST506).

As illustrated in FIG. 10, the third conductive layer CDL3 may include a fourth capacitor electrode CE4 overlapping the first capacitor electrode CE1, a fifth capacitor electrode CE5 overlapping the second capacitor electrode CE2, and a sixth capacitor electrode CE6 overlapping the third capacitor electrode CE3. In addition, the third conductive layer CDL3 may further include an auxiliary connection electrode ACE extending in a vertical direction between a fifteenth source electrode S15 and a seventeenth source electrode S17.

In the placing of the third conductive layer CDL3 (operation ST505), the third conductive layer CDL3 may be formed as a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

In the placing of the interlayer insulating layer 133 (operation ST506), the interlayer insulating layer 133 may be made of at least one of a silicon nitride layer, a silicon oxynitride layer, a silicon oxide layer, a titanium oxide layer, and an aluminum oxide layer.

After the placing of the interlayer insulating layer 133 (operation ST506), at least the interlayer insulating layer 133 from among the interlayer insulating layer 133, the second gate insulating layer 132, and the first gate insulating layer 131 may be patterned to form contact holes corresponding to any one of the semiconductor layer SEL, the second conductive layer CDL2, and the third conductive layer CDL3.

As illustrated in FIG. 11, each of the contact holes may correspond to any one of the semiconductor layer SEL, the second conductive layer CDL2, and the third conductive layer CDL3, and may include second through fourth anode contact holes ANDH2 through ANDH4, a second cathode contact hole CTDH2, second power contact holes VDCH2, first and second scan write wiring contact holes GWCH1 and GWCH2, a scan initialization wiring contact hole GICH, a scan control wiring contact hole GCCH, a PWM emission wiring contact hole PWCH, first through third initialization voltage wiring contact holes VICH1 through VICH3, a first power wiring contact hole WVDH, first and second sweep signal wiring contact holes SWCH1 and SWCH2, a gate voltage wiring contact hole GHCH, a PAM emission wiring contact hole PACH, second power wiring contact holes VDCCH, first through fourteenth connection auxiliary contact holes CCH1 through CCH14, and first and third data connection contact holes DLCH1 and DLCH3.

The second anode contact hole ANDH2 corresponds to a portion of the first anode auxiliary electrode ANDA1 and penetrates the interlayer insulating layer 133 and the second gate insulating layer 132.

One or more third anode contact holes ANDH3 correspond to a portion of a seventeenth drain electrode D17 and penetrate the interlayer insulating layer 133, the second gate insulating layer 132, and the first gate insulating layer 131.

The fourth anode contact hole ANDH4 corresponds to a portion of an eighteenth drain electrode D18 and penetrates the interlayer insulating layer 133, the second gate insulating layer 132, and the first gate insulating layer 131.

The second cathode contact hole CTDH2 corresponds to a portion of the first cathode auxiliary electrode CTDA1 and penetrates the interlayer insulating layer 133 and the second gate insulating layer 132.

One or more second power contact holes VDCH2 correspond to a portion of the second wiring pattern VDLP2 and penetrate the interlayer insulating layer 133 and the second gate insulating layer 132.

The first scan write wiring contact hole GWCH1 and the second scan write wiring contact hole GWCH2 correspond to different portions of a first gate connection electrode GCE1 (see FIG. 10) including a second gate electrode G2, a third sub-gate electrode G41, a fourth sub-gate electrode G42, a ninth gate electrode G9, a seventh sub-gate electrode G111, and an eighth sub-gate electrode G112 and penetrate the interlayer insulating layer 133 and the second gate insulating layer 132.

The scan initialization wiring contact hole GICH corresponds to a portion of a second gate connection electrode GCE2 (see FIG. 10) including a first sub-gate electrode G31, a second sub-gate electrode G32, a fifth sub-gate electrode G101, and a sixth sub-gate electrode G102 and penetrates the interlayer insulating layer 133 and the second gate insulating layer 132.

The scan control wiring contact hole GCCH corresponds to a portion of a third gate connection electrode GCE3 (see FIG. 10) including a seventh gate electrode G7, a thirteenth gate electrode G13, a ninth sub-gate electrode G161, a tenth sub-gate electrode G162, and an eighteenth gate electrode G18 and penetrates the interlayer insulating layer 133 and the second gate insulating layer 132.

The PWM emission wiring contact hole PWCH corresponds to a portion of a fourth gate connection electrode GCE4 (see FIG. 10) including a fifth gate electrode G5, a sixth gate electrode G6, a twelfth gate electrode G12 and a fourteenth gate electrode G14 and penetrates the interlayer insulating layer 133 and the second gate insulating layer 132.

The first initialization voltage wiring contact hole VICH1 corresponds to a portion of the semiconductor layer SEL between a second sub-source electrode S32 and a sixth sub-source electrode S102 connected to each other and penetrates the interlayer insulating layer 133, the second gate insulating layer 132, and the first gate insulating layer 131.

The second initialization voltage wiring contact hole VICH2 corresponds to a portion of a tenth sub-source electrode S162 and penetrates the interlayer insulating layer 133, the second gate insulating layer 132 and the first gate insulating layer 131.

The third initialization voltage wiring contact hole VICH3 corresponds to a portion of the sixth capacitor electrode CE6 and penetrates the interlayer insulating layer 133.

The first power wiring contact hole WVDH corresponds to a portion of the semiconductor layer SEL between a fifth source electrode S5 and a thirteenth source electrode S13 connected to each other and penetrates the interlayer insulating layer 133, the second gate insulating layer 132, and the first gate insulating layer 131.

The first sweep signal wiring contact hole SWCH1 corresponds to an end of an extension portion CE4_EX of the fourth capacitor electrode CE4 and penetrates the interlayer insulating layer 133.

The second sweep signal wiring contact hole SWCH2 corresponds to a portion of a seventh drain electrode D7 and penetrates the interlayer insulating layer 133, the second gate insulating layer 132 and the first gate insulating layer 131.

The gate voltage wiring contact hole GHCH corresponds to a portion of a seventh source electrode S7 and penetrates the interlayer insulating layer 133, the second gate insulating layer 132, and the first gate insulating layer 131.

The PAM emission wiring contact hole PACH corresponds to a portion of a seventeenth gate electrode G17 and penetrates the interlayer insulating layer 133 and the second gate insulating layer 132.

The second power wiring contact holes VDCCH correspond to a portion of the semiconductor layer SEL between a twelfth source electrode S12 and a fourteenth source electrode S14 connected to each other and penetrate the interlayer insulating layer 133, the second gate insulating layer 132, and the first gate insulating layer 131.

The first connection auxiliary contact holes CCH1 correspond to a portion of the seventeenth source electrode S17 and penetrate the interlayer insulating layer 133, the second gate insulating layer 132, and the first gate insulating layer 131.

The second connection auxiliary contact hole CCH2 corresponds to a portion of the first gate electrode G1 and penetrates the interlayer insulating layer 133 and the second gate insulating layer 132.

The third connection auxiliary contact hole CCH3 corresponds to a portion of the semiconductor layer SEL between a first sub-source electrode S31 and a fourth sub-drain electrode D42 and penetrates the interlayer insulating layer 133, the second gate insulating layer 132, and the first gate insulating layer 131.

The fourth connection auxiliary contact hole CCH4 corresponds to a portion of the semiconductor layer SEL between a fifth sub-source electrode S101 and an eighth sub-drain electrode D112 and penetrates the interlayer insulating layer 133, the second gate insulating layer 132, and the first gate insulating layer 131.

The fifth connection auxiliary contact hole CCH5 corresponds to a portion of the eighth gate electrode G8 and penetrates the interlayer insulating layer 133 and the second gate insulating layer 132.

The sixth connection auxiliary contact hole CCH6 corresponds to a portion of the fourth capacitor electrode CE4 and penetrates the interlayer insulating layer 133.

The seventh connection auxiliary contact hole CCH7 corresponds to a portion of a fourteenth drain electrode D14 and penetrates the interlayer insulating layer 133, the second gate insulating layer 132, and the first gate insulating layer 131.

The eighth connection auxiliary contact hole CCH8 corresponds to a portion of a thirteenth drain electrode D13 and penetrates the interlayer insulating layer 133, the second gate insulating layer 132, and the first gate insulating layer 131.

The ninth connection auxiliary contact hole CCH9 corresponds to a portion of the fifteenth gate electrode G15 and penetrates the interlayer insulating layer 133 and the second gate insulating layer 132.

The tenth connection auxiliary contact hole CCH10 corresponds to a portion of the semiconductor layer SEL between a sixth drain electrode D6 and a ninth sub-source electrode S161 and penetrates the interlayer insulating layer 133, the second gate insulating layer 132, and the first gate insulating layer 131.

The eleventh connection auxiliary contact hole CCH11 corresponds to a portion of an eighth drain electrode D8 and penetrates the interlayer insulating layer 133, the second gate insulating layer 132, and the first gate insulating layer 131.

The twelfth connection auxiliary contact hole CCH12 corresponds to a portion of the auxiliary connection electrode ACE and penetrates the interlayer insulating layer 133.

The thirteenth connection auxiliary contact hole CCH13 corresponds to a portion of the fifteenth source electrode S15 and penetrates the interlayer insulating layer 133, the second gate insulating layer 132, and the first gate insulating layer 131.

The fourteenth connection auxiliary contact hole CCH14 corresponds to another portion of the auxiliary connection electrode ACE and penetrates the interlayer insulating layer 133.

The first data connection contact hole DLCH1 corresponds to a portion of a second source electrode S2 and penetrates the interlayer insulating layer 133, the second gate insulating layer 132, and the first gate insulating layer 131.

The third data connection contact hole DLCH3 corresponds to a portion of a ninth source electrode S9 and penetrates the interlayer insulating layer 133, the second gate insulating layer 132, and the first gate insulating layer 131.

Figure 27:
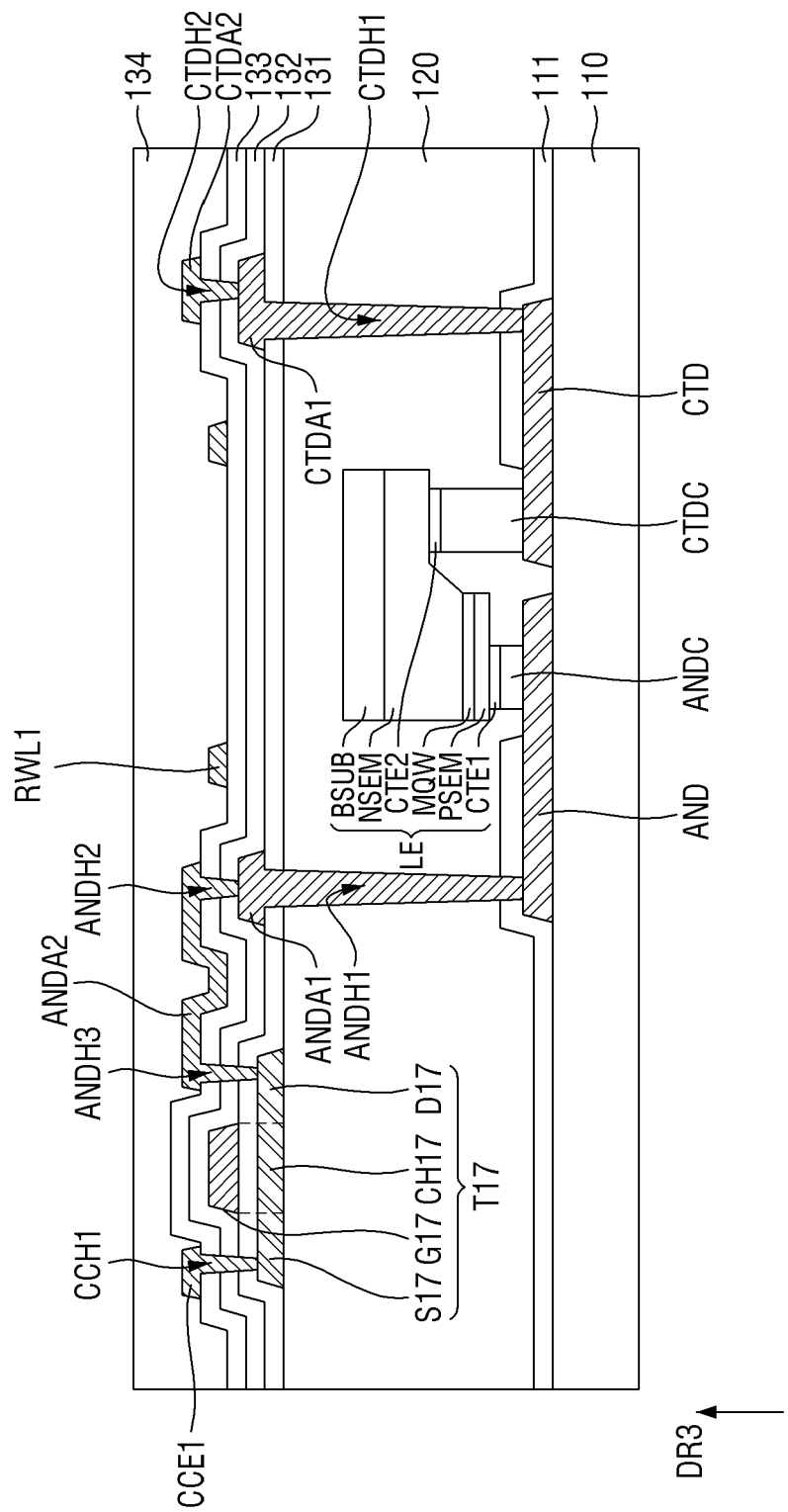

Referring to FIG. 27, the fourth conductive layer CDL4 may be placed by patterning a conductive material layer on the interlayer insulating layer 133 after the contact holes penetrating at least the interlayer insulating layer 133 are placed (operation ST507). Then, the second planarization layer 134 flatly covering the fourth conductive layer CDL4 may be placed by applying an organic insulating material onto the entire surface of the interlayer insulating layer 133 (operation ST508).

In the placing of the fourth conductive layer CDL4 (operation ST507), the fourth conductive layer CDL4 may be formed as a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

As illustrated in FIG. 11, the fourth conductive layer CDL4 may include a second auxiliary anode ANDA2, a second cathode auxiliary electrode CTDA2, the first reflective wall layer RWL1, gate wirings GIL, GWL, PWEL, SWPL, PAEL, and GCL, an initialization voltage wiring VIL, a gate voltage wiring VGHL, a first power wiring PWM_VDL, and a third wiring pattern VDLP3.

The second anode auxiliary electrode ANDA2 may be connected to the first anode auxiliary electrode ANDA1, the seventeenth drain electrode D17, and the eighteenth drain electrode D18 through the second through fourth anode contact holes ANDH2 through ANDH4.

The second cathode auxiliary electrode CTDA2 may be connected to the first cathode auxiliary electrode CTDA1 through the second cathode contact hole CTDH2.

The first reflective wall layer RWL1 may be formed to surround each emission area EA.

The gate wirings GIL, GWL, PWEL, SWPL, PAEL, and GCL may include a scan initialization wiring GIL, a scan write wiring GWL, a sweep signal wiring SWPL, a scan control wiring GCL, a PWM emission wiring PWEL, and a PAM emission wiring PAEL.

The scan write wiring GWL may be connected to the first gate connection electrode GCE1 through the first scan write wiring contact hole GWCH1 and the second scan write wiring contact hole GWCH2.

The scan initialization wiring GIL may be connected to the second gate connection electrode GCE2 through the scan initialization wiring contact hole GICH.

The scan control wiring GCL may be connected to the third gate connection electrode GCE3 through the scan control wiring contact hole GCCH.

The PWM emission wiring PWEL may be connected to the fourth gate connection electrode GCE4 through the PWM emission wiring contact hole PWCH.

The initialization voltage wiring VIL may be connected to the second sub-source electrode S32 and the sixth sub-source electrode S102 through the first initialization voltage wiring contact hole VICH1.

In addition, the initialization voltage wiring VIL may be connected to the tenth sub-source electrode S162 through the second initialization voltage wiring contact hole VICH2 and may be connected to the sixth capacitor electrode CE6 through the third initialization voltage wiring contact hole VICH3.

The first power wiring PWM_VDL may be connected to the fifth source electrode S5 and the thirteenth source electrode S13 through the first power wiring contact hole WVDH.

The sweep signal wiring SWPL may be connected to the fourth capacitor electrode CE4 through the first sweep signal wiring contact hole SWCH1 and may be connected to the seventh drain electrode D7 through the second sweep signal wiring contact hole SWCH2.

The gate voltage wiring VGHL may be connected to the seventh source electrode S7 through the gate voltage wiring contact hole GHCH.

The PAM emission wiring PAEL may be connected to the seventeenth gate electrode G17 through the PAM emission wiring contact hole PACH.

The third wiring pattern VDLP3 may be connected to the second wiring pattern VDLP2 through the second power contact holes VDCH2.

In the placing of the second planarization layer 134 (operation ST508), the second planarization layer 134 may be made of any one of acryl resin, epoxy resin, phenolic resin, polyamide resin, and polyimide resin.

Figure 28:
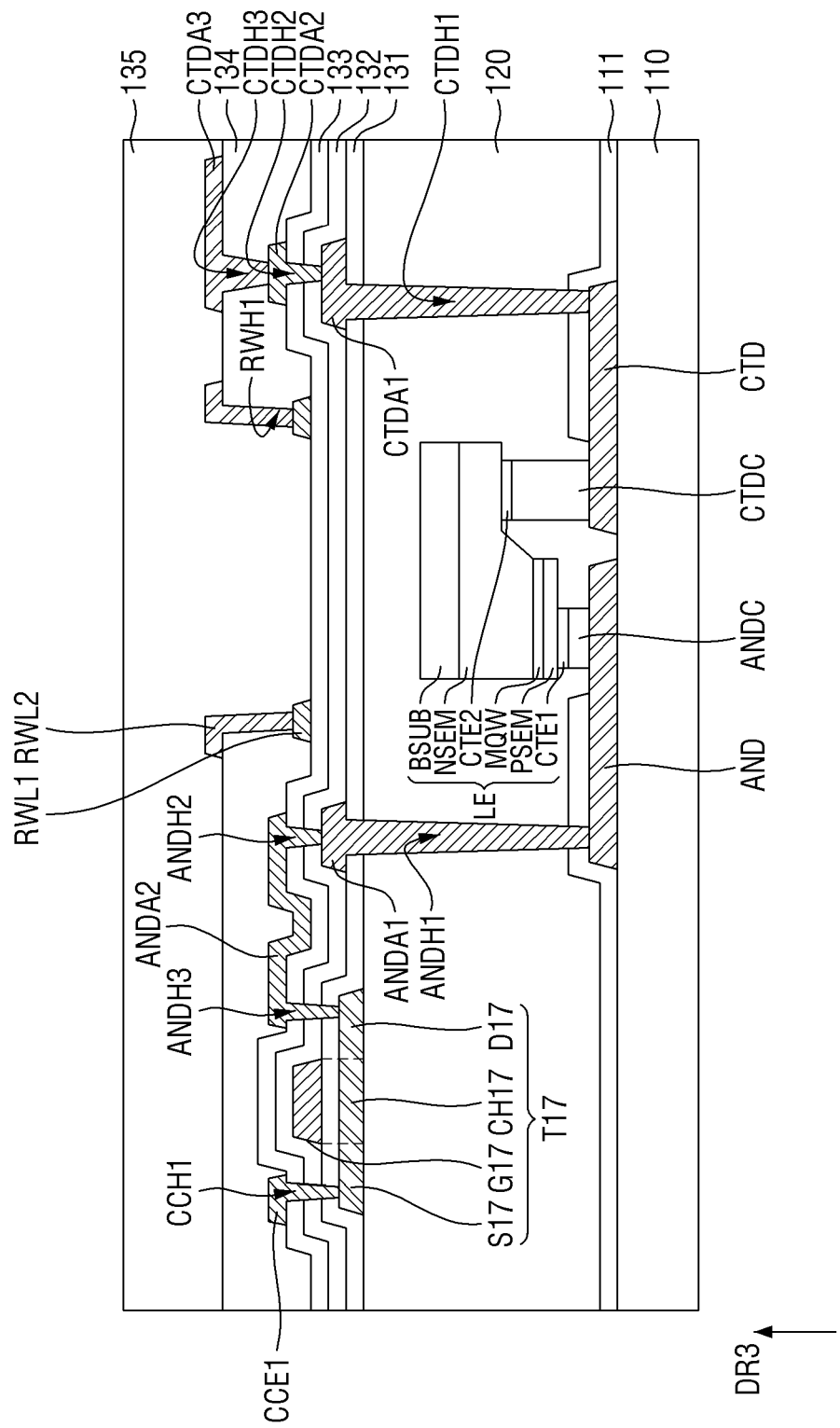

Referring to FIG. 28, after the placing of the second planarization layer 134 (operation ST508), the second planarization layer 134 may be patterned to form holes corresponding to the fourth conductive layer CDL4 and penetrating the second planarization layer 134.

The holes penetrating the second planarization layer 134 may include the first reflective wall hole RWH1 corresponding to each emission area EA.

The first reflective wall hole RWH1 may expose a portion of the first reflective wall layer RWL1 adjacent to the edges of each emission area EA.

In addition, the holes penetrating the second planarization layer 134 may further include a third cathode contact hole CTDH3, a first power wiring auxiliary contact hole WVDAH, third power contact holes VDCH3, and second and fourth data connection contact holes DLCH2 and DLCH4.

The third cathode contact hole CTDH3 may correspond to a portion of the second cathode auxiliary electrode CTDA2 (e.g., see FIG. 12).

The first power wiring auxiliary contact hole WVDAH may correspond to a portion of the first power wiring PWM_VDL (see FIG. 11).

The third power contact holes VDCH3 may correspond to a portion of the third wiring pattern VDLP3.

The second data connection contact hole DLCH2 may correspond to a portion of a first data connection electrode DCE1.

The fourth data connection contact hole DLCH4 may correspond to a portion of a third data connection electrode DCE3.

As illustrated in FIG. 28, the fifth conductive layer CDL5 may be placed by patterning a conductive material layer on the second planarization layer 134 after the holes corresponding to the fourth conductive layer CDL4 and penetrating the second planarization layer 134 are placed (operation ST509). Then, the third planarization layer 135 flatly covering the fifth conductive layer CDL5 may be placed by applying an organic insulating material onto the entire surface of the second planarization layer 134 (operation ST510).

In the placing of the fifth conductive layer CDL5 (operation ST509), the fifth conductive layer CDL5 may be formed as a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

As illustrated in FIG. 13, the fifth conductive layer CDL5 may include the second reflective wall layer RWL2, a third cathode auxiliary electrode CTDA3, a PWM data wiring PWM_DL, a PAM data wiring PAM_DL, a fourth wiring pattern VDLP4, and a power auxiliary pattern VDAP.

The second reflective wall layer RWL2 may surround each emission area EA and may contact a portion of the first reflective wall layer RWL1 through the first reflective wall hole RWH1.

The third cathode auxiliary electrode CTDA3 may be connected to the second cathode auxiliary electrode CTDA2 through the third cathode contact hole CTDH3.

The PWM data wiring PWM_DL may extend in the second direction DR2 and may be connected to the first data connection electrode DCE1 through the second data connection contact hole DLCH2. Accordingly, the second source electrode S2 may be connected to the PWM data wiring PWM_DL through the first data connection electrode DCE1.

The PAM data wiring PAM_DL may extend in the second direction DR2 and may be connected to the second data connection electrode DCE2 through the fourth data connection contact hole DLCH4. Accordingly, the ninth source electrode S9 may be connected to the PAM data wiring PAM_DL through the second data connection electrode DCE2.

The fourth wiring pattern VDLP4 may extend in the second direction DR2 in parallel with the first wiring pattern VDLP1 and may be connected to the third wiring pattern VDLP3 through the third power contact holes VDCH3.

The power auxiliary pattern VDAP may correspond to an area between the PWM data wiring PWM_DL and the PAM data wiring PAM_DL and may be connected to the first power wiring PWM_VDL through the first power wiring auxiliary contact hole WVDAH.

In the placing of the third planarization layer 135 (operation ST510), the third planarization layer 135 may be made of any one of acryl resin, epoxy resin, phenolic resin, polyamide resin, and polyimide resin.

Figure 29:
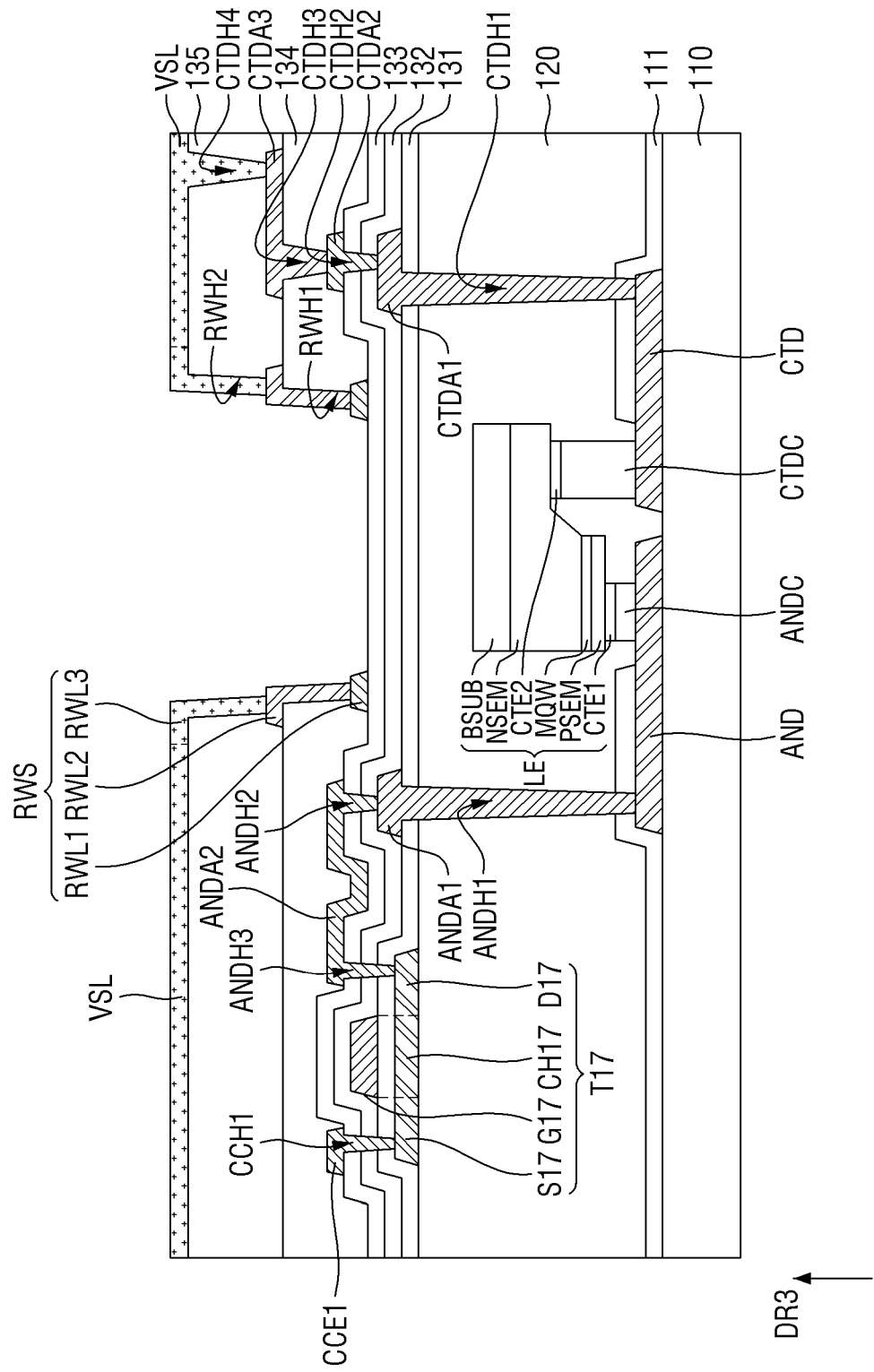

Referring to FIG. 29, after the placing of the third planarization layer 135 (operation ST510), the third planarization layer 135 may be patterned to form the second reflective wall hole RWH2 corresponding to each emission area EA and penetrating the third planarization layer 135.

The second reflective wall hole RWH2 may expose a portion of the second reflective wall layer RWL2 adjacent to the edges of each emission area EA. In addition, the second reflective wall hole RWH2 may further expose a portion of the second reflective wall layer RWL2. Also, a portion of the first reflective wall layer RWL1 may be exposed by the first reflective wall hole RWH1 and the second reflective wall hole RWH2

Next, the sixth conductive layer CDL6 may be placed by patterning a conductive material layer on the third planarization layer 135 after the second reflective wall hole RWH2 is placed (operation ST511).

In the placing of the sixth conductive layer CDL6, the sixth conductive layer CDL6 may be formed as a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

As illustrated in FIG. 14, the sixth conductive layer CDL6 may include the third power wiring VSL and the third reflective wall layer RWL3 integrally formed with each other.

That is, the sixth conductive layer CDL6 may be placed on the entire surface of the third planarization layer 135 except for the emission areas EA and may form the third power wiring VSL.

In addition, a portion of the sixth conductive layer CDL6 corresponding to the edges of each of the emission areas EA may form the third reflective wall layer RWL3.

The third power wiring VSL may be connected to the third cathode auxiliary electrode CTDA3 through the fourth cathode contact hole CTDH4. Accordingly, the cathode CTD may be connected to the third power wiring VSL through the first through third cathode auxiliary electrodes CTDA1 through CTDA3.

The third reflective wall layer RWL3 may contact a portion of the second reflective wall layer RWL2 through the second reflective wall hole RWH2. Accordingly, the reflective wall structures RWS, each including the first reflective wall layer RWL1, the second reflective wall layer RWL2, and the third reflective wall layer RWL3, may be provided.

In addition, the third reflective wall layer RWL3 is integrally formed with the third power wiring VSL and contacts the second reflective wall layer RWL2 through the second reflective wall hole RWH2, and the second reflective wall layer RWL2 contacts the first reflective wall layer RWL1 through the first reflective wall hole RWH1. Therefore, a third power voltage VSS provided by the third power wiring VSL may be applied to the first reflective wall layer RWL1, the second reflective wall layer RWL2, and the third reflective wall layer RWL3.

Figure 30:
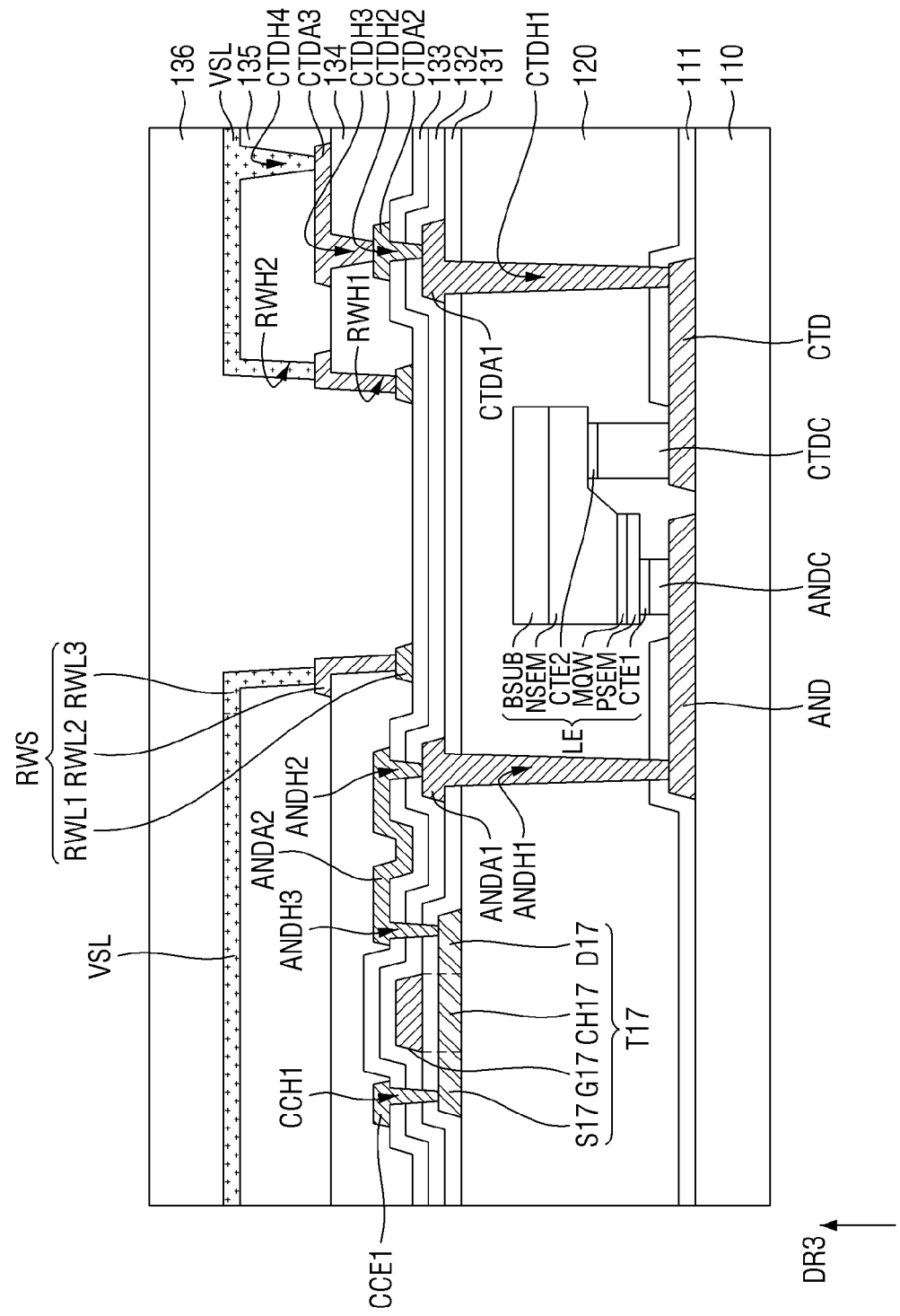

Referring to FIG. 30, the fourth planarization layer 136 flatly covering the sixth conductive layer CDL6 may be placed by applying an organic insulating material onto the entire surface of the third planarization layer 135 (operation ST512).

In the placing of the fourth planarization layer 136 (operation ST512), the fourth planarization layer 136 may be made of any one of acryl resin, epoxy resin, phenolic resin, polyamide resin, and polyimide resin.

Figure 31:
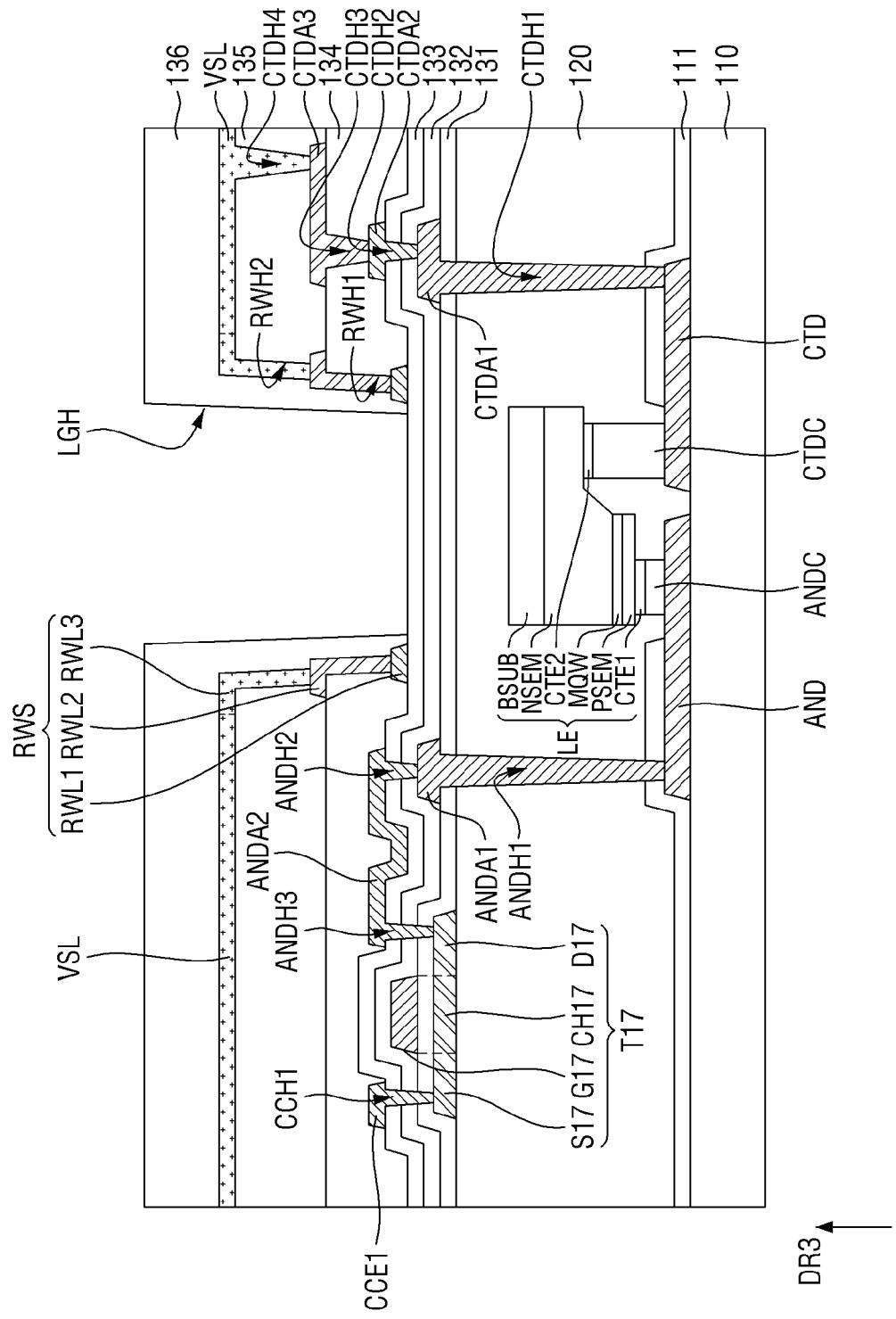

Referring to FIG. 31, the light guide holes LGH respectively corresponding to the emission areas EA may be placed by patterning the fourth planarization layer 136 (operation ST513).

Each of the light guide holes LGH is surrounded by a reflective wall structure RWS corresponding to the edges of each of the emission areas EA.

The first and second reflective wall holes RWH1 and RWH2 of the reflective wall structures RWS and the light guide holes LGH may expose the interlayer insulating layer 133 corresponding to each of the emission areas EA.

Figure 32:
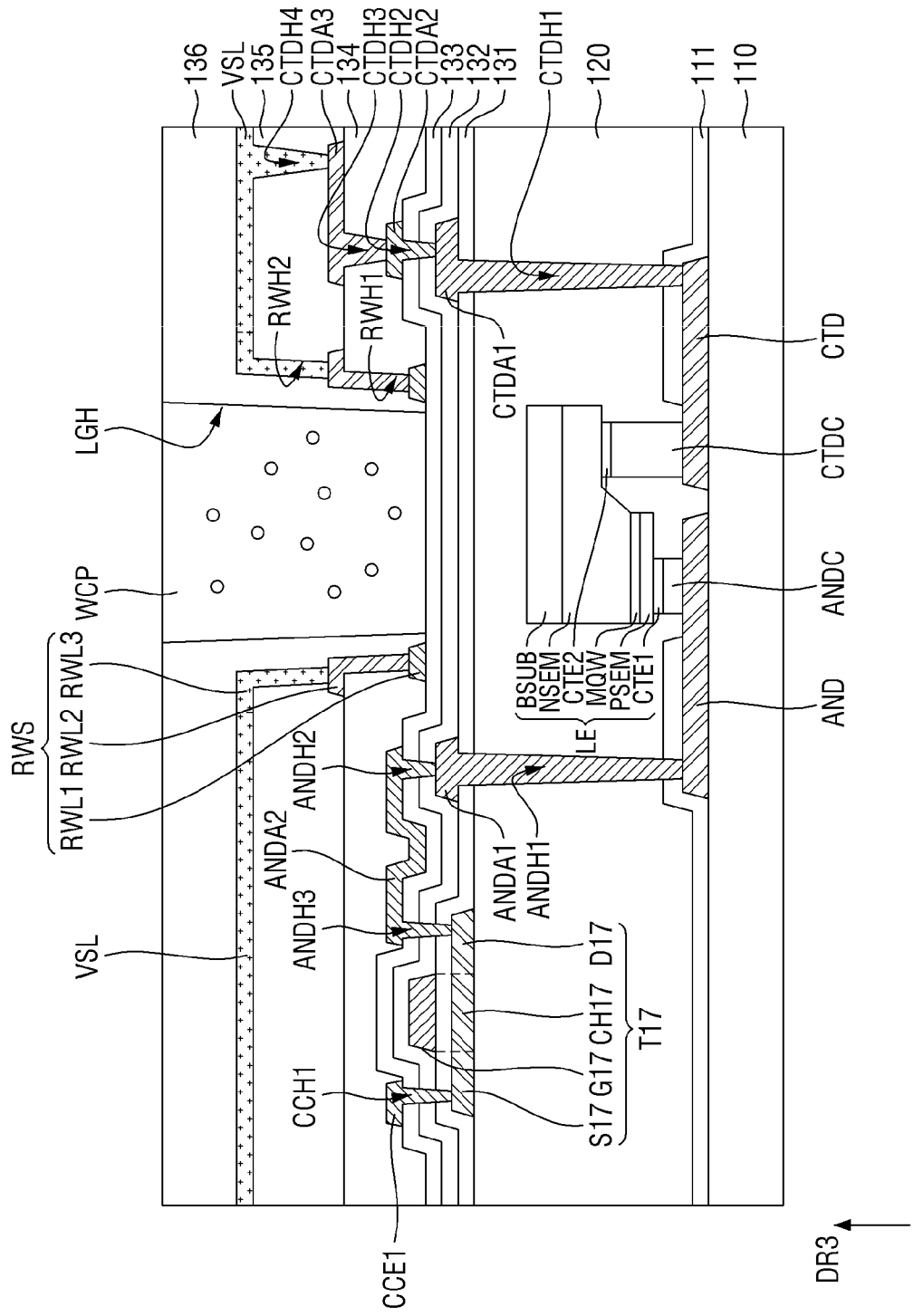

Referring to FIG. 32, after the light guide holes LGH are provided, the wavelength conversion patterns WCP may be placed to fill the light guide holes LGH, respectively (operation ST514).

The wavelength conversion patterns WCP may include the first wavelength conversion pattern WCP_R corresponding to the first emission area EA_R, which emits light of the first color, and converting light of the third color emitted from a light emitting element LE into light of the first color, the second wavelength conversion pattern WCP_G corresponding to the second emission area EA_G, which emits light of the second color, and converting light of the third color emitted from a light emitting element LE into light of the second color, and the transmission pattern TP corresponding to the third emission area EA_B, which emits light of the third color, and transmitting light of the third color emitted from a light emitting element LE.

Because the wavelength conversion patterns WCP are respectively placed to fill the light guide holes LGH as described above, an increase in a thickness of the display device 10 due to the placement of the wavelength conversion patterns WCP can be prevented. Therefore, this may be desirable in making the display device 10 slim.

In addition, because the wavelength conversion patterns WCP are placed only inside the light guide holes LGH, process errors that occur during the placement of the wavelength conversion patterns WCP can be reduced.

Figure 33:
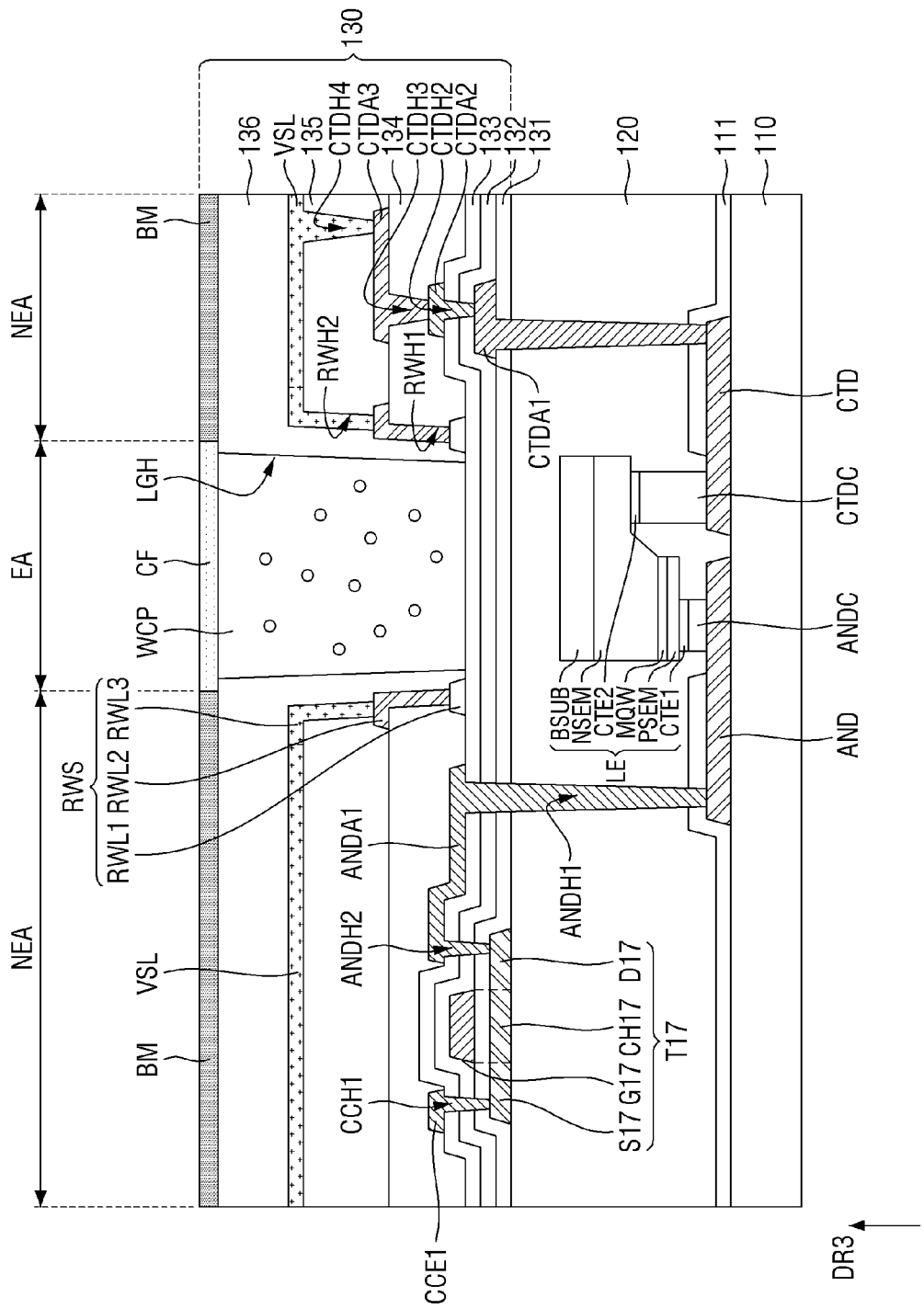

Referring to FIG. 33, the color filter patterns CF may be respectively placed on the wavelength conversion patterns WCP corresponding to the emission areas EA, and the black matrix BM may be placed on the fourth planarization layer 136 in the non-emission area NEA (operation ST515).

The color filter patterns CF may include the first color filter pattern CF_R (see FIG. 4) corresponding to the first emission area EA_R, which emits light of the first color, and transmitting light of the first color, the second color filter pattern CF_G (see FIG. 4) corresponding to the second emission area EA_G, which emits light of the second color, and transmitting light of the second color, and the third color filter pattern CF_B (see FIG. 4) corresponding to the third emission area EA_B, which emits light of the third color, and transmitting light of the third color.

The black matrix BM is designed to reduce light emission in the non-emission area NEA or reflection of external light in the non-emission area NEA. The black matrix BM may be made of a light blocking material or a light absorbing material.

Through the above process, the display device 10 according to one or more embodiments may be provided.

Next, a tiled display device structured to include a plurality of display devices 10 according to one or more embodiments will be described.

Figure 34:
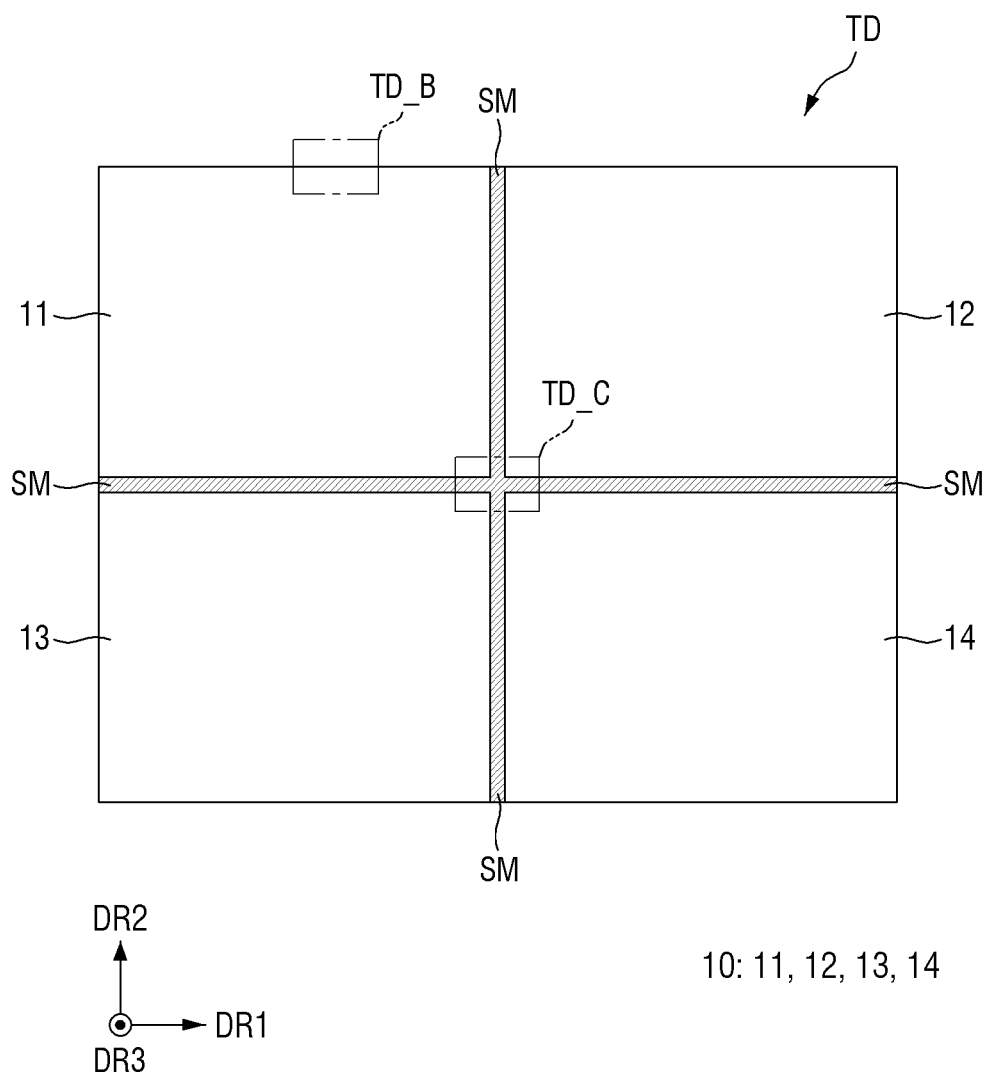
FIG. 34 is a plan view of a tiled display device according to one or more embodiments.

FIG. 34 is a plan view of a tiled display device TD according to one or more embodiments.

Referring to FIG. 34, the tiled display device TD may include a plurality of display devices 10 (11 through 14) and a seam SM. For example, the tiled display device TD may include a first display device 11, a second display device 12, a third display device 13, and a fourth display device 14.

The display devices 11 through 14 may be arranged in a matrix of M (M is a positive integer) rows and N (N is a positive integer) columns. For example, the first display device 11 and the second display device 12 may neighbor each other in the first direction DR1. The first display device 11 and the third display device 13 may neighbor each other in the second direction DR2. The third display device 13 and the fourth display device 14 may neighbor each other in the first direction DR1. The second display device 12 and the fourth display device 14 may neighbor each other in the second direction DR2.

However, the number and arrangement of the display devices 11 through 14 in the tiled display device TD are not limited to those illustrated in FIG. 34. The number and arrangement of the display devices 11 through 14 in the tiled display device TD may be determined by the size of each of the display devices 10 and the tiled display device TD and the shape of the tiled display device TD.

The display devices 11 through 14 may have the same size, but one or more embodiment of the present specification are not limited thereto. For example, the display devices 11 through 14 may also have different sizes.

Each of the display devices 11 through 14 may be shaped like a rectangle including long sides and short sides. The long sides or short sides of the display devices 11 through 14 may be connected to each other. Some or all of the display devices 11 through 14 may be disposed at an edge of the tiled display device TD and may form a side of the tiled display device TD. At least one of the display devices 11 through 14 may be disposed at at least one corner of the tiled display device TD and may form two adjacent sides of the tiled display device TD. At least one of the display devices 11 through 14 may be surrounded by other display devices.

Each of the display devices 11 through 14 may be substantially the same as the display device 10 described above with reference to FIGS. 1 through 14. Therefore, a description of each of the display devices 11 through 14 will be omitted.

The seam SM may include a coupling member or an adhesive member. In this case, the display devices 11 through 14 may be connected to each other through the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 35:
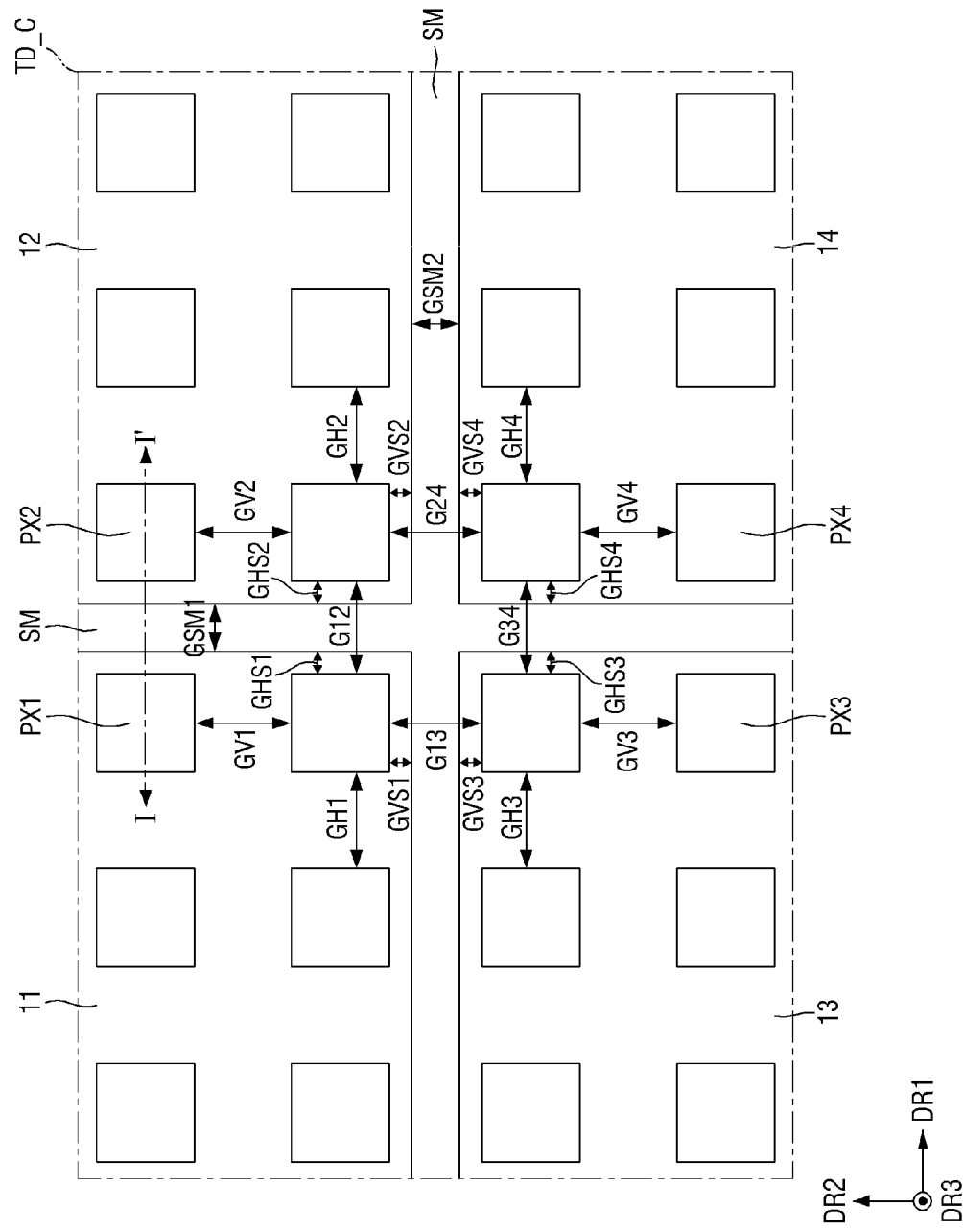
FIG. 35 is an enlarged layout view illustrating the front of portion TD_C of FIG. 34 in detail.

FIG. 35 is an enlarged layout view illustrating the front of portion TD_C of FIG. 34 in detail.

Referring to FIG. 35, the seam SM may have a planar shape of a cross or a plus sign in a central area of the tiled display device TD in which the first display device 11, the second display device 12, the third display device 13, and the fourth display device 14 are adjacent to each other. The seam SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix along the first direction DR1 and the second direction DR2 to display an image. The second display device 12 may include second pixels PX2 arranged in a matrix along the first direction DR1 and the second direction DR2 to display an image. The third display device 13 may include third pixels PX3 arranged in a matrix along the first direction DR1 and the second direction DR2 to display an image. The fourth display device 14 may include fourth pixels PX4 arranged in a matrix along the first direction DR1 and the second direction DR2 to display an image.

A minimum distance between the first pixels PX1 neighboring in the first direction DR1 may be defined as a first horizontal separation distance GH1, and a minimum distance between the second pixels PX2 neighboring in the first direction DR1 may be defined as a second horizontal separation distance GH2. The first horizontal separation distance GH1 and the second horizontal separation distance GH2 may be substantially the same.

The seam SM may be disposed between the first pixels PX1 and the second pixels PX2 neighboring in the first direction DR1. A minimum distance G12 between the first pixels PX1 and the second pixels PX2 neighboring in the first direction DR1 may be the sum of a minimum distance GHS1 between the first pixels PX1 and the seam SM in the first direction DR1, a minimum distance GHS2 between the second pixels PX2 and the seam SM in the first direction DR1, and a width GSM1 of the seam SM in the first direction DR1.

The minimum distance G12 between the first pixels PX1 and the second pixels PX2 neighboring in the first direction DR1, the first horizontal separation distance GH1, and the second horizontal separation distance GH2 may be substantially the same. To this end, the minimum distance GHS1 between the first pixels PX1 and the seam SM in the first direction DR1 may be smaller than the first horizontal separation distance GH1, and the minimum distance GHS2 between the second pixels PX2 and the seam SM in the first direction DR1 may be smaller than the second horizontal separation distance GH2. In addition, the width GSM1 of the seam SM in the first direction DR1 may be smaller than the first horizontal separation distance GH1 or the second horizontal separation distance GH2.

A minimum distance between the third pixels PX3 neighboring in the first direction DR1 may be defined as a third horizontal separation distance GH3, and a minimum distance between the fourth pixels PX4 neighboring in the first direction DR1 may be defined as a fourth horizontal separation distance GH4. The third horizontal separation distance GH3 and the fourth horizontal separation distance GH4 may be substantially the same.

The seam SM may be disposed between the third pixels PX3 and the fourth pixels PX4 neighboring in the first direction DR1. A minimum distance G34 between the third pixels PX3 and the fourth pixels PX4 neighboring in the first direction DR1 may be the sum of a minimum distance GHS3 between the third pixels PX3 and the seam SM in the first direction DR1, a minimum distance GHS4 between the fourth pixels PX4 and the seam SM in the first direction DR1, and the width GSM1 of the seam SM in the first direction DR1.

The minimum distance G34 between the third pixels PX3 and the fourth pixels PX4 neighboring in the first direction DR1, the third horizontal separation distance GH3, and the fourth horizontal separation distance GH4 may be substantially the same. To this end, the minimum distance GHS3 between the third pixels PX3 and the seam SM in the first direction DR1 may be smaller than the third horizontal separation distance GH3, and the minimum distance GHS4 between the fourth pixels PX4 and the seam SM in the first direction DR1 may be smaller than the fourth horizontal separation distance GH4. In addition, the width GSM1 of the seam SM in the first direction DR1 may be smaller than the third horizontal separation distance GH3 or the fourth horizontal separation distance GH4.

A minimum distance between the first pixels PX1 neighboring in the second direction DR2 may be defined as a first vertical separation distance GV1, and a minimum distance between the third pixels PX3 neighboring in the second direction DR2 may be defined as a third vertical separation distance GV3. The first vertical separation distance GV1 and the third vertical separation distance GV3 may be substantially the same.

The seam SM may be disposed between the first pixels PX1 and the third pixels PX3 neighboring in the second direction DR2. A minimum distance G13 between the first pixels PX1 and the third pixels PX3 neighboring in the second direction DR2 may be the sum of a minimum distance GVS1 between the first pixels PX1 and the seam SM in the second direction DR2, a minimum distance GVS3 between the third pixels PX3 and the seam SM in the second direction DR2, and a width GSM2 of the seam SM in the second direction DR2.

The minimum distance G13 between the first pixels PX1 and the third pixels PX3 neighboring in the second direction DR2, the first vertical separation distance GV1, and the third vertical separation distance GV3 may be substantially the same. To this end, the minimum distance GVS1 between the first pixels PX1 and the seam SM in the second direction DR2 may be smaller than the first vertical separation distance GV1, and the minimum distance GVS3 between the third pixels PX3 and the seam SM in the second direction DR2 may be smaller than the third vertical separation distance GV3. In addition, the width GSM2 of the seam SM in the second direction DR2 may be smaller than the first vertical separation distance GV1 or the third vertical separation distance GV3.

A minimum distance between the second pixels PX2 neighboring in the second direction DR2 may be defined as a second vertical separation distance GV2, and a minimum distance between the fourth pixels PX4 neighboring in the second direction DR2 may be defined as a fourth vertical separation distance GV4. The second vertical separation distance GV2 and the fourth vertical separation distance GV4 may be substantially the same.

The seam SM may be disposed between the second pixels PX2 and the fourth pixels PX4 neighboring in the second direction DR2. A minimum distance G24 between the second pixels PX2 and the fourth pixels PX4 neighboring in the second direction DR2 may be the sum of a minimum distance GVS2 between the second pixels PX2 and the seam SM in the second direction DR2, a minimum distance GVS4 between the fourth pixels PX4 and the seam SM in the second direction DR2, and the width GSM2 of the seam SM in the second direction DR2.

The minimum distance G24 between the second pixels PX2 and the fourth pixels PX4 neighboring in the second direction DR2, the second vertical separation distance GV2, and the fourth vertical separation distance GV4 may be substantially the same. To this end, the minimum distance GVS2 between the second pixels PX2 and the seam SM in the second direction DR2 may be smaller than the second vertical separation distance GV2, and the minimum distance GVS4 between the fourth pixels PX4 and the seam SM in the second direction DR2 may be smaller than the fourth vertical separation distance GV4. In addition, the width GSM2 of the seam SM in the second direction DR2 may be smaller than the second vertical separation distance GV2 or the fourth vertical separation distance GV4.

As illustrated in FIG. 35, in order to prevent the seam SM from being recognized between images displayed by the display devices 11 through 14, the minimum distance between pixels of neighboring display devices may be substantially the same as the minimum distance between pixels of each of the display devices.

Figure 36:
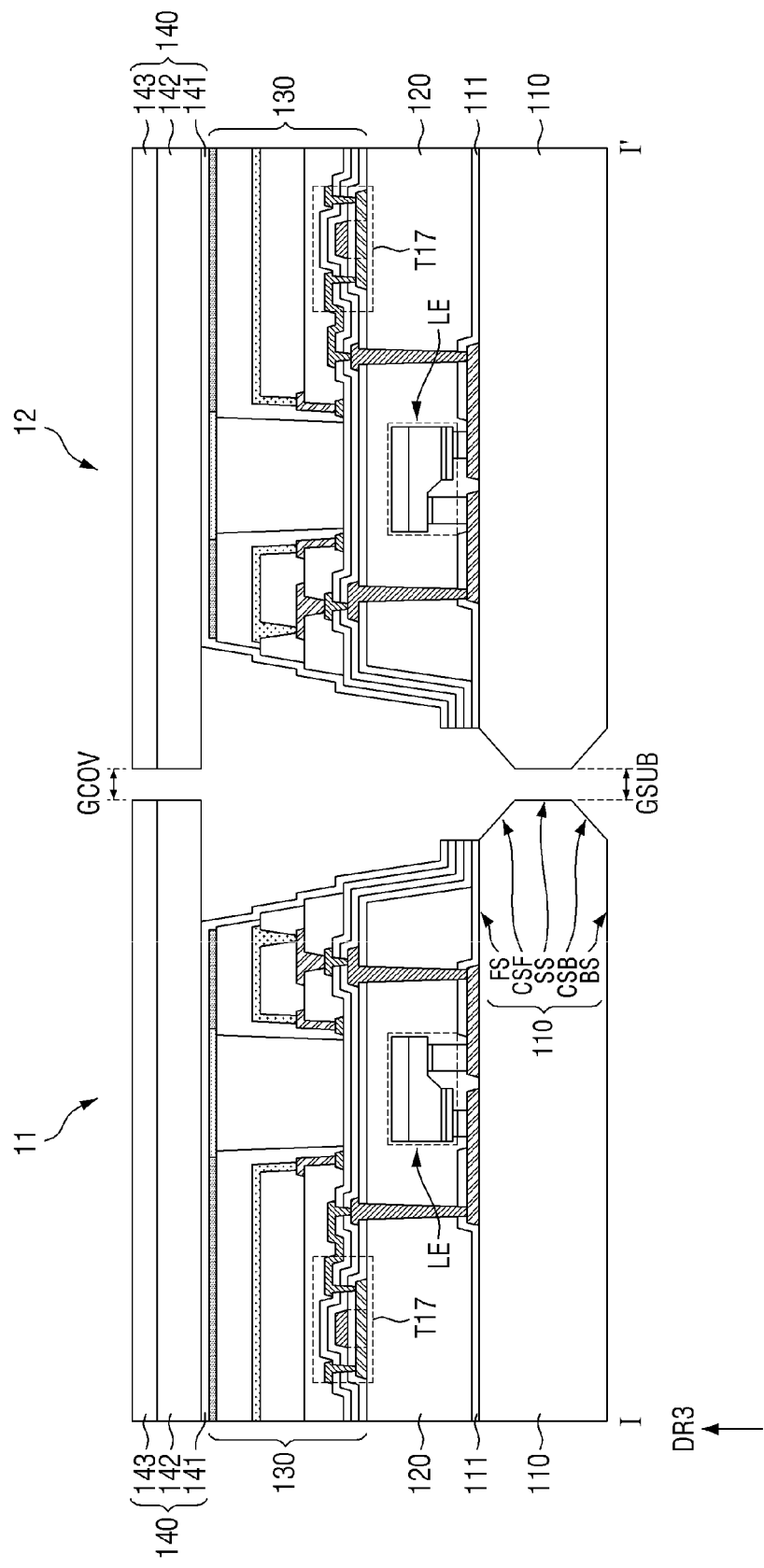
FIG. 36 is a cross-sectional view of an example of a plane cut along the line I-I' of FIG. 35.

FIG. 36 is a cross-sectional view of an example of a plane cut along the line I-I' of FIG. 35.

Referring to FIG. 36, each of the first display device 11 and the second display device 12 may further include a front cover structure 140 covering an array layer 130.

A substrate 110 may include a first surface FS on which a plurality of light emitting elements LE are disposed, a second surface BS opposite the first surface FS, and side surfaces SS disposed between the first surface FS and the second surface BS. For example, the first surface FS may be a top surface, and the second surface BS may be a rear surface or a bottom surface.

The substrate 110 may further include a chamfered surface CSF disposed between the first surface FS and a side surface SS and a chamfered surface CSB disposed between the second surface BS and the side surface SS. Because the chamfered surfaces CSF and CSB are separate surface from the first surface FS, the light emitting elements LE are not disposed on the chamfered surfaces CSF and CSB.

Due to the chamfered surfaces CSF and CSB, the substrates 110 of the first display device 11 and the second display device 12 can be prevented from colliding with each other and thus being damaged.

When the first surface FS and the second surface BS have a quadrilateral shape, the chamfered surfaces CSF and CSB may be disposed adjacent to four corners of each of the first surface FS and the second surface BS.

The front cover structure 140 may oppose the first surface FS and may face the chamfered surfaces CSF and CSB of the substrate 110.

That is, the front cover structure 140 may be wider than the substrate 110 in the first direction DR1 and the second direction DR2 and may protrude further than the substrate 110. Accordingly, in the first display device 11 and the second display device 12, a distance GSUB between the substrates 110 may be greater than a distance GCOV between front covers 141 through 143.

The front cover structure 140 may include an adhesive member 141 covering the array layer 130, a light transmittance control layer 142 disposed on the adhesive member 141, and an anti-glare layer 143 disposed on the light transmittance control layer 142.

The adhesive member 141 may cover the array layer 130 and may be attached to the array layer 130. The adhesive member 141 may be a transparent adhesive member that transmits light. For example, the adhesive member 141 may be an optically clear adhesive film or an optically clear resin.

The light transmittance control layer 142 is attached onto the adhesive member 141. The light transmittance control layer 142 may be wider than the substrate 110 in the first direction DR1 and the second direction DR2.

The light transmittance control layer 142 is designed to reduce transmittance of light reflected from the array layer 130 of a display device 10. Due to the light transmittance control layer 142, the gap GSUB between the substrates 110 of the first display device 11 and the second display device 12 may be prevented from being recognized from the outside.

The anti-glare layer 143 is designed to prevent external light from being reflected from the surface of a display device 10 by diffusely reflecting the external light. Due to the anti-glare layer 143, a contrast ratio of an image displayed by the display device 10 can be improved. The anti-glare layer 143 may be wider than the substrate 110.

The light transmittance control layer 142 may be implemented as a phase delay layer, and the anti-glare layer 143 may be implemented as a polarizing plate. However, this is only an example, and the structure of the front cover structure 140 according to one or more embodiments is not limited thereto.

Although a cross section of an area between the first display device 11 and the third display device 13 of FIG. 35, a cross section of an area between the third display device 13 and the fourth display device 14, and a cross section of an area between the second display device 12 and the fourth display device 14 are not separately illustrated, they are substantially the same as the cross section of the area between the first display device 11 and the second display device 12 illustrated in FIG. 36 and thus will not be described.

Figure 37:
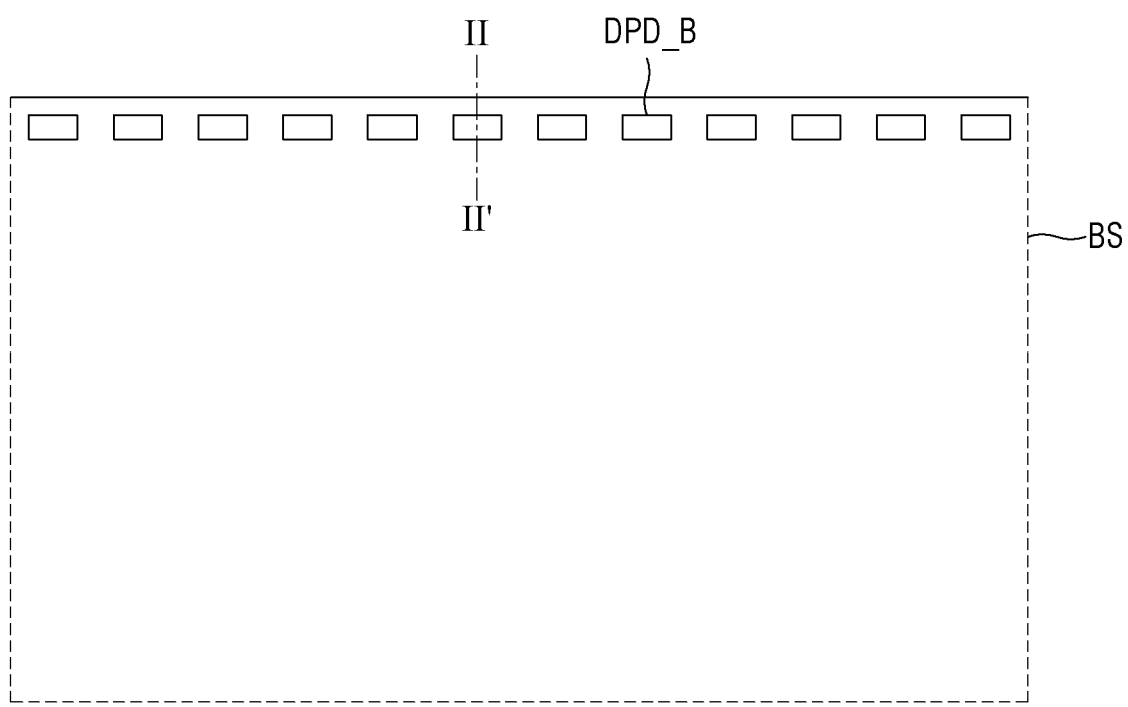
FIG. 37 is an enlarged layout view illustrating the back of portion TD_B of FIG. 34 in detail.
Figure 38:
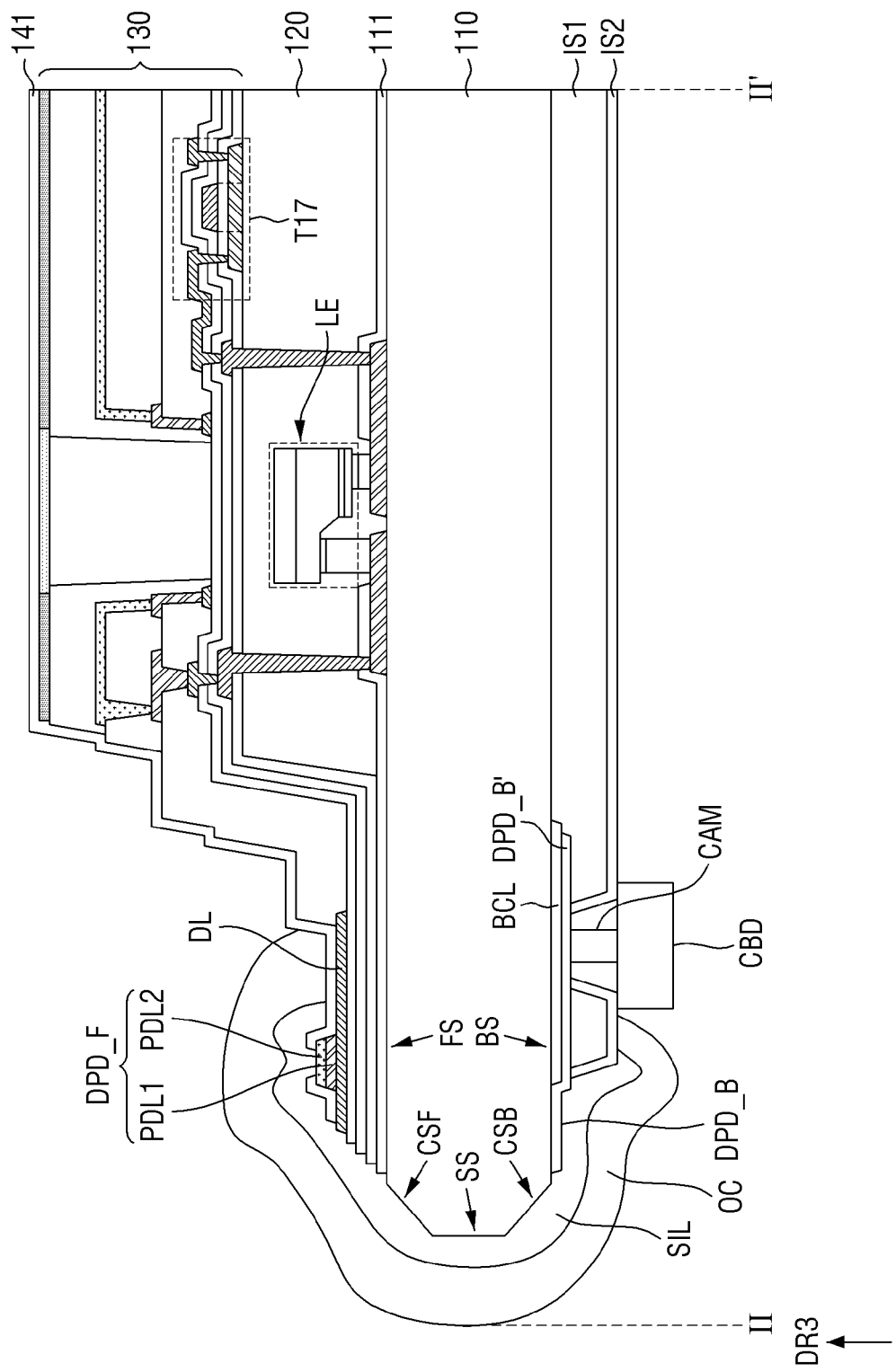
FIG. 38 is a cross-sectional view of an example of a plane cut along the line II-II' of FIG. 37.

FIG. 37 is an enlarged layout view illustrating the back of portion TD_B of FIG. 34 in detail. FIG. 38 is a cross-sectional view of an example of a plane cut along the line II-II' of FIG. 37.

For ease of description, FIG. 37 illustrates the second surface BS (i.e., the rear surface) of any one display device (10) from among the display devices 11 through 14 and rear display pads DPD_B disposed on the second surface BS.

Referring to FIG. 37, any one display device 10 may further include the rear display pads DPD_B arranged parallel to each other on an edge of the second surface BS of the substrate 110.

Referring to FIG. 38, any one display device 10 may further include top display pads DPD_F disposed on an edge of the first surface FS (i.e., the top surface) of the substrate 110, side wirings SIL respectively connecting the top display pads DPD_F and the rear display pads DPD_B, an overcoat layer OC covering the side wirings SIL, rear connection wirings BCL having respective ends connected to the rear display pads DPD_B and circuit board pads DPD_B', respectively, corresponding to the other respective ends of the rear connection wirings BCL and to which a circuit board CBD is connected, a first rear insulating layer IS1 disposed on the second surface BS of the substrate 110, a second rear insulating layer IS2 covering the first rear insulating layer IS1, and a conductive adhesive member CAM electrically connecting and fixing the circuit board CBD to the circuit board pads DPD_B'.

The top display pads DPD_F may correspond to the rear display pads DPD_B one-to-one.

The top display pads DPD_F may be respectively connected to respective ends of wirings, each being made of at least one of a second conductive layer CDL2, a third conductive layer CDL3, and a fourth conductive layer CDL4.

For example, the top display pads DPD_F may be disposed one-to-one at respective ends of data wirings DL (PWM_DL and PAM_DL) made of the fourth conductive layer CDL4.

Here, each of the top display pads DPD_F of the data wirings DL may include a first pad layer PDL1 and a second pad layer PDL2 stacked sequentially. For example, the first pad layer PDL1 may be made of the same layer as a fifth conductive layer CDL5, and the second pad layer PDL2 may be made of the same layer as a sixth conductive layer CDL6. However, this is only an example, and the structure of the top display pads DPD_F according to one or more embodiments is not limited thereto.

The side wirings SIL may be disposed on the first surface FS of the substrate 110, an upper chamfered surface CSF connected to the first surface FS, a side surface SS, a lower chamfered surface CSB connected to the second surface BS, and the second surface BS. That is, the side wirings SIL may contact the upper chamfered surface CSF, the side surface SS, and the lower chamfered surface CSB.

Respective ends of the side wirings SIL may be disposed on the top display pads DPD_F on the first surface FS and may be electrically connected to the top display pads DPD_F, respectively. The other respective ends of the side wirings SIL may be disposed on the rear display pads DPD_B on the second surface BS and may be electrically connected to the rear display pads DPD_B, respectively.

Accordingly, the top display pads DPD_F and the rear display pads DPD_B may be connected to each other through the side wirings SIL, respectively.

The overcoat layer OC is disposed on the first surface FS, the upper chamfered surface CSF connected to the first surface FS, the side surface SS, the lower chamfered surface CSB connected to the second surface BS, and the second surface BS. The overcoat layer OC covers the side wirings SIL. The overcoat layer OC may be made of an organic layer such as acryl resin, epoxy resin, phenolic resin, polyamide resin, or polyimide resin.

The rear display pads DPD_B may be arranged parallel to each other on an edge of the second surface BS of the substrate 110. The rear display pads DPD_B may be made of a transparent conductive oxide such as indium tin oxide (ITO) or indium zinc oxide (IZO).

The rear connection wirings BCL may be disposed on the second surface BS of the substrate 110. Each of the rear connection wirings BCL may be a single layer or a multi-layer made of any one or more selected from molybdenum (Mo), aluminum (Al), chromium (Cr), gold (Au), titanium (Ti), nickel (Ni), neodymium (Nd), copper (Cu), and alloys thereof.

Respective ends of the rear connection wirings BCL may be connected to the rear display pads DPD_B, respectively.

The first rear insulating layer IS1 is disposed on the second surface BS of the substrate 110.

The first rear insulating layer IS1 may flatly cover portions other than a portion of each of the rear display pads DPD_B and the rear connection wirings BCL connected to the side wirings SIL or the circuit board CBD.

The first rear insulating layer IS1 may be made of an organic layer such as acryl resin, epoxy resin, phenolic resin, polyamide resin, or polyimide resin.

The second rear insulating layer IS2 is disposed on the second surface BS of the substrate 110 and covers the first rear insulating layer IS1. Here, a portion of each of the rear display pads DPD_B and the rear connection wirings BCL connected to the side wirings SIL or the circuit board CBD is not covered with the second rear insulating layer IS2.

The second rear insulating layer IS2 may be made of a silicon nitride layer, a silicon oxynitride layer, a silicon oxide layer, a titanium oxide layer, or an aluminum oxide layer.

The circuit board CBD may be opposite to the second surface BS of the substrate 110 and may be connected to a portion of each of the rear connection wirings BCL or the circuit board pads DPD_B' disposed at the other respective ends of the rear connection wirings BCL through the conductive adhesive member CAM. The circuit board CBD may be implemented as a flexible film.

The conductive adhesive member CAM may be an anisotropic conductive film or an anisotropic conductive paste.

Figure 39:
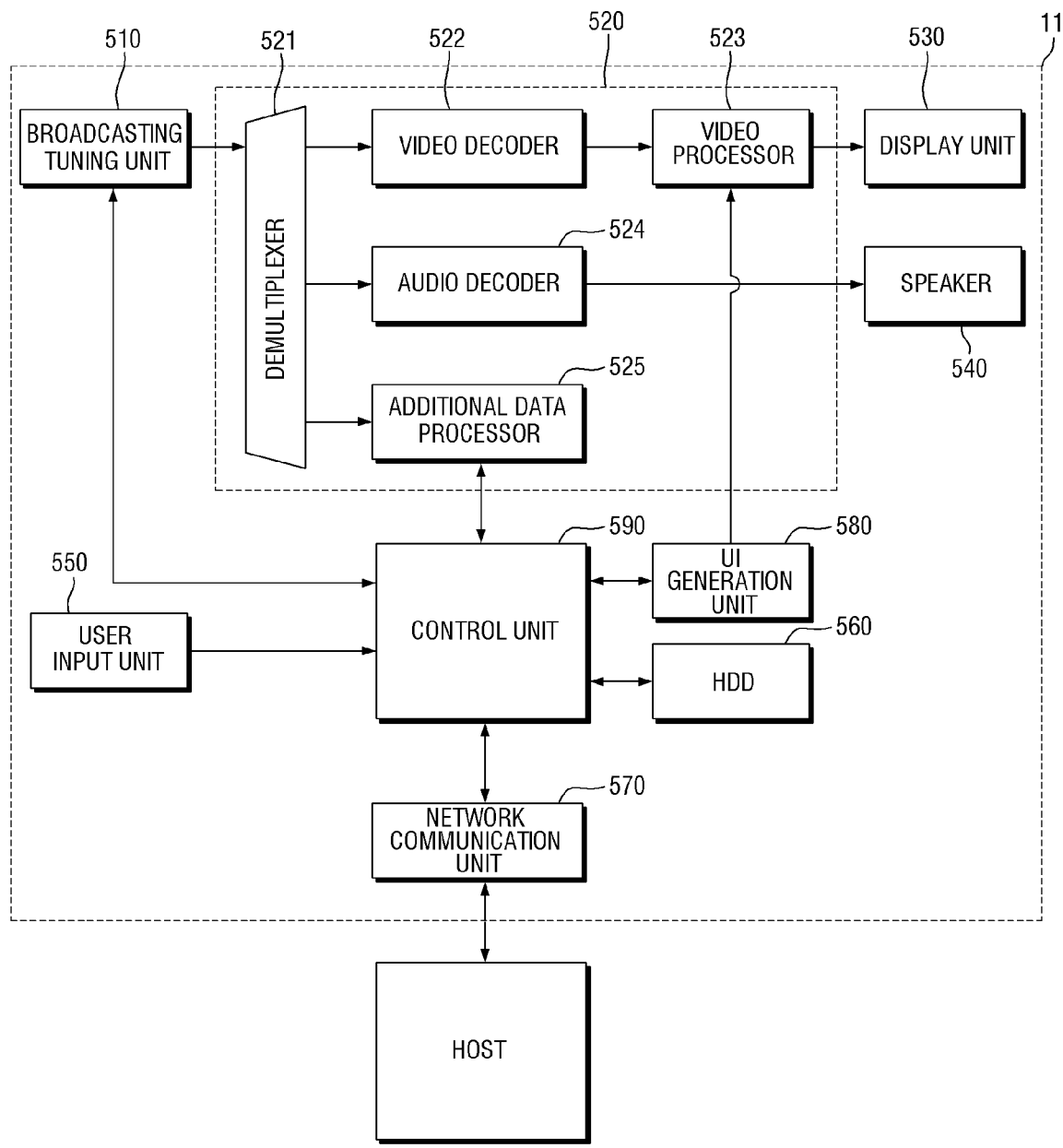
FIG. 39 is a block diagram of the tiled display device according to one or more embodiments.

FIG. 39 is a block diagram of the tiled display device TD according to one or more embodiments.

In FIG. 39, the first display device 11, which is any one of the display devices 11 through 14, and a host system HOST are illustrated for ease of description.

Referring to FIG. 39, the tiled display device TD according to one or more embodiments may include the host system HOST, a broadcast tuning unit 510, a signal processing unit 520, a display unit 530, a speaker 540, a user input unit 550, a hard disk drive (HDD) 560, a network communication unit 570, a user interface (UI) generating unit 580, and a control unit 590.

The host system HOST may be implemented as any one of a television system, a home theater system, a set-top box, a navigation system, a DVD player, a Blu-ray player, a PC, a mobile phone system, and a tablet.

A user's command may be input to the host system HOST in various forms. For example, the user's command may be input to the host system HOST through a touch input. Alternatively, the user's command may be input to the host system HOST through a keyboard input or a button input of a remote controller.

The host system HOST may receive original video data corresponding to an original image from the outside. The host system HOST may divide the original video data by the number of display devices. For example, for the first display device 11, the second display device 12, the third display device 13 and the fourth display device 14, the host system HOST may divide the original video data into first video data corresponding to a first image, second video data corresponding to a second image, third video data corresponding to a third image, and fourth video data corresponding to a fourth image. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, a user may view the original image into which the first through fourth images displayed on the first through fourth display devices 11 through 14 are combined.

The first display device 11 may include the broadcast tuning unit 510, the signal processing unit 520, the display unit 530, the speaker 540, the user input unit 550, the HDD 560, the network communication unit 570, the UI generating unit 580, and the control unit 590.

The broadcast tuning unit 510 may tune a suitable channel frequency (e.g., a predetermined channel frequency) under the control of the control unit 590 and receive a broadcast signal of a corresponding channel through an antenna. The broadcast tuning unit 510 may include a channel detection module and a radio frequency (RF) demodulation module.

The broadcast signal demodulated by the broadcast tuning unit 510 is processed by the signal processing unit 520 and then output to the display unit 530 and the speaker 540. Here, the signal processing unit 520 may include a demultiplexer 521, a video decoder 522, a video processor 523, an audio decoder 524, and an additional data processor 525.

The demultiplexer 521 separates the demodulated broadcast signal into a video signal, an audio signal, and additional data. The video signal, the audio signal, and the additional data are restored by the video decoder 522, the audio decoder 524, and the additional data processor 525, respectively. Here, the video decoder 522, the audio decoder 524, and the additional data processor 525 restore the video signal, the audio signal, and the additional data in a decoding format corresponding to an encoding format used when the broadcast signal is transmitted.

The decoded video signal is converted by the video processor 523 to fit the vertical frequency, resolution, aspect ratio, etc. that meet the output standard of the display unit 530, and the decoded audio signal is output to the speaker 540.

The display unit 530 includes a display panel 100 on which an image is displayed and a panel driver controlling driving of the display panel 100.

The user input unit 550 may receive a signal transmitted by the host system HOST. The user input unit 550 may be provided to allow to input a user's commands regarding communication with other display devices 12 through 14 as well as data regarding channel selection and UI menu selection and manipulation transmitted by the host system HOST.

The HDD 560 stores various software programs including OS programs, recorded broadcast programs, moving images, photographs, and other data. The HDD 560 may be formed of a storage medium such as a hard disk or a non-volatile memory.

The network communication unit 570 is for short-distance communication with the host system HOST and other display devices 12 through 14. The network communication unit 570 can be implemented as a communication module including an antenna pattern that can implement mobile communication, data communication, Bluetooth, RF, Ethernet, etc.

The network communication unit 570 may, through antenna electrodes, transmit and receive radio signals to and from at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.).

The network communication unit 570 may also transmit and receive radio signals in a communication network according to wireless Internet technologies through the antenna electrodes. The wireless Internet technologies include, for example, Wireless LAN (WLAN), Wireless-Fidelity (Wi-Fi), Wi-Fi Direct, Digital Living Network Alliance (DLNA), Wireless Broadband (WiBro), World Interoperability for Microwave Access (WiMAX), HSDPA, HSUPA, LTE, and LTE-A. The antenna electrodes transmit and receive data according to at least one wireless Internet technology within a range including even Internet technologies not listed above.

In addition, the first through fourth display devices 11 through 14 may include the antenna electrodes to transmit and receive radio signals to and from each other. The first display device 11 may transmit a first radio signal, and the second through fourth display devices 12 through 14 may receive the first radio signal. In addition, the second display device 12 may transmit a second radio signal, and the first, third and fourth display devices 11, 13, and 14 may receive the second radio signal. In addition, the third display device 13 may transmit a third radio signal, and the first, second, and fourth display devices 11, 12, and 14 may receive the third radio signal. In addition, the fourth display device 14 may transmit a fourth radio signal, and the first through third display devices 11 through 13 may receive the fourth radio signal.

The UI generating unit 580 generates a UI menu for wireless communication with the host system HOST and the second through fourth display devices 12 through 14 and can be implemented by an algorithm code and an on-screen display integrated circuit (OSD IC). The UI menu for communication with the host system HOST and the second through fourth display devices 12 through 14 may be a menu for designating a desired digital television for communication and selecting a desired function.

The control unit 590 is responsible for overall control of the first display device 11 and responsible for communication control of the host system HOST and the second through fourth display devices 12 through 14. The control unit 590 can be implemented by a micro controller unit (MCU) that stores a corresponding algorithm code for control and executes the stored algorithm code.

The control unit 590 controls a control command and data corresponding to the input and selection of the user input unit 550 to be transmitted to the host system HOST and the second through fourth display devices 12 through 14 through the network communication unit 570. In addition, when a control command (e.g., a predetermined control command) and data are received from the host system HOST and the second through fourth display devices 12 through 14, the control unit 590 performs an operation according to the control command.

A display device according to one or more embodiments includes a plurality of light emitting elements disposed on a first surface of a substrate, a first planarization layer covering the light emitting elements, and an array layer disposed on the first planarization layer and including a plurality of pixel drivers respectively connected to the light emitting elements.

That is, according to one or more embodiments, because the array layer is disposed on the first planarization layer covering the light emitting elements, it may be placed after the light emitting elements are tested for a lighting defect and repaired. Therefore, a light emitting element having a lighting defect can be easily repaired, thus reducing the influence of a defect rate of the light emitting elements on the display quality of the display device. Accordingly, this may be desirable in increasing the yield and decreasing the fabrication cost of the display device. In addition, because the light emitting elements are tested and repaired before the array layer is placed, damage to the array layer due to the test and repair of the light emitting elements can be prevented.

In addition, because the light emitting elements are disposed on the first surface of the substrate rather than on the array layer, misalignment of the light emitting elements due to a step difference of the array layer can be prevented.

However, the effects, aspects, and features of embodiments of the present disclosure are not restricted to the one set forth herein. The above and other effects, aspects, and features of embodiments of the present disclosure will become more apparent to one of daily skill in the art to which the present disclosure pertains by referencing the claims.

What is claimed is:

1. A tiled display device comprising:
   a plurality of display devices arranged parallel to each other; and
   a seam between the plurality of display devices,
   wherein a display device of the plurality of display devices comprises:
   a substrate comprising a plurality of emission areas respectively corresponding to a plurality of subpixels for displaying an image;
   a plurality of anodes respectively located in portions of the plurality of emission areas of a first surface of the substrate and respectively corresponding to the plurality of subpixels;
   a plurality of cathodes respectively located in other portions of the plurality of emission areas of the first surface of the substrate and respectively corresponding to the plurality of subpixels;
   a plurality of light emitting elements on the plurality of anodes and the plurality of cathodes and respectively corresponding to the plurality of subpixels;
   a first planarization layer on the first surface of the substrate and covering the plurality of anodes, the plurality of cathodes and the plurality of light emitting elements; and
   an array layer on the first planarization layer,
   wherein the array layer comprises a plurality of pixel drivers respectively corresponding to the plurality of subpixels, located in a non-emission area between the plurality of emission areas, each of the plurality of pixel drivers comprising at least one transistor, and
   wherein, in an emission area of the plurality of emission areas, a light emitting element of the plurality of light emitting elements is on an anode of the plurality of anodes and a cathode of the plurality of cathodes and connected to a pixel driver of the plurality of pixel drivers through the anode.

2. The tiled display device of claim 1, wherein a first conductive layer on the first surface of the substrate comprises the plurality of anodes and the plurality of cathodes, wherein the array layer comprises:
   a first gate insulating layer covering a semiconductor layer on the first planarization layer;
   a second gate insulating layer covering a second conductive layer on the first gate insulating layer;
   an interlayer insulating layer covering a third conductive layer on the second gate insulating layer;
   a second planarization layer covering a fourth conductive layer on the interlayer insulating layer;
   a third planarization layer covering a fifth conductive layer on the second planarization layer; and
   a fourth planarization layer covering a sixth conductive layer on the third planarization layer.

3. The tiled display device of claim 2, wherein the array layer further comprises a plurality of reflective wall structures respectively correspond to edges of the plurality of emission areas,
   wherein a reflective wall structure of the plurality of reflective wall structures corresponding to an edge of the emission area comprises:
   a first reflective wall layer in the fourth conductive layer;
   a first reflective wall hole penetrating the second planarization layer and corresponding to a portion of the first reflective wall layer and the emission area;
   a second reflective wall layer in the fifth conductive layer, covering the first reflective wall hole, and contacting a portion of the first reflective wall layer through the first reflective wall hole;
   a second reflective wall hole penetrating the third planarization layer and corresponding to a portion of the second reflective wall layer and the emission area; and a third reflective wall layer in the sixth conductive layer, covering the second reflective wall hole, and contacting a portion of the second reflective wall layer through the second reflective wall hole.

4. The tiled display device of claim 3, wherein the fourth planarization layer covers the plurality of reflective wall structures, wherein the array layer further comprises:
a plurality of light guide holes respectively corresponding to the plurality of emission areas, penetrating the fourth planarization layer, and respectively surrounded by the plurality of reflective wall structures;
a plurality of wavelength conversion patterns respectively located in the plurality of light guide holes;
a plurality of color filter patterns on the fourth planarization layer and respectively overlapping the plurality of wavelength conversion patterns; and
a black matrix on the fourth planarization layer and corresponding to the non-emission area.

5. The tiled display device of claim 4, wherein the plurality of wavelength conversion patterns overlap the plurality of light emitting elements, respectively, wherein the plurality of emission areas comprise:
a first emission area corresponding to a first color having a first wavelength band,
a second emission area corresponding to a second color having a second wavelength band lower than that of the first wavelength band, and
a third emission area corresponding to a third color having a third wavelength band lower than that of the second wavelength band,
wherein the plurality of light emitting elements is configured to emit light of the third color,
wherein the plurality of wavelength conversion patterns comprises:
a first wavelength conversion pattern corresponding to the first emission area and configured to convert light of the third color emitted from a first light emitting element into light of the first color,
a second wavelength conversion pattern corresponding to the second emission area and configured to convert light of the third color emitted from a second light emitting element into light of the second color, and
a transmission pattern corresponding to the third emission area and configured to transmit light of the third color emitted from a third light emitting element, and
wherein the plurality of color filter patterns comprises:
a first color filter pattern corresponding to the first emission area and configured to transmit light of the first color,
a second color filter pattern corresponding to the second emission area and configured to transmit light of the second color, and
a third color filter pattern corresponding to the third emission area and configured to transmit light of the third color.

6. The tiled display device of claim 4, wherein the display device further comprises:
a first power wiring configured to apply a first power voltage to the plurality of pixel drivers,
a second power wiring configured to apply a second power voltage to the plurality of pixel drivers,
a third power wiring configured to supply a third power voltage to the plurality of cathodes,
a first data wiring configured to apply a first data voltage to the plurality of pixel drivers, and
a second data wiring configured to apply a second data voltage to the plurality of pixel drivers, and wherein a pixel driver of the plurality of pixel drivers corresponding to the emission area comprises:
a first pixel driving circuit unit configured to generate a control current according to the first data voltage of the first data wiring,
a second pixel driving circuit unit configured to generate a driving current supplied to the anode according to the second data voltage of the second data wiring, and
a third pixel driving circuit unit configured to control a period during which the driving current is supplied to the anode according to the control current of the first pixel driving circuit unit.

7. The tiled display device of claim 6, wherein the plurality of subpixels are aligned along a first direction and a second direction intersecting the first direction, wherein the second power wiring comprises:
a first wiring pattern in the first conductive layer, corresponding to the non-emission area, and extending in the second direction;
a second wiring pattern in the second conductive layer, overlapping the first wiring pattern, and electrically connected to the first wiring pattern through a first power contact hole penetrating the first gate insulating layer and the first planarization layer;
a third wiring pattern in the fourth conductive layer, extending in the first direction, and electrically connected to the second wiring pattern through a second power contact hole penetrating the interlayer insulating layer and the second gate insulating layer; and
a fourth wiring pattern in the fifth conductive layer, corresponding to the non-emission area, extending in the second direction, overlapping the first wiring pattern, and electrically connected to the third wiring pattern through a third power contact hole penetrating the second planarization layer.

8. The tiled display device of claim 7, wherein the fourth conductive layer comprises the first power wiring,
wherein the fifth conductive layer comprises a power auxiliary pattern spaced from the first data wiring and the second data wiring and electrically connected to the first power wiring through a first power wiring auxiliary contact hole penetrating the second planarization layer.

9. The tiled display device of claim 8, wherein:
the third power wiring comprises the sixth conductive layer;
the third reflective wall layer is integrally formed with the third power wiring; and
the first reflective wall layer and the second reflective wall layer are electrically connected to the third power wiring through the third reflective wall layer.

10. The tiled display device of claim 9, wherein:
the cathode is electrically connected to the third power wiring through a first cathode auxiliary electrode, a second cathode auxiliary electrode, and a third cathode auxiliary electrode;
the second conductive layer comprises the first cathode auxiliary electrode electrically connected to the cathode through a first cathode contact hole penetrating the first gate insulating layer and the first planarization layer;
the fourth conductive layer comprises the second cathode auxiliary electrode electrically connected to the first cathode auxiliary electrode through a second cathode contact hole penetrating the interlayer insulating layer and the second gate insulating layer;

the fifth conductive layer comprises the third cathode auxiliary electrode electrically connected to the second cathode auxiliary electrode through a third cathode contact hole penetrating the second planarization layer; and the third power wiring is electrically connected to the third cathode auxiliary electrode through a fourth cathode contact hole penetrating the third planarization layer.

11. The tiled display device of claim 6, wherein the semiconductor layer comprises a channel, a source electrode, and a drain electrode of at least one transistor in the pixel driver, wherein the anode is electrically connected to the pixel driver through a first anode auxiliary electrode and a second anode auxiliary electrode, wherein the second conductive layer comprises the first anode auxiliary electrode electrically connected to the anode through a first anode contact hole penetrating the first gate insulating layer and the first planarization layer, wherein the fourth conductive layer comprises the second anode auxiliary electrode electrically connected to the first anode auxiliary electrode through a second anode contact hole penetrating the interlayer insulating layer and the second gate insulating layer, wherein the second anode auxiliary electrode is electrically connected to a second electrode of a seventeenth transistor through a third anode contact hole and electrically connected to a second electrode of an eighteenth transistor through a fourth anode contact hole, and wherein each of the third anode contact hole and the fourth anode contact hole penetrates the interlayer insulating layer, the second gate insulating layer and the first gate insulating layer.

12. The tiled display device of claim 4, wherein each of the plurality of light emitting elements is a flip chip-type micro-light emitting diode.

13. The tiled display device of claim 4, wherein the substrate of the display device comprises glass.

14. The tiled display device of claim 4, wherein the display device further comprises:
pads on a portion of an edge of the first surface of the substrate spaced from the plurality of emission areas;
connection wirings on a second surface of the substrate opposite the first surface of the substrate; and
side wirings on a side surface between the first surface and the second surface of the substrate and respectively connected between the pads and the connection wirings,
wherein the connection wirings are connected to a flexible film through a conductive adhesive member.

15. The tiled display device of claim 4, wherein the plurality of display devices are arranged in a matrix of M rows and N columns.

* * * * *